United States Patent [19]

Hattori

[11] Patent Number: 5,599,749

[45] Date of Patent: Feb. 4, 1997

[54] MANUFACTURE OF MICRO ELECTRON EMITTER

[75] Inventor: Atsuo Hattori, Hamamatsu, Japan

[73] Assignee: Yamaha Corporation, Japan

[21] Appl. No.: 544,922

[22] Filed: Oct. 18, 1995

[30] Foreign Application Priority Data

Oct. 21, 1994 [JP] Japan ................................ 6-282556
Oct. 27, 1994 [JP] Japan ................................ 6-287391

[51] Int. Cl.$^6$ ........................................... H01J 1/16
[52] U.S. Cl. .................. 437/228; 156/628.1; 156/644.1; 156/656.1; 156/657.1; 156/662.1; 445/24; 445/50; 445/51
[58] Field of Search ................... 437/225 (U.S. only), 437/228 (U.S. only); 156/662.1 (U.S. only), 657.1, 628.1, 644.1, 651.1, 656.1; 216/11; 445/50, 51, 24; 427/77

[56] References Cited

U.S. PATENT DOCUMENTS

| | | | |
|---|---|---|---|
| 4,307,507 | 12/1981 | Gray et al. .............................. | 445/50 |
| 5,100,355 | 3/1992 | Marcus et al. . | |
| 5,141,459 | 8/1992 | Zimmerman . | |
| 5,203,731 | 4/1993 | Zimmerman . | |
| 5,219,792 | 6/1993 | Kim et al. . | |
| 5,285,017 | 2/1994 | Gardner . | |
| 5,317,192 | 5/1994 | Chen et al. . | |
| 5,334,908 | 8/1994 | Zimmerman .......................... | 313/336 |
| 5,342,808 | 8/1994 | Brigham et al. . | |
| 5,356,836 | 10/1994 | Chen et al. . | |
| 5,358,909 | 10/1994 | Hashiguchi et al. . | |
| 5,371,041 | 12/1994 | Liou et al. . | |
| 5,371,042 | 12/1994 | Ong . | |
| 5,403,757 | 4/1995 | Suzuki . | |
| 5,408,130 | 4/1995 | Woo et al. . | |
| 5,472,912 | 12/1995 | Miller . | |
| 5,499,938 | 3/1996 | Nakamoto et al. ...................... | 445/50 |

FOREIGN PATENT DOCUMENTS

| | | | |
|---|---|---|---|
| 0639847 | 2/1995 | European Pat. Off. . | |
| 4310604 | 1/1994 | Germany . | |
| 62-124741 | 7/1987 | Japan ................................. | 156/651.1 |
| 461729 | 2/1992 | Japan . | |
| 5174703 | 7/1993 | Japan . | |
| 5225895 | 9/1993 | Japan . | |
| 9110252 | 7/1991 | WIPO . | |
| 9202031 | 2/1992 | WIPO . | |
| 9202030 | 2/1992 | WIPO . | |

OTHER PUBLICATIONS

"A Fabrication Method for the Integration of Vacuum Microelectronic Devices" by S. M. Zimmerman, et al. IEEE Transactions on Electron Devices, vol. 38, No. 10, Oct. 91, pp. 2294–2303.

"Development Progress Toward the Fabrication of Vacuum Microelectronic Devices Using Conventional Semiconductor Processing" by S. M. Zimmerman, et al., IEDM 90, pp. 163–166.

"Review: Vacuum Microelectronics—1992" by Heinz H. Busta, J. Micromech. Microeng. 2 (1992) 43–74.

"Recent Progress in Vacuum Microelectronics" by Junji Itoh: Applied Physics (in Japanese) vol. 62, No. 12 (1993).

*Primary Examiner*—R. Bruce Breneman
*Assistant Examiner*—Matt Whipple

[57] ABSTRACT

A method of manufacturing an electric field emission type device. A recess having a tapered surface at an upper portion of the recess is provided. A sacrificial film is deposited on the substrate with the tapered recess. A sharp cusp is therefore formed on the surface of the sacrificial film over the recess. An electron emitting material film is deposited on the sacrificial film to form a fine emitter with a sharp tip. This fine emitter is exposed by etching and removing unnecessary regions under the fine emitter. This manufacturing method realizes a high performance electric field emission type device having an emitter tip with a small radius of curvature and a small apex angle.

31 Claims, 49 Drawing Sheets

MANUFACTURE OF MICRO ELECTRON EMITTER

BACKGROUND OF THE INVENTION a) Field of the Invention

The present invention relates to a method of manufacturing an electric field emission (electron emission by electric field) type device.

b) Description of the Related Art

A vacuum microelectronic device technique has recently become remarkable. This technique utilizes a fine processing technique of semiconductor integrated circuits to form a minute cold cathode electron source which is used for ultra fine amplifier devices, integrated circuits, flat display units, and the like. To realize practically usable vacuum microelectronic devices, it is essential to develop a cold cathode electron source capable of reliably flowing a large current upon application of a low voltage. The cold cathode electron source is mainly classified into an electric field emission type that electrons are emitted from a sharp tip of an emitter electrode by a concentrated electric field, and another type that high energy electrons are generated in semiconductor by means of avalanche effects or the like and emitted to the outside of the semiconductor. The emitter electrode is classified into a vertical emitter having a sharp needle tip formed on a substrate in the vertical direction and a lateral emitter having a sharp needle tip formed on a substrate along the substrate surface.

A method of manufacturing an electric field emission type electron source of a lateral emitter type has been proposed (refer to S. Zimmerman, Abs. 3rd Int. Vacuum Microelectronics Conf., Monterey, 1990, 1–4). With this method, as shown in FIG. 43A, a recess 102 having a vertical side wall is formed in a substrate 101. A sacrificial layer 103 is deposited by direction-less (isotropic) conformal deposition and thereafter an electron emitting material layer 104 is deposited as shown in FIG. 43B, and finally an emitter 104a is formed by removing the substrate 101 and sacrificial layer 103 as shown in FIG. 43C.

Conformal deposition forms a film having the same thickness both on the horizontal and vertical surfaces. The recess is completely filled with the film when the thickness of the film on the vertical surface of the recess exceeds a half of the width of the recess. A cusp of an inverted cone shape is formed on the surface of the film above the recess. The depth of the cusp is less than the thickness of the film.

With the above method, in order to obtain an emitter mold with a cusp of an inverted cone shape having a desired depth, it is necessary to deposit the sacrificial film thicker than the desired depth of the cusp. However, if a thick sacrificial layer is deposited by a single process, cracks are likely to be formed by thermal stress generated when the layer is cooled after the deposition. If the cracks are generated in the electron emitting material, an emitter having a desired shape cannot be obtained so that an electric field emission type device having a desired performance cannot be obtained.

With this method illustrated in FIGS. 43A to 43C, the sacrificial layer is formed by deposition conformal to the surface of the recess with a vertical side wall, i.e., deposition having good step coverage. With this conformal deposition, the radius of curvature of the bottom edge of the cusp A formed on the sacrificial film 103 is likely to become large in the order of 50 nm as shown in FIG. 44A, and it is difficult to form an emitter having a sharp tip.

If deposition having poor step coverage is used, the thickness of the film on the vertical surface is less than that on the horizontal surface. Even if a sacrificial film having the same thickness as that shown in FIG. 44A, the recess is not completely filled with the film and overhangs 105 are formed as shown in FIG. 44B. It is therefore impossible to form an emitter mold having a cusp of an inverted cone shape. Even with this method, if the sacrificial film 103 is made thicker, the overhangs contact together as shown in FIG. 44C, and it might be possible to form an emitter mold having a cusp of an inverted cone shape. However, in this case, it is difficult to obtain a small apex angle of the cusp. Furthermore, the sacrificial film is made thicker than the depth of the emitter mold so that cracks are more likely to be formed.

Another method of manufacturing a vertical type emitter has been proposed as disclosed, for example, in Japanese Patent Laid-open Publications Nos.4-61729 and 5-225895. With this method, on a substrate 106 having a predetermined crystal plane such as (1 0 0), an etching mask 107 is formed as shown in FIG. 45A. The substrate 106 is anisotropically etched to form a pyramid recess 108 having the (1 1 1) plane or the like as shown in FIG. 45B. An electron emitting material layer 109 is deposited as shown in FIG. 45C, and an emitter 109a is formed by removing unnecessary regions as shown in FIG. 45D.

With this method, the recess is pyramid-shaped and its apex angle is determined by the angle of the crystallographic plane of the substrate. If the recess formed by anisotropic etching is used for forming an emitter mold, it is difficult to obtain an emitter having a tip of a small apex angle. The emitter tip of a pyramid shape does not show stable current emission characteristics. As substrates capable of being anisotropically etched, single crystal silicon, GaAs, and the like having the (1 0 0) plane are utilized, however the etching is limited to wet etching. The degree of design freedom is limited and fine processing of device is difficult.

Another method using anisotropic etching has been proposed as disclosed in Japanese Patent Laid-open Publication No.5-172703. As shown in FIG. 46A, this method uses a structure that a silicon substrate 106 and a silicon layer 111 are laminated with a silicon oxide film 110 being interposed therebetween. An etching mask 112 is formed on the silicon layer 111, and anisotropic etching is performed. Thereafter, the etching mask 112 is removed and as shown in FIG. 46B an oxide film 113 is formed by heat treatment. The oxide film 113 forms on its surface a cusp because of its volume expansion. An electron emitting material layer 114 is deposited on the oxide film 113.

With this method, although the apex angle of the cusp can be made small by oxidizing a recess, it is difficult to obtain a cusp having a small apex angle before the oxidation treatment. Substrates to be used are limited, the degree of design freedom is small, and fine processing of device is difficult.

SUMMARY OF THE INVENTION

It is an object of the present invention to provide a method of manufacturing an electric field emission type device capable of forming an emitter having a small radius of curvature and a small apex angle.

According to one aspect of the present invention, there is provided a method of manufacturing an electric field emission type device comprising the steps of: (a) forming a recess in the surface of a substrate, the recess having a generally vertical side wall at the lower portion of the recess and a taper side wall at the upper portion thereof; (b) depositing a sacrificial film on the substrate formed with the recess; (c) depositing an electron emitting material film on the sacrificial film; and (d) removing the sacrificial film under the electron emitting material film to expose the emitter conductive film.

According to another aspect of the present invention there is provided a method of manufacturing an electric field emission type device comprising the steps of: forming a recess in a low melting point material layer formed on the surface of a substrate; reflowing the low melting point material layer and forming a slope surface at least on an upper side wall of the recess; depositing a sacrificial film covering the recess; depositing an electron emitting material film on the sacrificial film to form an emitter; and removing unnecessary regions under the emitter to expose the emitter.

By forming a taper surface on the upper portion of a recess, a cusp having a sharp edge can be stably formed at a predetermined position.

Because design freedom of positions of the emitter and gate electrode along the Z direction (vertical direction to a substrate), it is possible to optimize positions of the emitter and the gate electrode along the Z direction.

Other and further objects, features, and advantages of the invention will become obvious from the following description of embodiments taken in connection with the accompanying drawings.

DETAILED DESCRIPTION OF THE PREFERRED EMBODIMENTS

Embodiments of the present invention will be described with reference to the accompanying drawings.

Figure 47A:
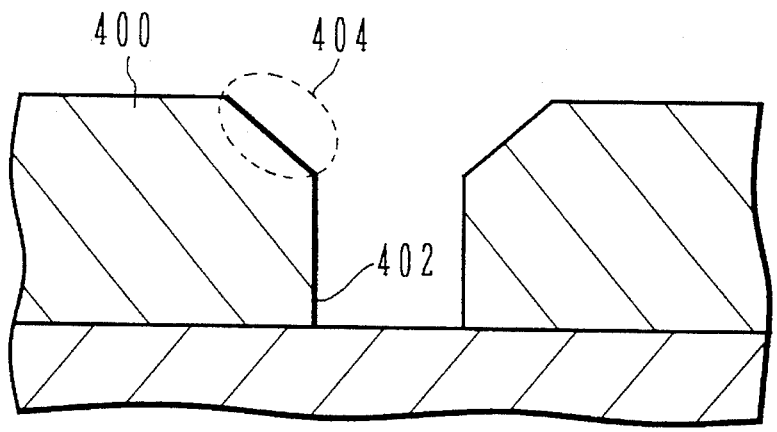
FIGS. 47A to 47C are cross sectional views illustrating another embodiment of the invention.
Figure 47B:
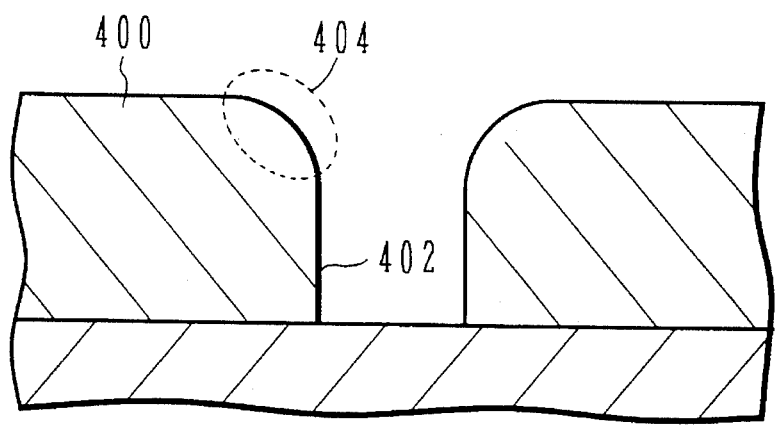
Figure 47C:
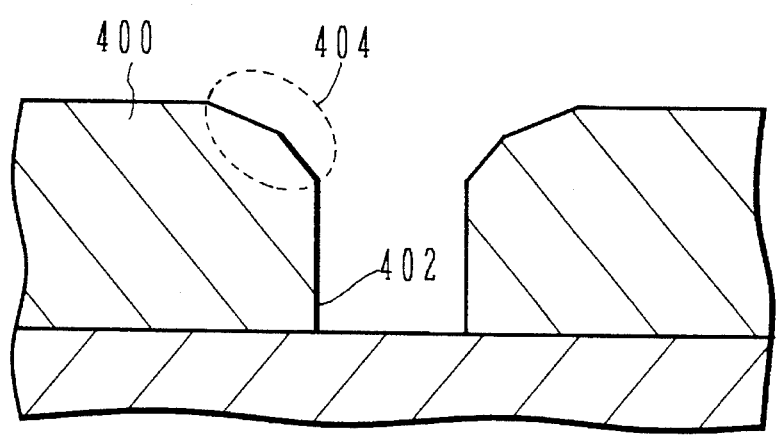

With reference to FIGS. 47A to 47C, another embodiment of the present invention will be described. A tapered recess (a tapered hole can be interchangeably used for the tapered recess) is defined as a recess (hole) formed in (or through) a layer which has a substantially horizontal plane 400. The side wall of the recess has a substantially perpendicular wall 402 in the bottom thereof and a transitional region 404 on a top thereof which transitional region connects the substantially perpendicular wall 402 and the substantially horizontal plane 400 in such a manner that the diameter (or the opening dimension) of the transitional region 404 gradually decreases toward the substantially perpendicular wall 404. The tapered recess has a funnel-like shape in its cross section. The transitional region 404 may be a facet (FIG. 47A), a rounded or curved surface (FIG. 47B), or a two-step or more multi-step (multi-segment in cross section) surface (FIG. 47C).

In this specification, a taper-etching means an etching technique forming the above-defined tapered recess.

Figure 1A:
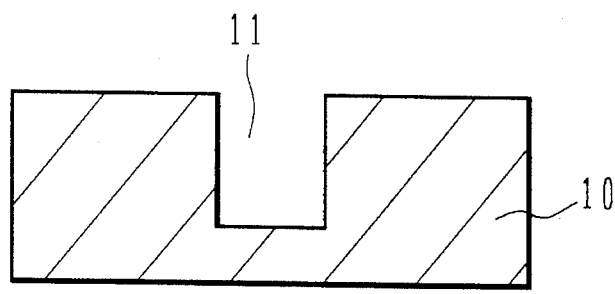
FIGS. 1A to 1E are cross sectional views illustrating processes of manufacturing an emitter according to an embodiment of the invention.
Figure 15A:
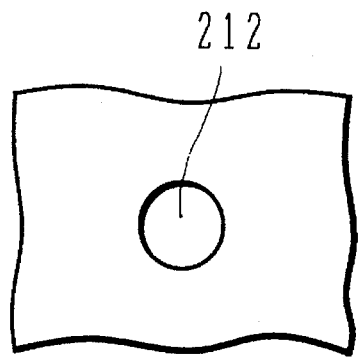
FIGS. 15A and 15B are plan views of recesses.
Figure 15B:
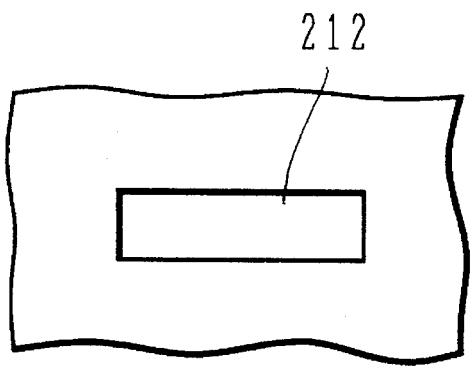

FIGS. 1A to 1E illustrate processes of manufacturing an electron emitting material layer according to a basic embodiment of the invention. As shown in FIG. 1A, at least one recess 11 having a vertical side wall is formed in the surface of a substrate 10. In FIG. 1A, one recess is formed for one emitter. If a field emitter array (FEA) having a number of emitters is to be formed, a number of recesses are formed in the substrate. If a point type emitter is to be formed, the cross section of the recess 11 in a plan view is circular as shown in FIG. 15A, and if a wedge type emitter is to be formed, the cross section is stripe-shaped, as shown in FIG. 15B.

As the substrate 10, semiconductor substrates made of Ge, GaAs, or the like, insulating material substrates made of glass, quartz, or the like, conductive material substrates made of Al, Cu, or the like, or laminate substrates thereof may also be used. In this embodiment, an Si substrate is used. The recess 11 is etched by using a resist mask formed by general lithography and reactive ion etching (RIE) or ion milling. The size of the recess 11 is determined by the size of a cold cathode emitter to be formed. For example, the width in the cross section is in the order of 0.1 to 1 μm, and the depth is about a half of the width. More preferably, the height of the lower vertical wall left when the upper wall of the recess is taper-etched is about a half of the recess width.

Without using a resist mask, the recess 11 may be directly formed on the substrate 10 by ion milling or by using a laser beam.

Figure 1B:
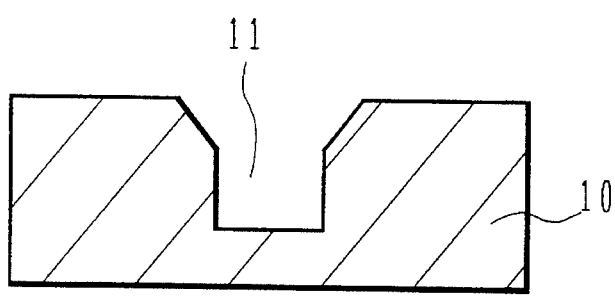

Next, as shown in FIG. 1B, the substrate 10 with the recess 11 is taper-etched to form a predetermined taper on the upper side wall of the recess 11. In the first embodiment, the substrate having the tapered recess is served as a base for a sacrificial layer to be formed afterwards. For example, ion milling or dry etching may be used whose etching conditions allow an etching rate at the corner of the upper side wall to be sufficiently faster than at the flat area of the substrate to form the transitional region. For example, if the material of the substrate 10 at the area of the recess 11 is a silicon oxide film or a silicon nitride film, plasma etching with $O_2$ ions is used.

For this plasma etching, a bias electron cyclotron resonance (ECR) plasma etching system may be used. $O_2$ plasma ions generated by this system are accelerated and made incident upon the substrate 10 while an RF bias is applied to the substrate 10. A maximum etching rate can be obtained at the ion incident angle in the order of 30° to 60° with respect to the normal to the surface, for example, 45°, whereas the flat area of the substrate 10 is rarely etched. In this manner, a taper of a slope angle in the order of 30° to 60° with respect to the normal to the surface, for example 45° such as shown in FIG. 1B can be formed.

Figure 2:
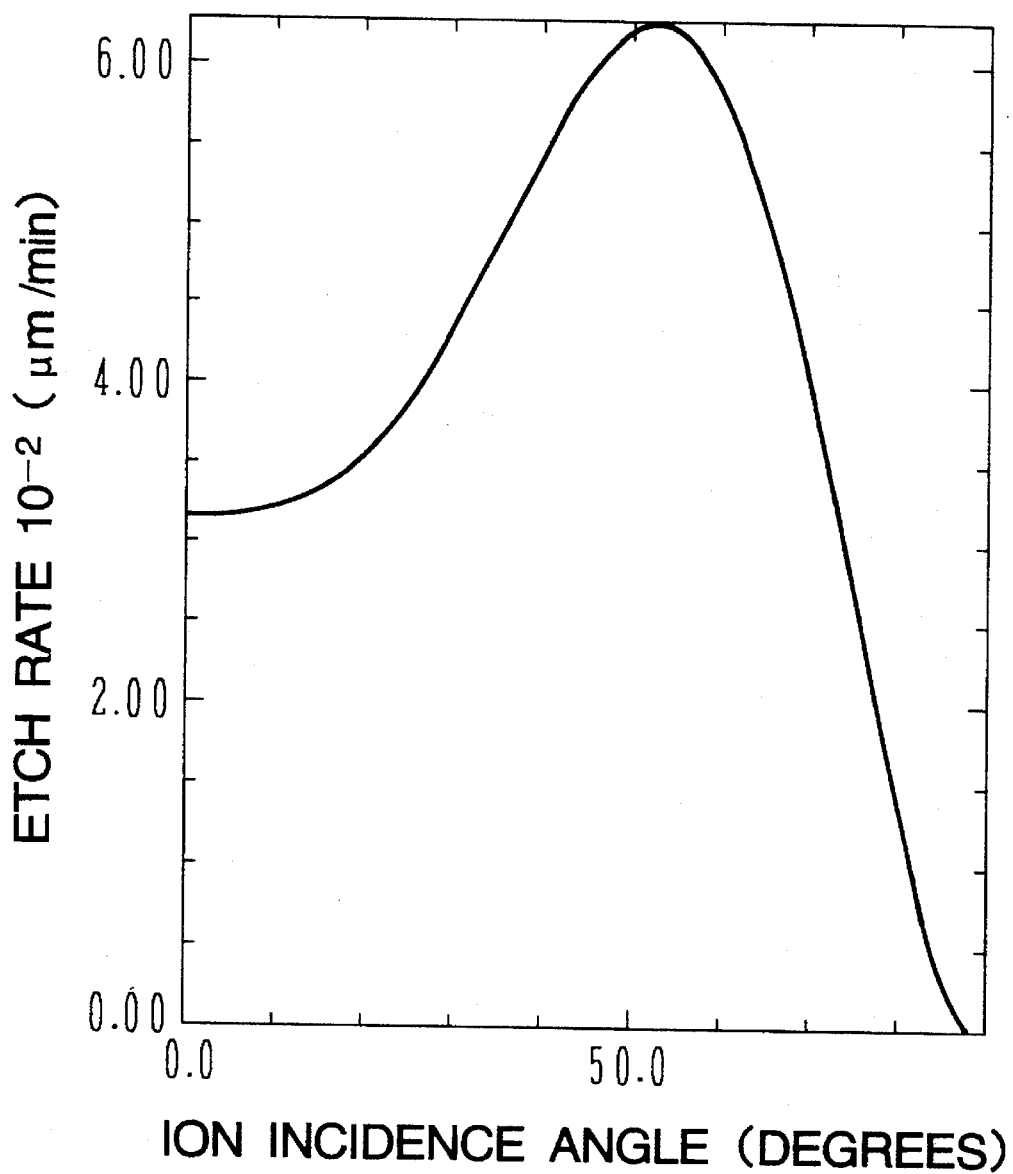
FIG. 2 is a graph showing a dependency of an etching rate by Ar ions upon an ion incidence angle.

Similar taper fabrication is possible by ion beam etching with Ar gas (ion milling) under proper etching conditions. FIG. 2 is a graph explaining how an etching rate of Ar ion milling changes with an ion incident angle. The etch rate becomes maximum when the ion incident angle is around 53 degrees with respect to the normal to the surface. Therefore, when a right-angled edge is subjected to ion milling, a slanted surface which exhibits the maximum etching rate will appear.

Figure 1C:
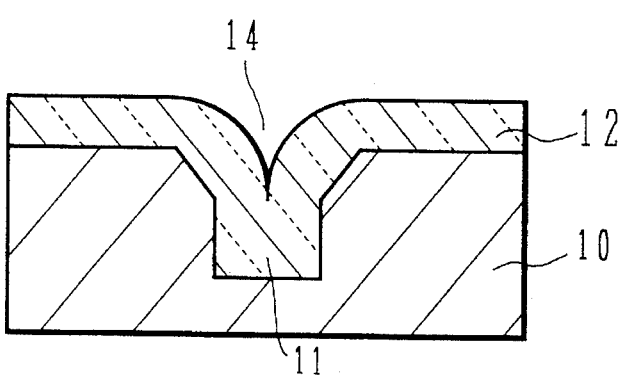

Next, as shown in FIG. 1C, a silicon oxide film is deposited as a sacrificial film 12 on the substrate 10 having the tapered recess 11. As a film deposition method, a low pressure CVD having good step coverage is used. This sacrificial film 12 determines the shape of an emitter. As shown in FIG. 1C, a sharp cusp 14 is formed on the surface of the sacrificial film 12 by transferring the topology of the tapered recess 11. By setting the height of the vertical side wall left under the tapered corner (transitional region) to about a half or more of the width of the recess 11, a cusp with a sharp edge is formed near at the level of the upper edge of the vertical wall when the lower part of the recess 11 between the vertical side wall is filled with the silicon oxide film. If the height of the vertical side wall is set smaller than a half of the width of the recess, when the upper surface of the sacrificial film 12 at the recess 11 reaches the level of the boundary between the vertical side wall and the tapered side wall, the opposing surfaces of the sacrificial film 12 on the vertical walls do not still touch each other or converge to one point and do not form a sharp edge.

Figure 1D:
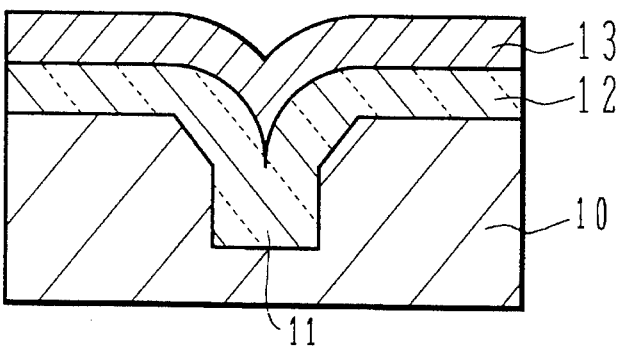

Next, as shown in FIG. 1D, an electron emitting material layer (cold cathode material layer) 13 of TiN is formed on the sacrificial film 12. As the material of the electron emitting material layer 13, other conductive materials may be used such as metals (W, Al, Cu, Mo, Au, Pt, Ag, Ti, Ni, Ta, Re, Cr, Zr, Hf, Y, Bi, St, Tl, Pb, Ca, Sn, Ge, and etc.) and compounds thereof semiconductive material (Si, Ge, GaAs, InSb, InAs, InSe, etc.), silicide materials ($WSi_2$, $MoSi_2$, $TiSi_2$, $TaSi_2$, NiSi, $CoSi_2$, etc.) and dielectric materials (diamond, diamond-like-carbon (DLC), $BaTiO_3$, $LiNbO_3$, etc.). The sacrificial film 12 is etched at a later process. It is therefore necessary to have a sufficient etching selection ratio of the sacrificial film 12 to the electron emitting material layer 13 by selecting a proper combination of both materials. Topology of the sharp cusp 14 is transferred to the electron emitting material layer 13, thus a sharp tip is formed on a bottom surface of the electron emitting material layer 13.

Figure 1E:
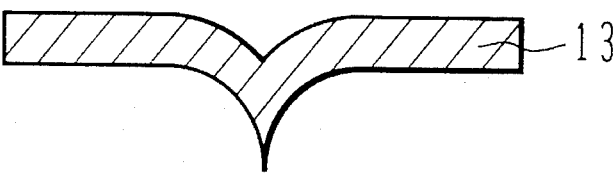

Lastly, unnecessary regions under the tip of the emitter are removed by wet etching or dry etching. For example, as shown in FIG. 1E, all the substrate 10 and sacrificial film 12 are removed to leave the emitter having a sharp tip. A fine emitter can be obtained which has a tip with a radius of curvature of about 10 nm or smaller.

Figure 3A:
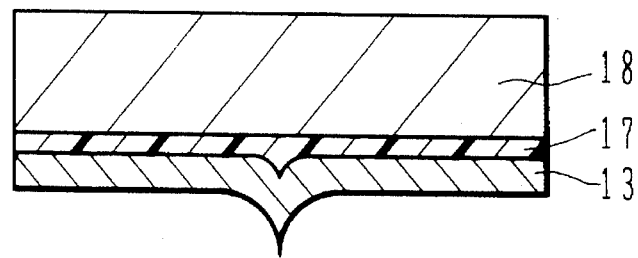
FIGS. 3A and 3B are cross sectional views showing modifications of the embodiment of FIGS. 1A to 1E.
Figure 3B:
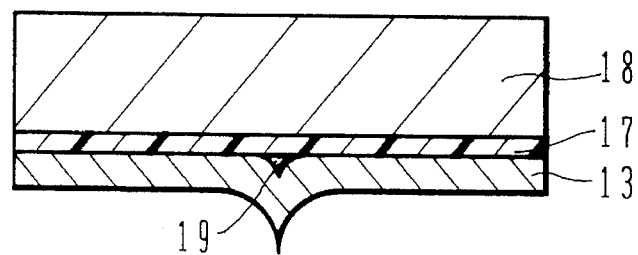

In the embodiment shown in FIGS. 1A to 1E, in order to give the electron emitting material layer 13 a sufficient mechanical strength, it is preferable to bond a support substrate 18 to the electron emitting material layer 13 as shown in FIG. 3A, by using adhesive 17 (or by anode bonding or the like), prior to etching and removing unnecessary regions. As shown in FIG. 3B, it is effective to planarize the electron emitting material layer 13 by forming thereon a planarizing film 19 such as SOG. More preferably, the surface of the electron emitting material layer 13 is polished and planarized by chemical mechanical polishing (CMP), or etched back and planarized.

Figure 4A:
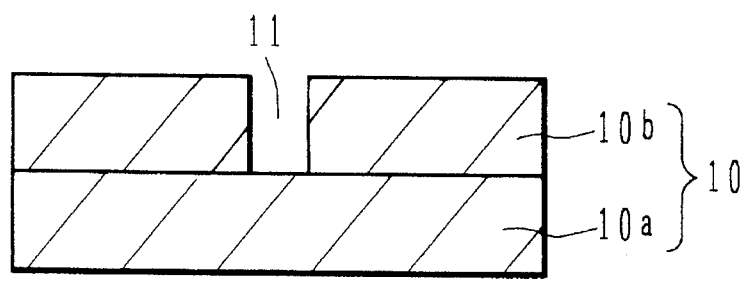
FIGS. 4A and 4B are cross sectional views showing other modifications of the embodiment of FIGS. 1A to 1E.

In the embodiment shown in FIGS. 1A to 1E, the substrate 10 is a single layer. The substrate may be made of two layers as shown in FIG. 4A. In this case, it is preferable to select a proper combination of materials for a starting substrate 10a and a laminate layer 10b so as to obtain a high etching selection ratio. If a proper combination is selected and the starting substrate 10a is used as an etching stopper when the recess 11 is formed, the recess 11 having a depth same as the thickness of the laminate film 10b can be obtained.

As described above, this embodiment provides an emitter electrode with a sharp tip by conformally depositing a sacrificial film by a deposition method having good step coverage after the recess is tapered. It is therefore possible to form an excellent vertical type cold cathode emitter having a tip with a small radius of curvature and a small apex angle.

The film deposition method having good step coverage has a long migration length on the surface of a film. Therefore, sharp convexities and concavities are likely to be covered with a film having a more gentle curvature.

Figure 4B:
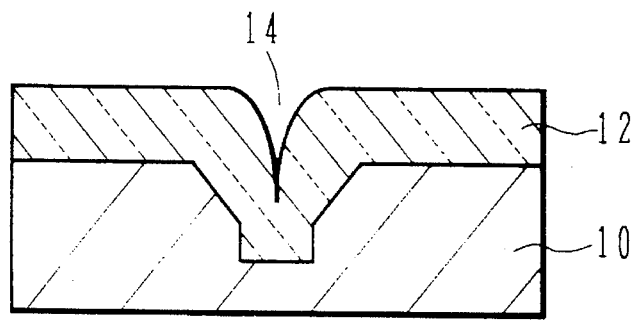

In the embodiment shown in FIGS. 1A to 1E, the sacrificial film 12 may be deposited by a film deposition method having poor step coverage such as plasma CVD and sputtering as shown in FIG. 4B. If a sacrificial film is deposited on a tapered recess by a film deposition method having poor step coverage, it is possible to form an emitter mold having a sharp tip. In the case of non-conformal film deposition, a film thickness on a horizontal surface becomes thicker than on a vertical surface so that the surface of the film on the vertical surface is converged to one point at a higher level.

Figure 5A:
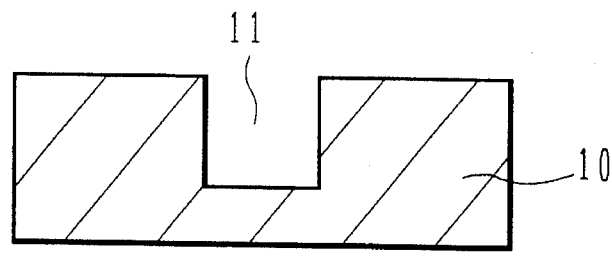
FIGS. 5A to 5E are cross sectional views illustrating processes of manufacturing an emitter according to another embodiment of the invention.
Figure 5B:
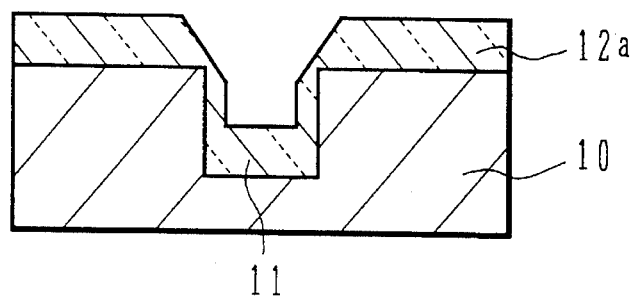

FIGS. 5A to 5E illustrate processes of manufacturing an emitter according to another embodiment of the invention. Like elements to those shown in FIGS. 1A to 1E are represented by identical reference numerals, and the detailed description thereof is omitted. As shown in FIG. 5A, a recess 11 is formed in a substrate 10. Next, as shown in FIG. 5B, a tapered first sacrificial film 12a is formed. This taper is formed by bias sputtering which progresses sputter etching at the same time the film is deposited. For example, a negative potential relative to Ar gas plasma is applied both to an $SiO_2$ target and the substrate 10 to perform bias sputtering. In this case, because of a film deposition rate and a dependency of an etching rate upon an ion incident angle, although a silicon oxide film is deposited on the flat area, it is less formed at the corner of the recess 11 since the etching rate is fast at the corner. As a result, as shown in FIG. 5B, a taper surface is formed at the upper end portion of the recess 11. In this embodiment, a laminated structure of the substrate 10 and the tapered first sacrificial film 12a, is served as a base for a second sacrificial film to be formed afterwards. In this case, the diameter of the recess 11 is made small by the deposited silicon oxide film so that a new recess having a diameter smaller than that determined by a precision of photolithography can be formed.

Figure 5C:
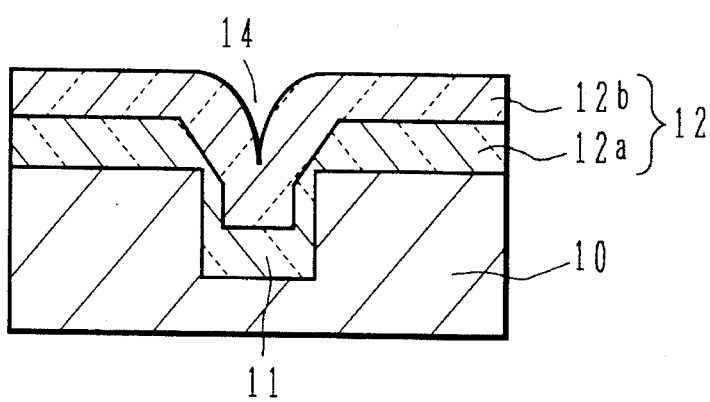
Figure 5D:
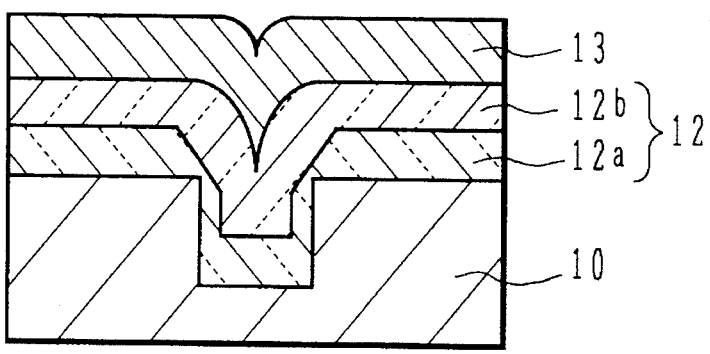
Figure 5E:
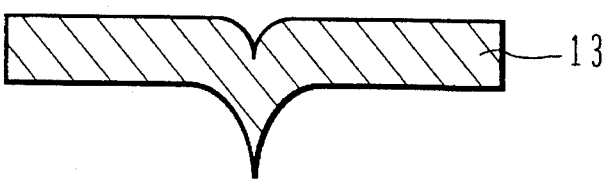

Thereafter, as shown in FIG. 5C, a second sacrificial film 12b is deposited by a film deposition method having good step coverage. A cusp 14 having a sharp edge reflecting the surface topology of the first sacrificial film 12a can be formed. Then, as shown in FIG. 5D, similar to the first embodiment, an electron emitting material layer 13 is deposited, and as shown in FIG. 5E, unnecessary regions are etched and removed to obtain an emitter with a sharp tip.

Also in this embodiment, the modifications shown in FIGS. 3A to 4B are possible.

The above embodiments have been described for the case of a single emitter. As will be later described, if a plurality of emitters are formed in an array, an electron source (electron gun) called a field emitter array (FEA) can be formed which is applied to various vacuum microelectronics.

An electron source of this type is generally integrated with gate electrodes. In the following embodiments, gate electrodes are formed in self-alignment with emitters.

Figure 6A:
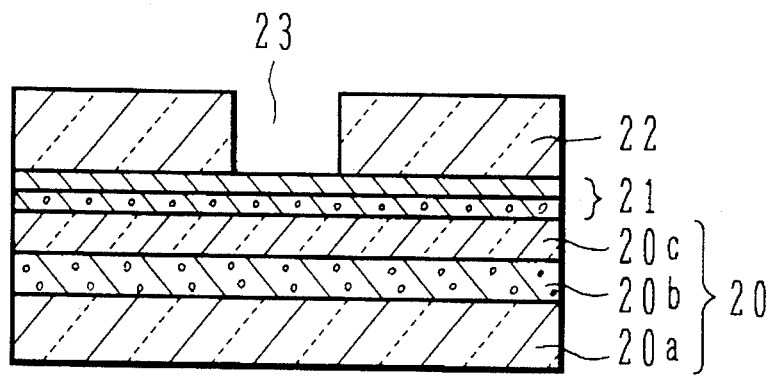
FIGS. 6A to 6F are cross sectional views illustrating processes of manufacturing an electric field emission type device according to another embodiment of the invention.

FIGS. 6A to 6F illustrate processes of manufacturing a triode device with an anode electrode, an emitter electrode, and a gate electrode according to another embodiment of the invention, similar to the embodiment of FIGS. 1A to 1E. This embodiment uses a laminate of a conductive layer and an insulating layer as the underlying layer of an insulating emitter mold film. As shown in FIG. 6A, a substrate 20 is a laminate substrate having an insulator body 20a on which an anode electrode 20b and an insulating film 20c are formed. For example, the insulator body 20a is made of silicon oxide or glass such as soda lime, the anode electrode layer 20b is made of polysilicon, and the insulating film 20c is made of silicon oxide.

On the substrate 20, a laminate film as a first conductive film 21 is deposited, the laminate film being constituted by a polysilicon film and a W silicide film, and the first conductive film 21 serving as the gate electrode. Thereafter, a first insulating film 22 is deposited. The first insulating film 22 is made of a silicon oxide film or silicon nitride film having a thickness necessary for the formation of the emitter mold. In the following description, the material of the first insulating film 22 is assumed to be silicon nitride.

A laminate substrate inclusive of the gate electrode layer may also be used. A laminate substrate inclusive of the first insulating film may also be used.

Next, a recess 23 is formed in the first insulating film 22 by anisotropic dry etching such as reactive ion etching (RIE), the recess 23 having a vertical or substantially vertical side wall reaching the first conductive film 21.

Figure 6B:
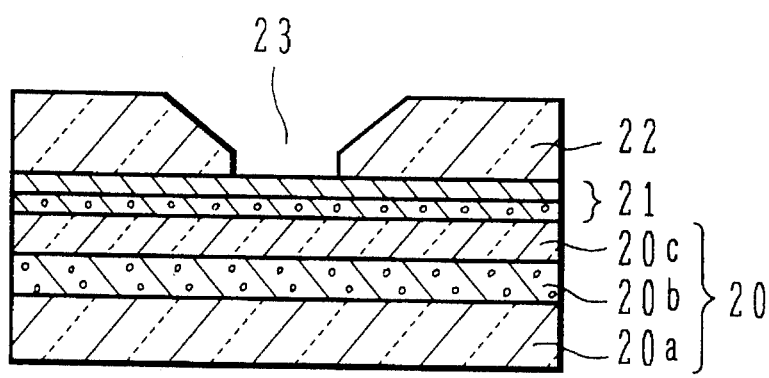
Figure 6C:
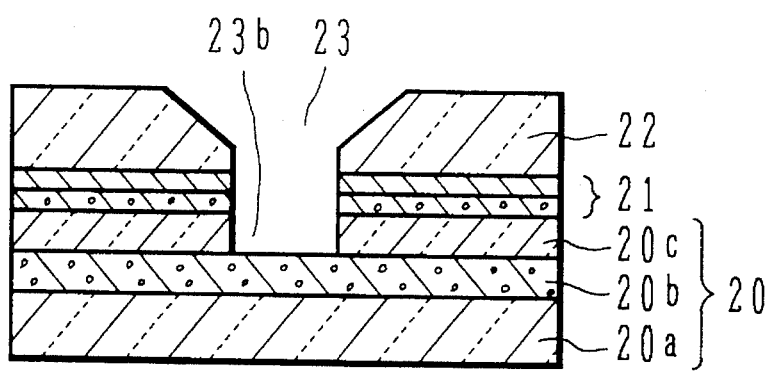

Next, as shown in FIG. 6B, a taper is formed at the upper corner of the recess 23 of the substrate by sputter etching. Next, as shown in FIG. 6C, by using the first insulating film as a mask, the first conductive film 21 exposed in the recess 23 is selectively etched by dry etching to form a gate electrode pattern. A hole 23b having the diameter of the initial recess 23 is therefore formed in the gate electrode. The taper formed at the corner of the recess 23 of the substrate and the hole 23b are collectively served as a tapered recess. In this embodiment, a laminated structure of the substrate 20, the first conductive film 21 and the first insulating film 22, is served as a base having a tapered recess for a second insulating film (a sacrificial layer for an electron emitting material layer) to be formed afterwards. In this embodiment, the insulating film 20c of the substrate under the gate electrode 21 is also etched.

For the etching of the insulating film 20c, etching gas different from that used for etching the first conductive film 21 is used. The different materials $SiO_2$ and SiN as exemplarily used for the insulating film 20c and first insulating film 22 allow selection of etching conditions, which conditions give a sufficiently large etching selection ratio of the insulating film 20c to the first insulating film 22. The insulating film 20c can be therefore etched without etching the first insulating film 22.

Unless the insulating film 20c is selectively etched with respect to the insulating film 22, an initial thickness of the insulating film 22 in the state of FIG. 6A is set to the thickness including etched amount during the etching of the insulating film 20c. Although etching process of the insulating film 20c by reactive ion etching (RIE) is shown in FIG. 6C, the insulating film 20c may be etched by isotropic etching such as a wet etching method, or the like.

Figure 6D:
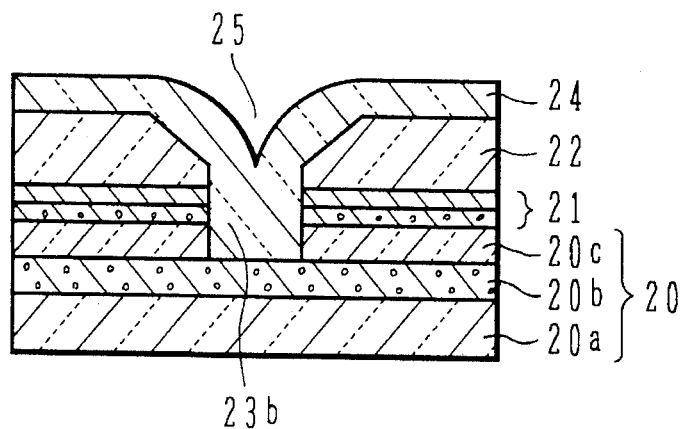

Next, as shown in FIG. 6D, a second insulating film 24 such as $SiO_2$ is deposited. This second insulating film 24 corresponds to the sacrificial film 12 of the first embodiment. Therefore, by depositing this film 24 under the same conditions as the first embodiment, a cusp 25 having a sharp edge is formed on the surface of the insulating film 24 like the first embodiment. This insulating film 24 becomes the emitter mold.

Figure 6E:
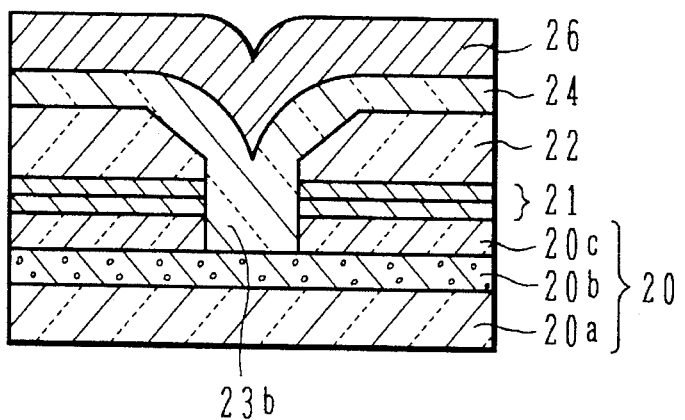

Next, as shown in FIG. 6E, a second conductive film (an electron emitting material layer) 26 such as TiN serving as an emitter electrode is deposited on the insulating film 24.

Figure 6F:
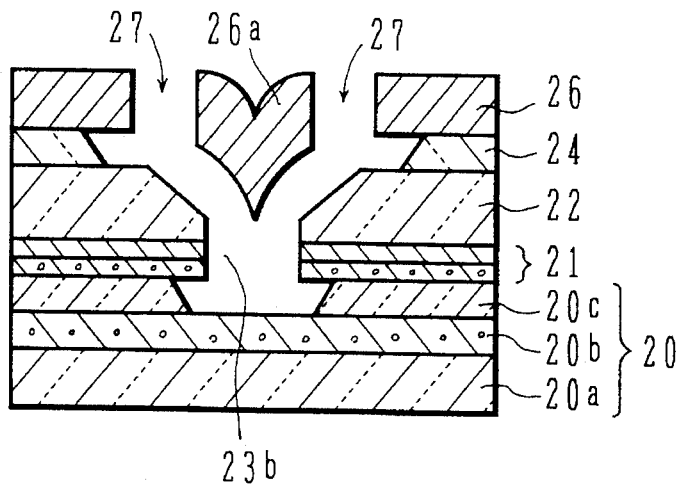

Next, as shown in FIG. 6F, the second conductive film 26 is selectively etched to form slit openings 27 on the opposite sides of a portion which functions as a real emitter 26a. The emitter 26a is supported by the second conductive film 26 at a region not shown in FIG. 6F. Through these slit openings 27, the second insulating film 24 of $SiO_2$ used as the emitter mold is wet-etched until the end face of the gate electrode 21 and the upper surface of the anode electrode 20b are exposed. The insulating film 20c of $SiO_2$ is partially etched at the same time. A space is therefore formed under the edge of the gate electrode 21 after the removal of unnecessary regions under the emitter 26a to the anode electrode 20b. By selecting the etching conditions which give a large etching selection ratio to the first insulating film 22 of SiN, the second insulating film 24 under the emitter is laterally etched and also the insulating film 20c on the anode electrode is laterally etched to retract it properly, without etching the first insulating film 22.

For selective etching, buffered hydrofluoric acid (mixture of HF(hydrofluoric acid) and $NH_4F$ (ammonium fluoride)) can be used.

Since the first conductive film (gate electrode) 21 is protected by the insulating film 22, electric short-circuit and current leak between the emitter 26a and the first conductive film 21 are avoided, yield can be improved.

Figure 7:
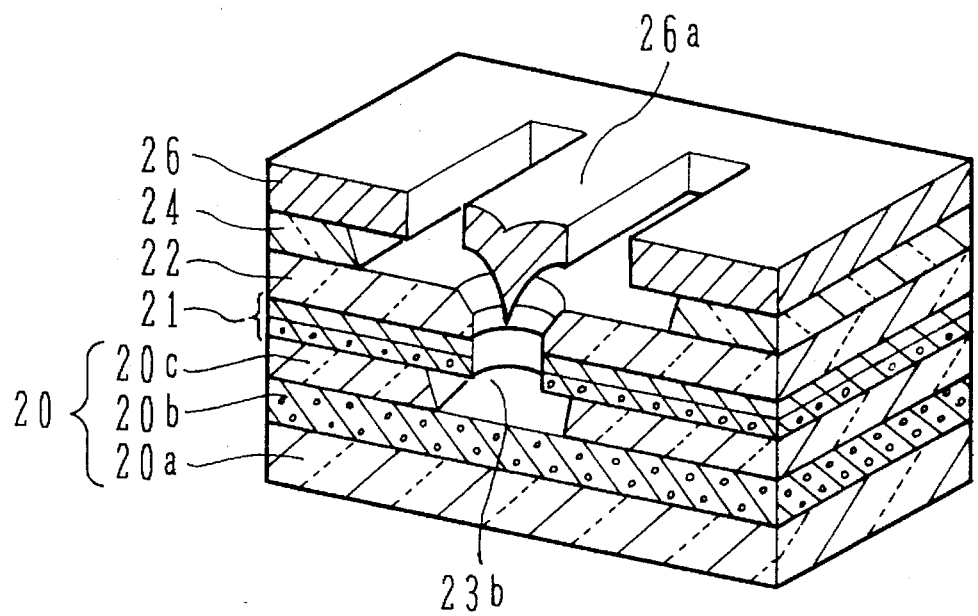
FIG. 7 is a perspective view showing the structure of an electric field emission type device manufactured by the embodiment of FIGS. 6A to 6F.

FIG. 7 is a perspective view of the device shown in FIG. 6F. The triode element formed in the above manner is vacuum sealed to form a fine triode.

Figure 8:
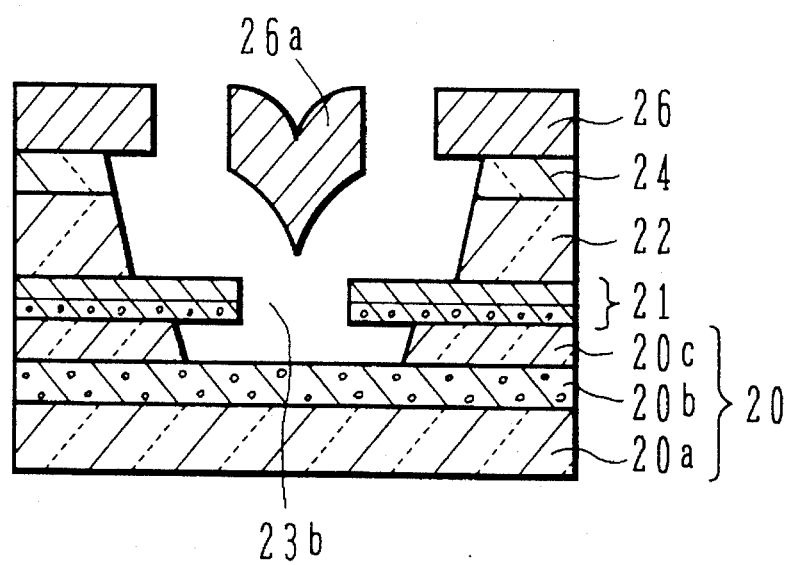
FIG. 8 is a cross sectional view of an electric field emission type device according to another embodiment.

FIG. 8 is a cross sectional view showing a triode whose first insulating film 22 is made of the same material ($SiO_2$) as the other insulating films 20c and 24. The first insulating film 22 is also side-etched by a similar amount to the second insulating film 24.

With these embodiments, an electron source having a high performance cold cathode emitter self-aligned with a gate electrode can be obtained. The hole 23b of the gate electrode 21 surrounding the emitter tip is defined by the size of the recess 23. Therefore, by reducing the diameter of the first formed recess 23, a distance between the gate electrode 21 and the tip of the emitter 26a can be shortened. Electrons can be therefore emitted efficiently even at a low control voltage applied to the gate electrode 21.

In these embodiments, other materials of the anode electrode 20b may be amorphous silicon, W silicide, Mo silicide, W, Mo, Ta, Ti, Cr, and etc. Other materials of the first conductive film 21 serving as the gate electrode may be polysilicon, amorphous silicon, W silicide, Mo silicide, W, Mo, Ta, Ti, Cr, and etc. Other materials of the second conductive film 26 serving as the emitter may be those materials enumerated in the first embodiment. The second insulating film 24 and insulating film 20c of the substrate may be a silicon nitride film, a laminate film of a silicon oxide film and a silicon nitride film, and other films.

Figure 9A:
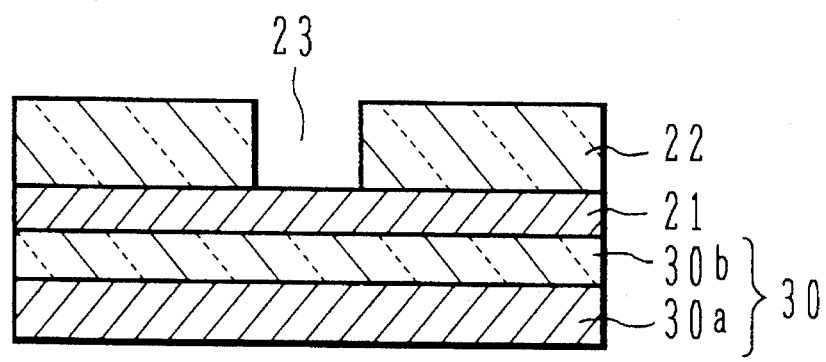
FIGS. 9A to 9G are cross sectional views illustrating processes of manufacturing an electric field emission type device according to another embodiment of the invention.
Figure 9B:
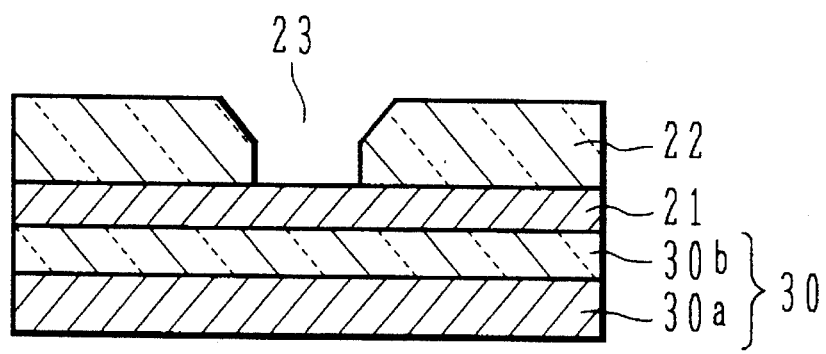
Figure 9C:
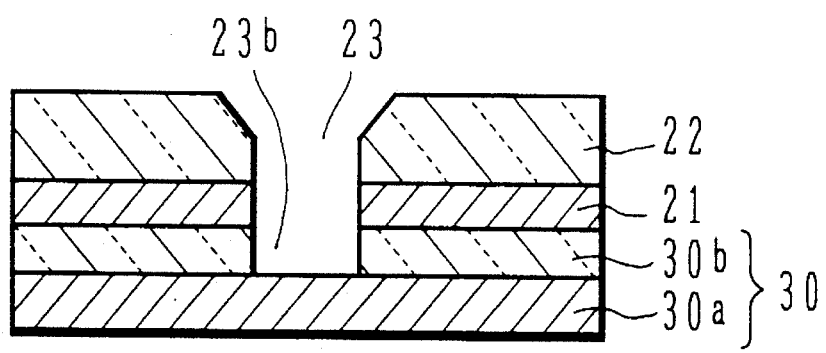

FIGS. 9A to 9G illustrate processes of manufacturing an electron emitter integrated with a gate electrode according to another embodiment of the invention. Like elements to those of the embodiment shown in FIGS. 6A to 6F are represented by using identical reference numerals, and the description thereof is omitted. In this embodiment, as shown in FIG. 9A, a starting substrate 30 is a laminate of a conductive sheet 30a made of, for example, Si and an insulating film 30b formed thereon. As compared to the substrate 20 shown in FIG. 6A, this embodiment substrate is not provided with the lowest insulator body 20a. The processes similar to FIGS. 6A to 6F are performed. First, as shown in FIG. 9A, a first conductive film 21 made of, for example, P doped Poly-Si and a first insulating film 22 made of, for example, SiN are deposited and a recess 23 is formed like the previous embodiments. Next, as shown in FIG. 9B, a taper (a facet) is formed by sputter etching. Then, as shown in FIG. 9C, by using the first insulating film as a mask, a gate electrode is patterned by etching and the underlying insulating film 30b made of, for example, $SiO_2$ is also patterned.

Unless the insulating film 20c is selectively etched with respect to the insulating film 22, an initial thickness of the insulating film 22 in the state of FIG. 6A is set to the thickness including etched amount during the etching of the insulating film 20c. Although etching process of the insulating film 20c by reactive ion etching (RIE) is shown in FIG. 6C, the insulating film 20c may be etched by isotropic etching such as a wet etching method, or the like. The taper formed at the corner of the recess 23 of the substrate and the hole 23b are collectively served as a tapered recess. In this embodiment, a laminated structure of the substrate 30 and the first conductive film 21, is served as a base having the tapered recess for a sacrificial layer to be formed afterwards.

Figure 9D:
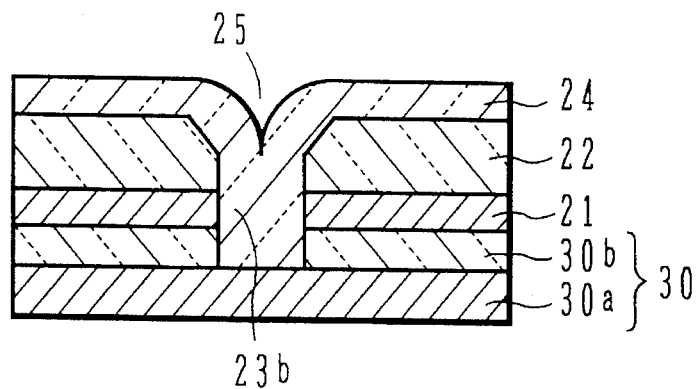

Next, as shown in FIG. 9D, a second insulating film 24 (a sacrificial layer) made of, for example, $SiO_2$ is deposited.

Figure 9E:
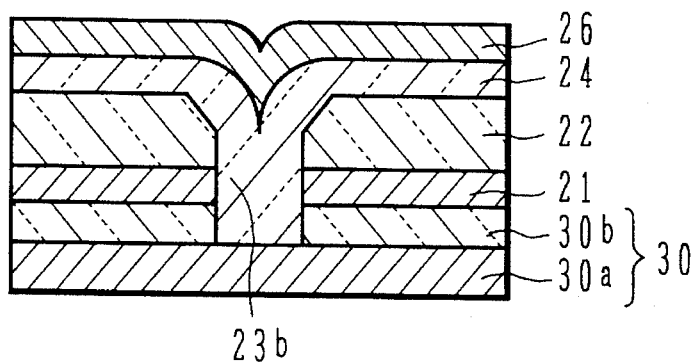
Figure 9F:
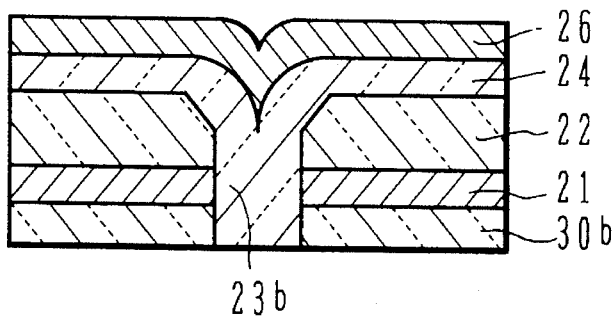

Then, as shown in FIG. 9E, a second conductive film 26 made of, for example, TiN serving as an emitter electrode is deposited. The succeeding processes are different from the embodiment shown in FIGS. 6A to 6F. As shown in FIG. 9F, the conductive sheet 30a of the substrate is etched and removed. The substrate is removed through two-step process as follows:

1st step (fast etching)

$$HF+HNO_3+CH_3COOH \text{ or}$$

$$HF+HNO_3+H_2O$$

2nd step (selective etching with respect to $SiO_2$)

ethylenediamine+aq.catechol

Figure 9G:
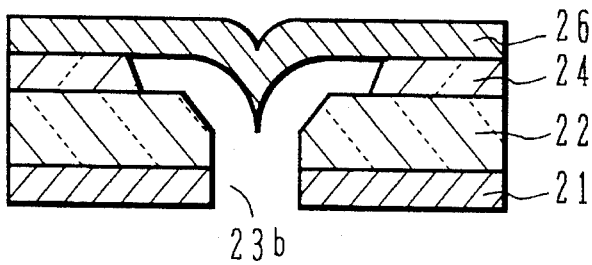

The exposed insulating film 30b and the second insulating film 24 used as the emitter mold are etched to expose the emitter tip and the end face of the gate electrode as shown in FIG. 9G. Also in this case, the etching conditions are selected so as to make the etching rate of the insulating film 30b and second insulating film 24 made of, for example, $SiO_2$ sufficiently faster than that of the first insulating film 22 made of, for example, SiN. Under these etching conditions, the end face of the second insulating film 24 can be properly retracted and the tip of the emitter can be exposed as shown in FIG. 9G.

For selective etching, buffered hydrofluoric acid (mixture of HF(hydrofluoric acid) and $NH_4F$ (ammonium fluoride)) can be used.

Since the first conductive film (gate electrode) 21 is protected by the insulating film 22, electric short-circuit and current leak between the emitter 26a and the first conductive film 21 are avoided, yield can be improved.

Figure 10:
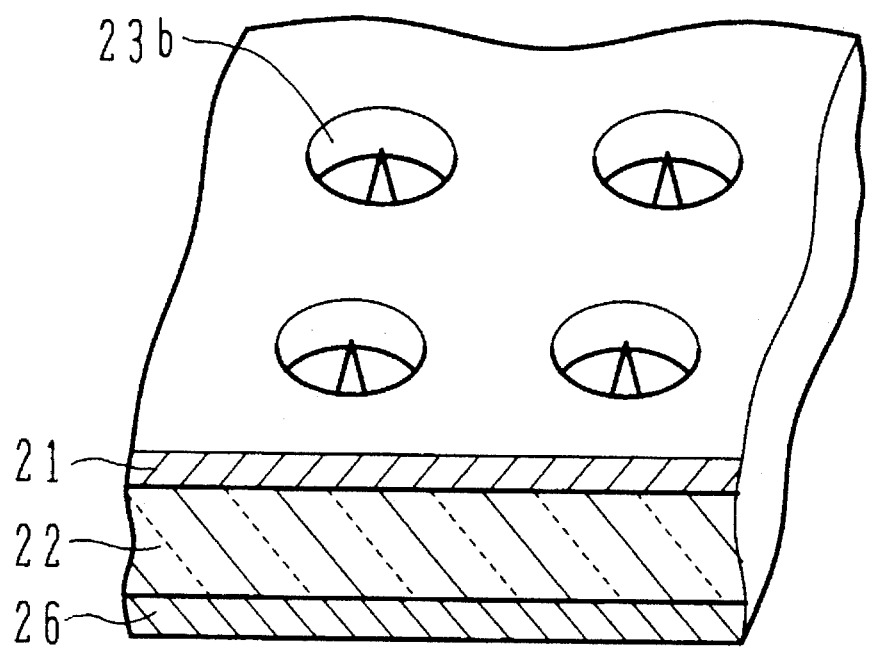
FIG. 10 is a perspective view showing the structure of a modification of the electric field emission type device manufactured by the embodiment shown in FIGS. 9A to 9G.

FIG. 10 is a perspective view of an FEA obtained by the embodiment method illustrated with FIGS. 9A to 9G. At the center of the hole 23b of the gate electrode 21, the tip of the emitter electrode 26 is exposed. For example, this FEA is faced with an anode having a fluorescent member and vacuum-sealed to obtain a flat panel display.

Figure 11:
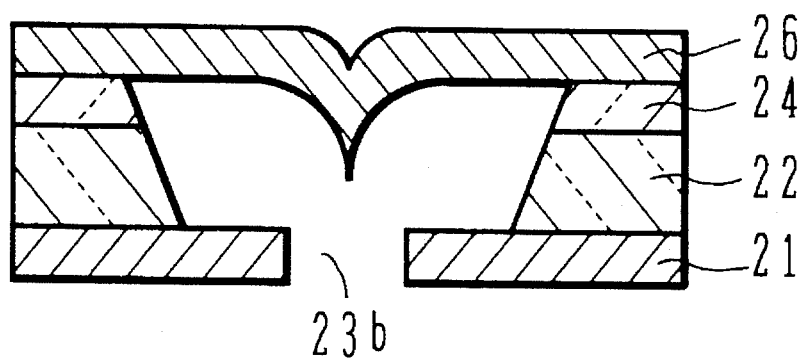
FIG. 11 is a cross sectional view showing the structure of an electric field emission type device according to another embodiment of the invention.

If at the etching process of FIG. 9G the etching conditions are selected so as to make the etching rates of the first and second insulating films 22 and 24 equal to each other, the first insulating film 22 is also retracted as shown in FIG. 11.

Figure 12A:
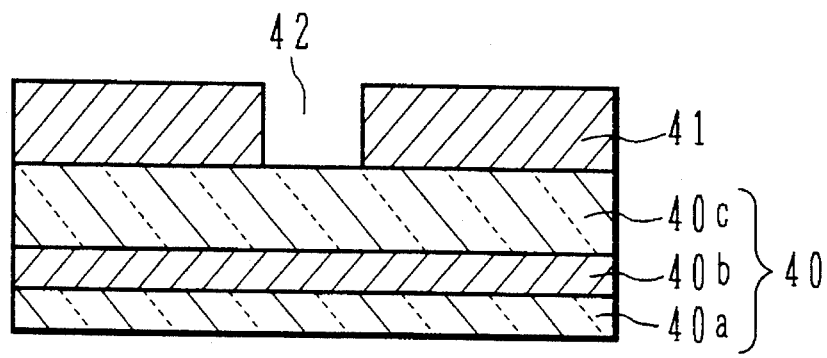
FIGS. 12A to 12F are cross sectional views illustrating processes of manufacturing an electric field emission type device according to another embodiment of the invention.

FIGS. 12A to 12F illustrate processes of manufacturing a triode device with an anode electrode, an emitter electrode, and a gate electrode according to another embodiment of the invention. This embodiment uses a laminate of a conductive layer and an insulating layer as the underlying layer of an insulating emitter mold film. As shown in FIG. 12A, a starting substrate 40 is a laminate substrate having an insulator body 40a on which a conductive film 40b as an anode electrode and an insulating film 40c are formed. On this substrate 40, a first conductive film 41 is deposited which is used both as the underlying layer of the emitter mold and as the gate electrode. The first conductive film 41 is, for example, a semiconductor film such as P doped polysilicon. This first conductive film 41 is etched by RIE or other etching processes to form a recess 42 having a vertical or substantially vertical side wall reaching the substrate 40.

Figure 12B:
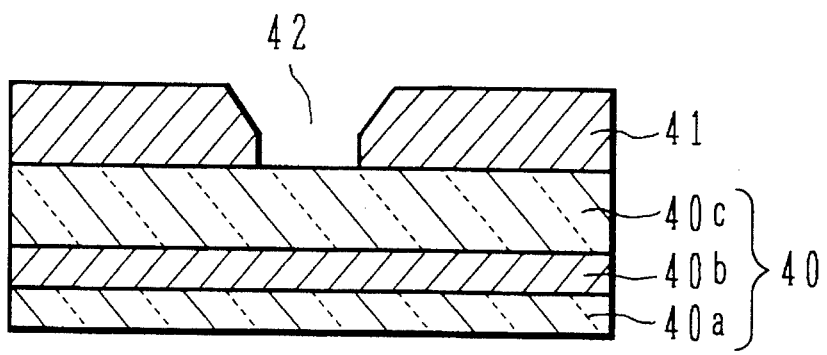

Next, as shown in FIG. 12B, the first conductive film 41 is dry-etched to form a taper on the upper corner of the recess 42. However, if the first conductive film 41 is made of polysilicon, such a taper can be formed by dry etching, for example, in a parallel plate type RIE system under the etching conditions of an RF power of 0.19 W/cm$^2$, a pressure of 0.18 Torr, a $CCl_2F_2$ flow rate of 50 sccm, and a $C_2H_2$ flow rate of 1 to 20 sccm.

Other conductive materials can be etched by an Ar ion milling apparatus having a bucket type ion source and a multi-aperture grid. An example of etching condition is as follows:

| beam current density: | 0.5mA/cm$^2$ |
|---|---|
| accelerating voltage: | 600V |
| inclination angle: | 0° |

Etch rates among various materials are not changed very much.

Figure 12C:
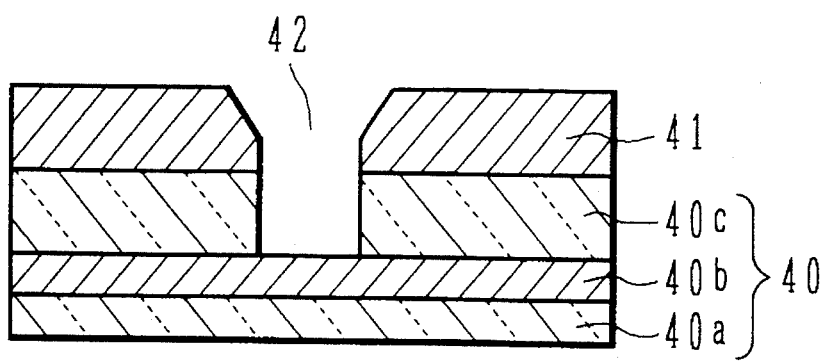

Next, as shown in FIG. 12C, by using the first conductive film 41 as a mask, the insulating film 40c of the substrate 40 is etched. As similar to the structure depicted in FIGS. 9A to 9C, a laminated structure of the substrate 40 and the first conductive film 41 is served as a base having the tapered recess for a sacrificial layer to be formed afterwards.

Figure 12D:
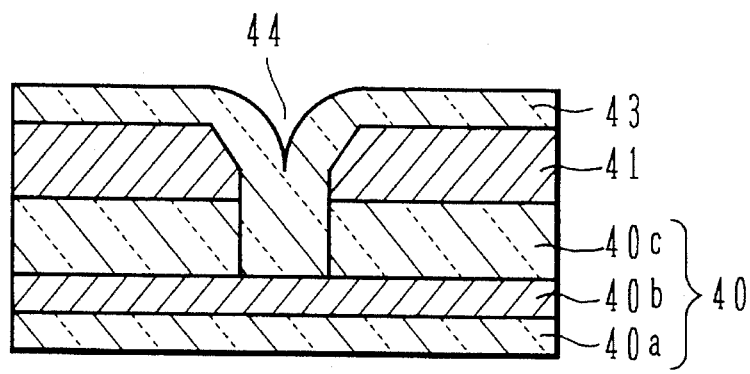

Next, as shown in FIG. 12D, an insulating film 43 used as an emitter mold (a sacrificial layer) is deposited by a film deposition method having good step coverage.

As the insulating film 43, silicon oxide can be deposited by a condition of:

| Flow rate of $N_2$: | 18 litter/min |
|---|---|
| Flow rate of $O_2$: | 7.5 litter/min |
| Flow rate of $O_3$: | 1.3 litter/min |
| Flow rate of TEOS: | 7.9 cc/min |

If the film thickness of this insulating film 43 is properly set, a cusp 44 having a sharp edge can be formed on the surface of the insulating film 43, similar to the previous embodiments.

Figure 12E:
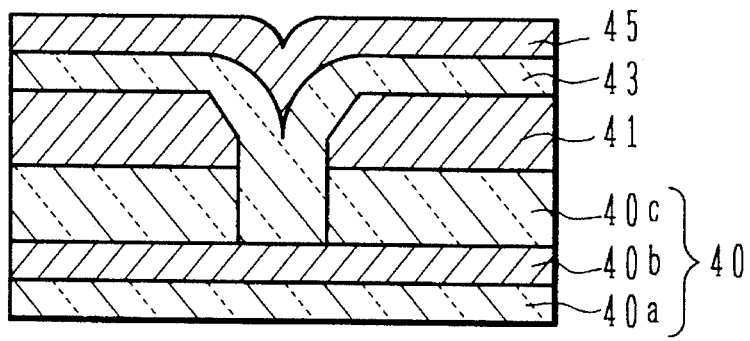

As shown in FIG. 12E, a second conductive film 45 (an electron emitting material layer) serving as the emitter electrode is deposited.

Figure 12F:
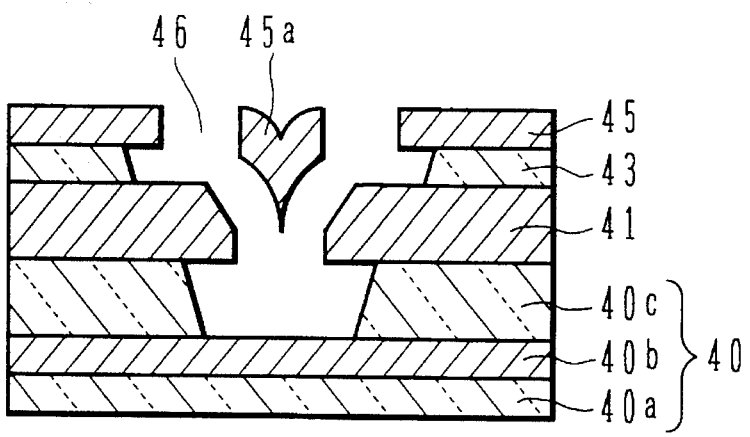

Next, as shown in FIG. 12F, similar to FIG. 6F, the second conductive film 45 is selectively etched to form slit openings 40 on the opposite sides of an emitter 45a. Through these silt openings 46, the insulating film 43 used as the emitter mold and the insulating film 40c of the substrate 40 are etched to expose the tip of the emitter electrode, the end face of the gate electrode, and the anode surface.

Also in this embodiment, a triode having a high performance emitter can be obtained similar to the embodiment shown in FIGS. 6A to 6F. Particularly in this embodiment, since the underlying film of the emitter mold film is made of the conductive film 41 and this film 41 is used as the gate electrode, a distance between the emitter tip and the gate electrode can be made very short. Therefore, an electric field can be generated near the emitter tip at a much lower gate voltage. As compared to the embodiment of FIGS. 6A to 6F, at the insulating film etching process of FIG. 12F, a large etching ratio of the insulating film can be obtained easily because only the emitter and gate electrode conductive films are required to be considered.

In this embodiment, although the first conductive film 41 is a single layer, this may have a two-layer structure. For example, it may be a laminate film of a P doped polysilicon film and a W silicide film. The angle of the taper at an upper portion of the recess 42 may be made different from the angle of the taper at a lower portion thereof by varying the flow rate of $C_2H_2$ during the dry etching process or varying incident angle of Ar ion during the ion-milling process.

Figure 13A:
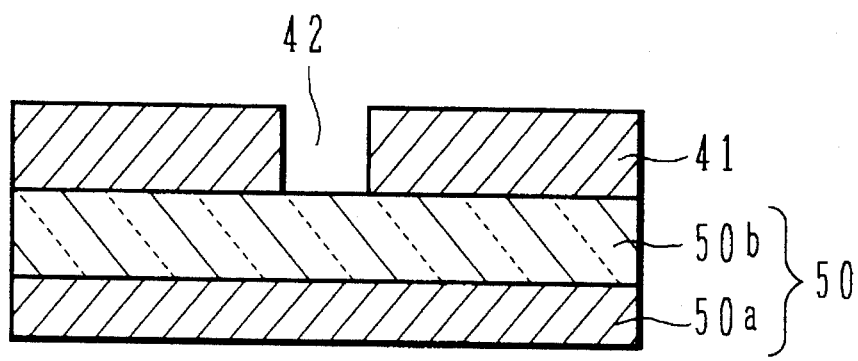
FIGS. 13A to 13G are cross sectional views illustrating processes of manufacturing an electric field emission type device according to another embodiment of the invention.
Figure 13B:
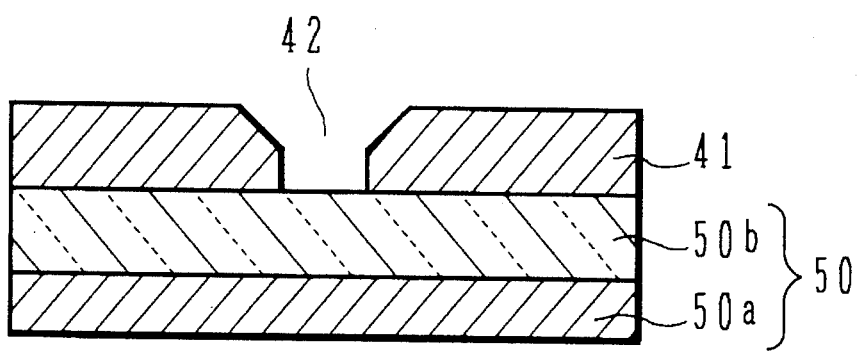

FIGS. 13A to 13G illustrate processes of manufacturing an emitter according to another embodiment of the invention. Like elements to those shown in FIGS. 12A to 12F are represented by identical reference numerals, and the detailed description thereof is omitted. In this embodiment, as shown in FIG. 13A, a starting substrate 50 is a laminate of a conductive body 50a and an insulating film 50b formed thereon. As compared to the substrate 40 shown in FIG. 12A, the substrate is not provided with the insulating body 40a. Processes similar to FIGS. 12A to 12E are performed. First, as shown in FIG. 13A, similar to the previous embodiments, a first conductive film 41 serving as a gate electrode is deposited on the substrate 50 and a recess 42 is formed in the first conductive film 41. As shown in FIG. 13B, a taper is formed on the corner of the recess 42 by sputter etching.

Figure 13C:
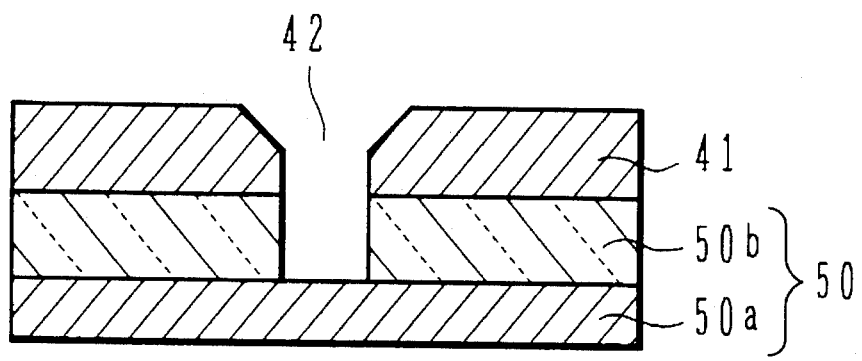
Figure 13D:
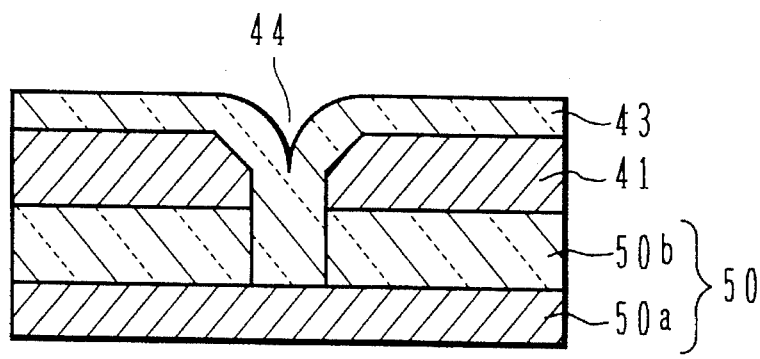
Figure 13E:
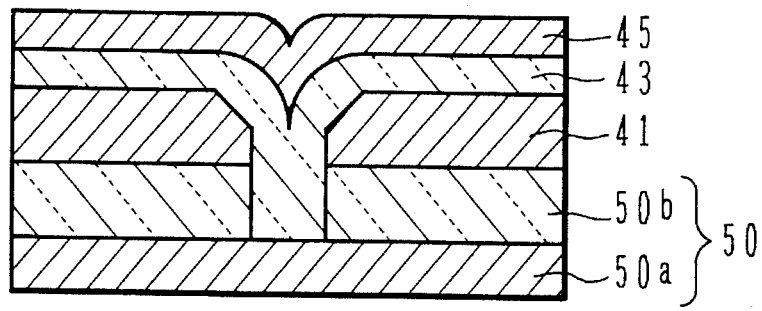
Figure 13F:
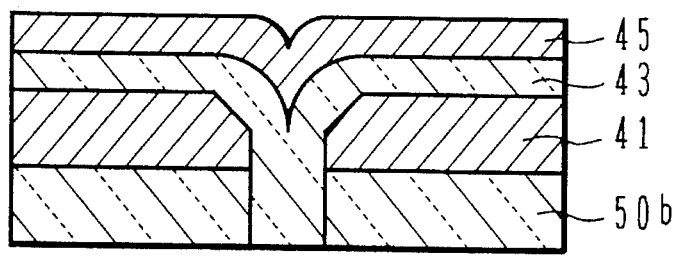

Next, as shown in FIG. 13C, by using the first conductive film 41 as a mask, the insulating film 50b of the substrate is etched to deepen the recess. As similar to the structure of the previous embodiments, a laminated structure of the substrate 50 and the first conductive film 41, is served as a base having the tapered recess for a sacrificial layer to be formed afterwards. Next, as shown in FIG. 13D, an insulating film 43 (a sacrificial layer) is deposited under the same conditions as the previous embodiment. As shown in FIG. 13D, a cusp 44 having a sharp edge reflecting the topology of the underlying layer is formed on the surface of the insulating film 43. Next, as shown in FIG. 13E, a second conductive film 45 (an electron emitting layer) serving as the emitter electrode is deposited. Thereafter, as shown in FIG. 13F, the conductive body 50a of the substrate is completely etched.

Figure 13G:
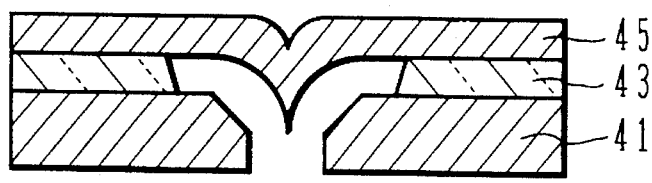

Lastly, as shown in FIG. 13G, the insulating film 43 is etched to expose the emitter tip. In the structure shown in FIG. 13G, although the substrate insulating film 50b is also etched and the bottom of the gate electrode is exposed, the emitter electrode may be exposed without exposing the bottom of the gate electrode. To this end, the insulating films 43 and 50b are made of different materials and the etching conditions allowing the etching of only the insulating film 43 are selected.

In the above manner, an FEA like that shown in FIG. 10 can be obtained. Also in this embodiment, an FEA having a high performance fine emitter self-aligned with the gate electrode at a small gap therebetween can be realized.

Figure 14A:
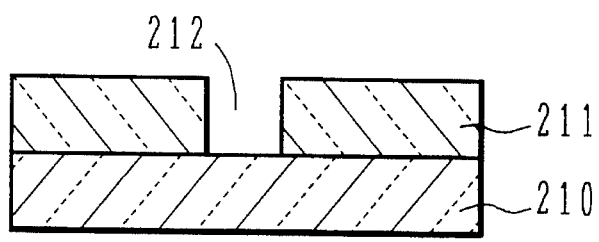
FIGS. 14A to 14E are cross sectional views illustrating processes of manufacturing an emitter according to another embodiment of the invention.

FIGS. 14A to 14E are cross sectional views illustrating a manufacturing method according to another fundamental embodiment of this invention. First, as shown in FIG. 14A, a low melting point material layer 211 is deposited on the surface of a substrate 210, and a recess 212 having a vertical side wall is formed in the low melting point material layer 211. In FIG. 14A, one recess is formed for one emitter. If a field emitter array (FEA) having a number of emitters is to be formed, a number of recesses are formed on the substrate. If a point type emitter is to be formed, the cross section of the recess 211 in the direction parallel to the substrate surface is circular as shown in FIG. 15A, and if a wedge type emitter is to be formed, the cross section is stripe-shaped as shown in FIG. 15B.

The side wall of the recess 212 is not necessary to be strictly vertical, but it is sufficient if it is approximately vertical.

As the substrate 210, insulating material substrates made of glass, quartz, or the like, semiconductor substrates made of Si, Ge, GaAs, or the like, conductive material substrates made of Al, Cu, or the like, or laminate substrates thereof may be used. The low melting point material layer 211 may be of a single layer structure or a multi-layer structure. The material of this layer is selected from a group consisting of low melting point glass such as phosphosilicate glass (PSG), borophosphosilicate glass (BPSG), arsenosilicate glass (AsSG), and phosphogermanosilicate glass (PGSG), fritting glass (compound of Pb, Zn, Si, and O), kovar (alloy of Fe, Co, and Ni), solder, Si-Ge, and low melting point metal (Cd, In, Sn, Tl, Pb, Bi, Po, At, etc.). For example, a BPSG film is deposited by CVD by adding $B_2O_3$ of 9.1 mol % and $P_2O_5$ of 5.3 mol % in addition to the deposition conditions of an $SiO_2$ film. In the case of the laminate film, it is preferable to use the lowest melting point material as the uppermost film. In the following example, it is assumed that the substrate 210 is made of $SiO_2$ and the low melting point material layer 211 is made of low melting point glass.

The recess 212 is etched by using a resist mask formed by general lithography and reactive ion etching (RIE) or ion milling. The size of the recess 212 is determined by the size of a cold cathode emitter to be formed. For example, the width is in the order of 0.1 to 1 μm, and the depth is about a half or more of the width. For example, the recess 212 having an aspect ratio of about ½ to 1 is formed.

Without using a resist mask, the recess 212 may be directly formed in the low melting point material layer 211 by ion milling or by using a laser beam.

Figure 14B:
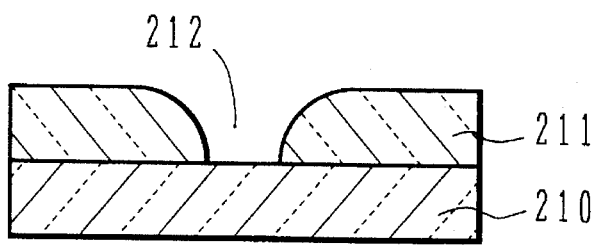

Next, as shown in FIG. 14B, the low melting point material layer 211 with the recess 212 is heated and reflowed to form a smoothly curved surface on the upper side wall (a transitional region) of the recess 212. For example, if the recess has an aspect ratio of 1 or smaller and the low melting point material layer is thin, an opening gradually broadening toward the upper surface is likely to be formed. For example, if the low melting point material layer 211 is made of PSG or BPSG which has a melting point of 750° to 950° C., reflow can be performed in a heating furnace in 10 to 200 minutes. If lamp annealing or laser heating is used, reflow can be performed in a short time of 10 to 100 seconds. For example, in the case of a BPSG film, lamp annealing is performed in an $N_2$ atmosphere by raising the temperature from room temperature to a range of 850° to 1050° C. in 10 seconds and maintaining the heated state for 10 to 60 seconds. In this embodiment, a laminated structure of the substrate 210 and the low melting point material layer 211 is served as a base having the tapered recess for a sacrificial layer to be formed afterwards.

Figure 14C:
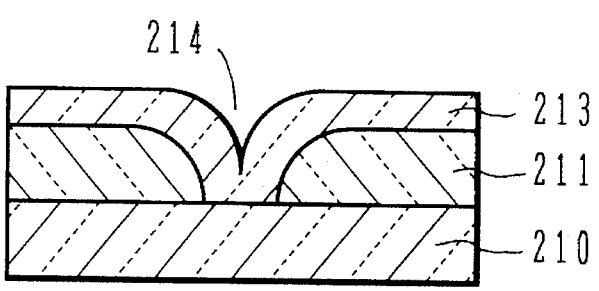

Next, as shown in FIG. 14C, a sacrificial film 213 is deposited covering the recess 212 with the curved surface. The sacrificial film 213 is preferably a silicon oxide film formed by a film deposition method having good step coverage such as low pressure CVD. This sacrificial film 213 is used for an emitter mold and has a cusp 214 with a sharp edge as shown in FIG. 14C. Since the upper opening of the recess 212 is substantially formed in an upwardly diverging taper shape by the reflow process, the cusp 214 with a sharp edge can be formed with good reproductivity by forming the sacrificial film 213 by a film deposition method having good step coverage.

Figure 14D:
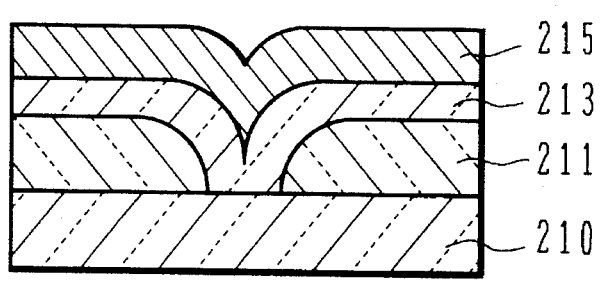

Next, as shown in FIG. 14D, an electron emitting material layer (cold cathode material layer) 215 is formed on the sacrificial film 213. As the material of the electron emitting material layer 13, various conductive materials may be used such as metals (Al, Cu, W, Mo, Au, Pt, Ag, Ti, Ni, Ta, Re, Cr, Zr, Hf, Y, Bi, Sr, Tl, Pb, Ca, Sn, Ge, and etc.) and compounds thereof, semiconductive material (Si, Ge, GaAs, InSb, InAs, InSe, etc.), silicide materials ($WSi_2$, $MoSi_2$, $TiSi_2$, $TaSi_2$, NiSi, $CoSi_2$, etc.) and dielectric materials (diamond, diamond-like-carbon (DLC), $BaTiO_3$, $LiNbO_3$, etc.). The sacrificial film 213 is etched at a later process. It is therefore necessary to have a sufficient etching selection ratio of the sacrificial film 213 to the electron emitting material layer 213 by selecting a proper combination of both materials.

Figure 14E:
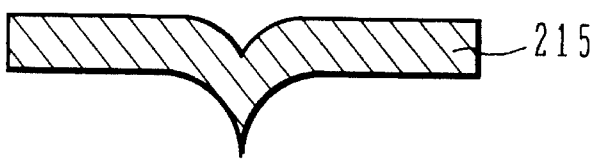

Lastly, unnecessary regions under the emitter are removed by wet etching or dry etching. For example, as shown in FIG. 14E, all the substrate 210, low melting point material layer 211, and sacrificial film 213 are removed to expose the emitter having a sharp tip.

Figure 16A:
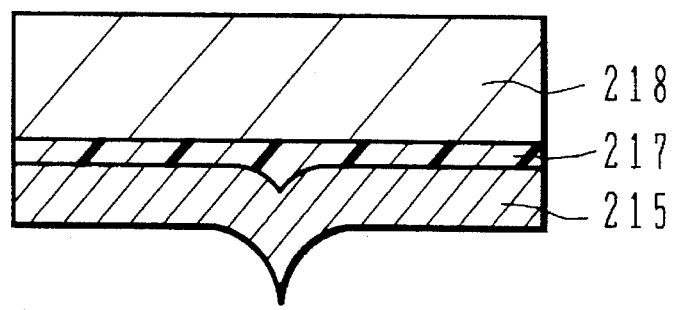
FIGS. 16A and 16B are cross sectional views showing modifications of the embodiment of FIGS. 14A to 14E.
Figure 16B:
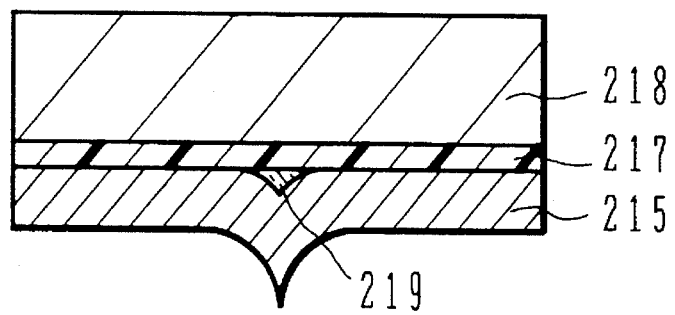

In the embodiment shown in FIGS. 14A to 14E, in order to give the electron emitting material layer 215 a sufficient mechanical strength, it is preferable to bond a support substrate 218 to the electron emitting material layer 215 as shown in FIG. 16A, by using adhesive 217 (or by anode bonding or the like), prior to etching and removing unnecessary regions. As shown in FIG. 16B, it is effective to planarize the electron emitting material layer 215 by forming thereon a planarizing film 219 such as SOG. More preferably, the surface of the electron emitting material layer 215 is polished and planarized by chemical mechanical polishing (CMP), or etched back and planarized.

Figure 17A:
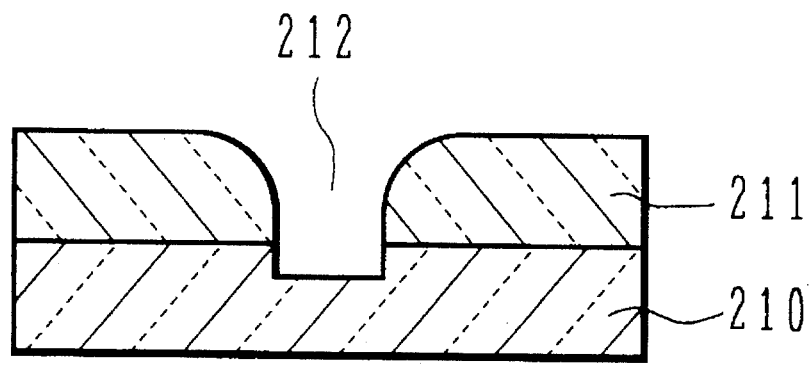
FIGS. 17A and 17B are cross sectional views showing other modifications of the embodiment of FIGS. 14A to 14E.

After the process of FIG. 14B, as shown in FIG. 17A, by using the low melting point material layer 211 as a mask, the underlying substrate 210 may be etched to deepen the recess 212. In this manner, the depth of the vertical side wall of the recess 212 can be adjusted, and the shape of the cusp 214 reflecting the surface of the sacrificial film 213 can be finely adjusted.

In this embodiment, the upper side wall of the recess is smoothly curved by reflow and the sacrificial film is deposited thereon to form an emitter electrode mold. An excellent vertical type cold cathode emitter can be fabricated with good manufacture yield, having an emitter tip with a small radius of curvature and a small apex angle.

Figure 17B:
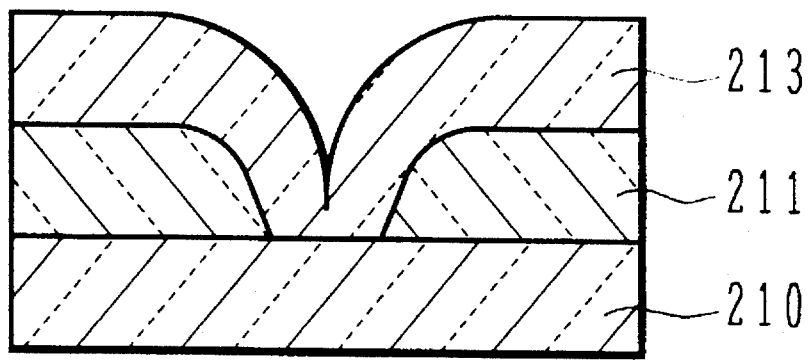

In this embodiment, the sacrificial film 213 shown in FIG. 14C may be deposited by a non-conformal film deposition method having poor step coverage such as sputtering. The structure obtained by this method is shown in FIG. 17B. This method facilitates the formation of an emitter mold having a cusp with a smaller apex angle and a smaller radius of curvature, although the position control in the vertical direction is difficult.

In the embodiment, a silicon oxide film is used as the sacrificial film. Other insulating films such as a silicon nitride film, semiconductor films such as an amorphous silicon film and a polysilicon film, and conductive material films such as Ti, Mo, Al, TiN, TiW, and WSi, may also be used.

In the embodiment shown in FIGS. 14A to 14E, the recess 212 with the vertical side wall is formed in the low temperature melting point material layer 211 by a single step of anisotropic etching. While a proper curve is formed on the upper side wall of the recess 212 by the reflow process, the lower portion of the low melting point material layer 211 may be fluidized and the slope of the lower side wall of the recess 212 may be made too gentle or the diameter of the bottom of the recess 212 may become too small. One of the methods for eliminating this phenomenon is to form the low melting point material layer 211 so as to have a lower melting point at the upper portion than at the lower portion, as described above. Another method is to form the recess 212 at two steps of anisotropic etching. If an aspect ratio is large and the low temperature melting point layer is thick, the cross section of the recess side wall is swelled at its middle portion. The method of forming the recess at two steps is effective for this case.

Figure 18A:
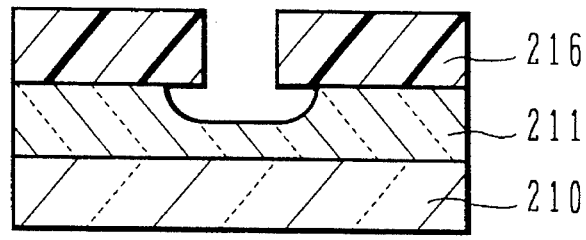
FIGS. 18A to 18E are cross sectional views illustrating processes of manufacturing an emitter according to another embodiment of the invention.
Figure 18B:
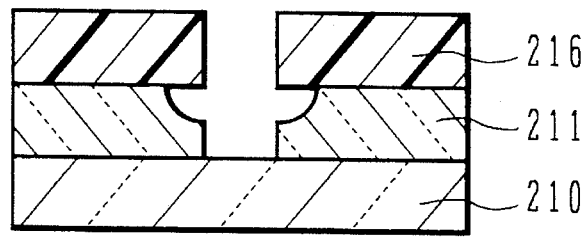

FIGS. 18A to 18D illustrate processes of a manufacturing method by which the recess 212 is formed by two steps, according to another embodiment of the invention. Like elements to those shown in FIGS. 14A to 14E are represented by identical reference numerals, and the detailed description thereof is omitted. As shown in FIG. 18A, a resist mask 216 is deposited through lithography on the substrate formed with a low melting point material layer 211. Thereafter, the low melting point material layer 211 is partially etched by isotropic etching. The recess in the low melting point material layer 211 is side-etched and extends also in the lateral direction. Next, as shown in FIG. 18B, the remaining low melting point material layer 211 is etched by anisotropic etching to expose the surface of the substrate 210.

Figure 18C:
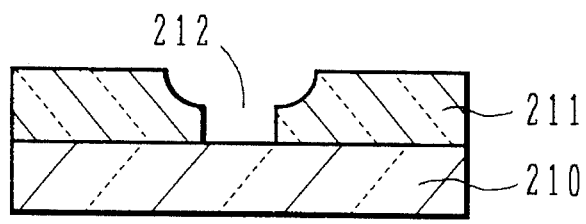
Figure 18D:
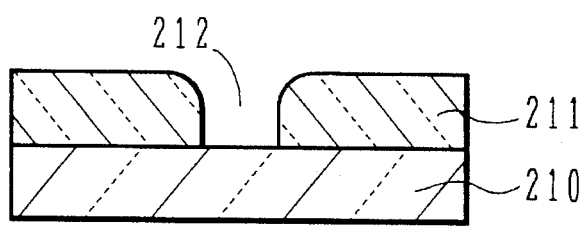

As shown in FIG. 18C, after the removal of the resist mask 216, the recess 212 is exposed which has a broadened upper recess and a lower recess with a vertical side wall. Then, the substrate 210 is heated to reflow the low melting point material layer 211. As shown in FIG. 18D, the obtained recess 212 has an upper recess with a gentle taper in the transitional region and a lower recess with a generally vertical side wall.

Figure 18E:
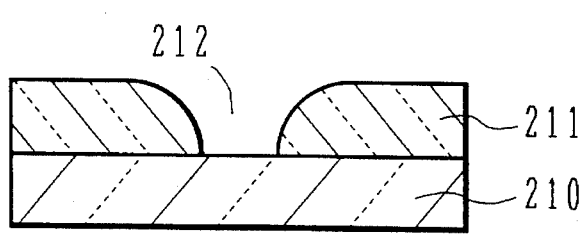

Further reflow processing causes the low melting point material layer 211 to be reflowed to enlarge the taper portion as shown in FIG. 18E. Thereafter, similar to the previous embodiment, a sacrificial film and an electron emitting material layer are deposited, and unnecessary regions are etched and removed to form an emitter having a sharp tip.

FIGS. 19A to 19D illustrates other manufacturing processes according to another embodiment of the invention. Like elements to those shown in FIGS. 14A to 14E and 18A to 18D are represented by using identical reference numerals. Although in the previous embodiments the low melting point material film is formed by a film deposition method, in this embodiment a substrate 210 from the surface thereof to a desired depth is denatured into a low melting point material layer 211. For example, a insulator body such as silicon oxide is used, and impurity ions such as phosphorus or boron ions are thermally diffused or implanted into the substrate 210 to form an impurity doped layer of a high impurity concentration. This impurity doped layer is used as the low melting point material layer 211.

Figure 19A:
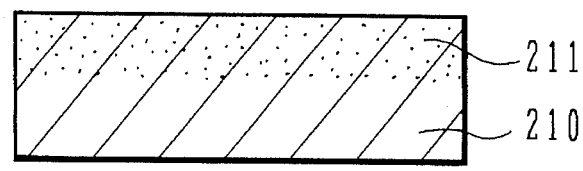
FIGS. 19A to 19E are cross sectional views illustrating processes of manufacturing an emitter according to another embodiment of the invention.
Figure 19B:
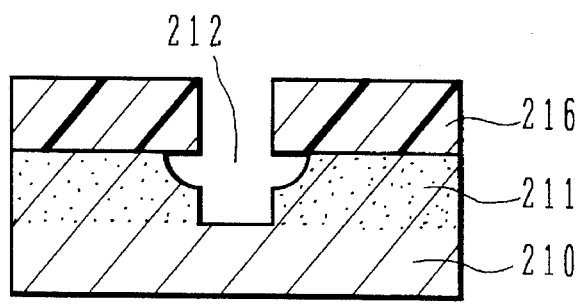
Figure 19C:
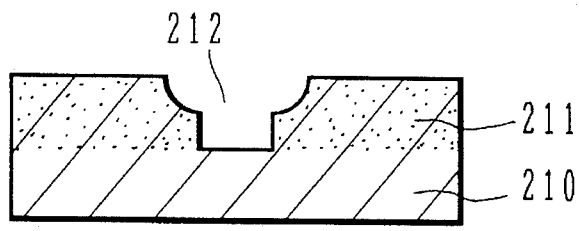
Figure 19D:
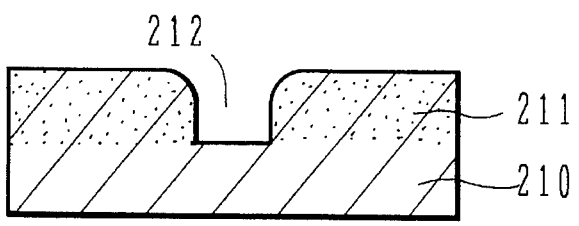

Thereafter, as shown in FIG. 19B, a resist mask 216 is deposited and a recess 212 is formed at two steps of isotropic and anisotropic etching similar to the previous embodiment. Next, as shown in FIG. 19C, the resist mask 216 is removed. As shown in FIG. 19D, the substrate 210 is heated to reflow the low melting point material layer 211 to form a tapered hole.

Figure 19E:
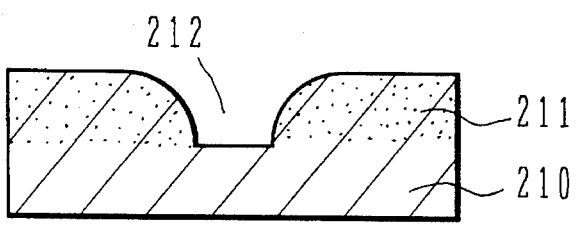

Further reflow processing causes the low melting point material layer 211 to be reflowed to expand the taper portion as shown in FIG. 19E. The succeeding processes are similar to those of FIGS. 14A to 14E.

The above embodiments have been described for the case of a single emitter. If a plurality of such emitters are formed in an array, an electron source (electron gun) called a field emitter array (FEA) can be formed which is applied to various vacuum microelectronics.

An electron source of this type is generally used in combination with gate electrodes. In the following embodiments, gate electrodes are formed in self-alignment with emitters.

Figure 20A:
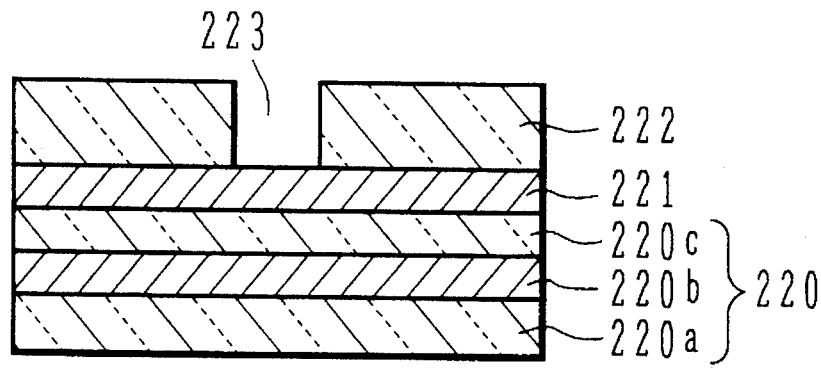
FIGS. 20A to 20F are cross sectional views illustrating processes of manufacturing an electric field emission type device according to another embodiment of the invention.

FIGS. 20A to 20F illustrate processes of manufacturing a triode device with an anode electrode, an emitter electrode, and a gate electrode according to another embodiment of the invention similar to the embodiment of FIGS. 14A to 14E. This embodiment uses an insulating layer as the underlying layer of an insulating emitter mold film. As shown in FIG. 20A, a substrate 220 is a laminate substrate having an insulator body 220a on which a conductive film 220b as an anode electrode and an insulating film 220c are formed. For example, the insulator body 220a is made of silicon oxide or glass such as soda lime, the anode electrode layer 220b is made of polysilicon, and the insulating film 220c is made of silicon oxide.

On the substrate 220, a laminate film as a first conductive film 221 is deposited, the laminate film being constituted by a polysilicon film and a W silicide film, and the first conductive film 221 serving as the gate electrode. Thereafter, a first insulating film 222 is deposited. The first insulating film 222 is a low melting point material layer such as PSG and BPSG. Next, a recess 223 is formed in the first insulating film 222 by anisotropic dry etching such as RIE, the recess 223 having a vertical side wall reaching the first conductive film 221.

Figure 20B:
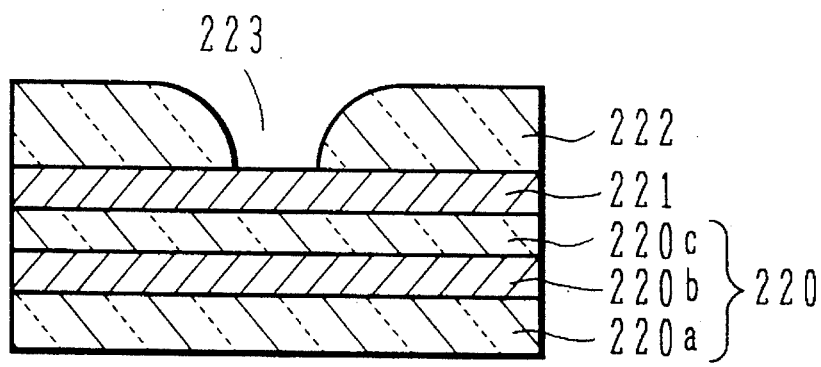
Figure 20C:
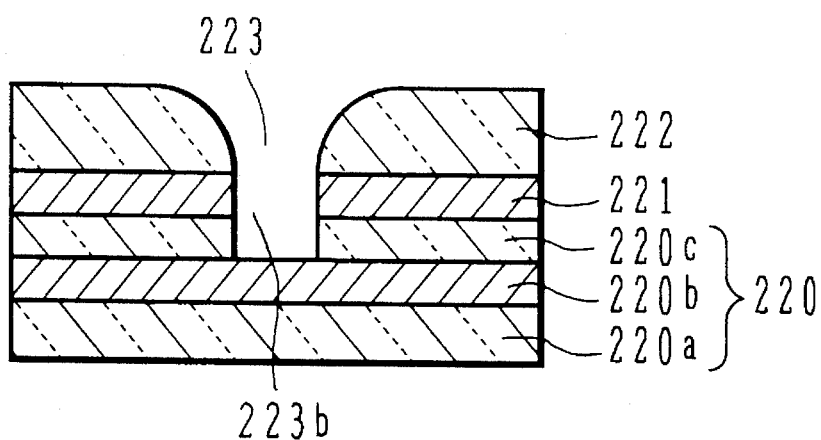

It is effective for the formation of the recess 223 to perform two-step etching described in connection with the embodiment shown in FIGS. 18A to 18D. Next, as shown in FIG. 20B, the first insulating film 222 with the recess 223 is heated and reflowed to form a gentle taper in the transitional region of the recess 223. Next, as shown in FIG. 20C, by using the first insulating film 222 as a mask, the first conductive film 221 exposed in the recess 223 is selectively etched by dry etching to pattern a gate electrode. A recess 223b having the same diameter as the initial recess 223 is therefore formed. In this embodiment, the insulating film 220c in the substrate 220 under the gate electrode 221 is also etched.

Unless the insulating film 220c is selectively etched with respect to the first insulating film 222, an initial thickness of the first insulating film 222 in the state of FIG. 20A is set to the thickness including etched amount during the etching of the insulating film 220c. Although etching process of the insulating film 220c by reactive ion etching (RIE) is shown in FIG. 20C, the first insulating film 220c may be etched by isotropic etching such as a wet etching method, or the like. It may be possible to cause the first insulating film 222 to reflow after consecutive etching of the first insulating film 222, the first conductive film 221 and the insulating film 220c. If the height of the vertical wall is set to about a half or more of the diameter of the recess 223b, the position of a cusp can be easily controlled and a sharp edge of the cusp can be easily obtained. The gentle taper in the transitional region of the recess 223 and the recess 223b are collectively served as a tapered recess. In this embodiment, a laminated structure of the substrate 220, the first conductive film 221 and the first insulating film 222, is served as a base having the tapered recess for a sacrificial layer to be formed afterwards.

For the etching of the insulating film 220c, etching gas different from that used for etching the first conductive film 221 is used. If different materials are used for the insulating film 220c and first insulating film 222, it is possible to select the etching conditions which give a sufficiently large etching selection ratio of the insulating film 220c to the first insulating film 222. The insulating film 220c can be therefore etched without etching the first insulating film 222.

Figure 20D:
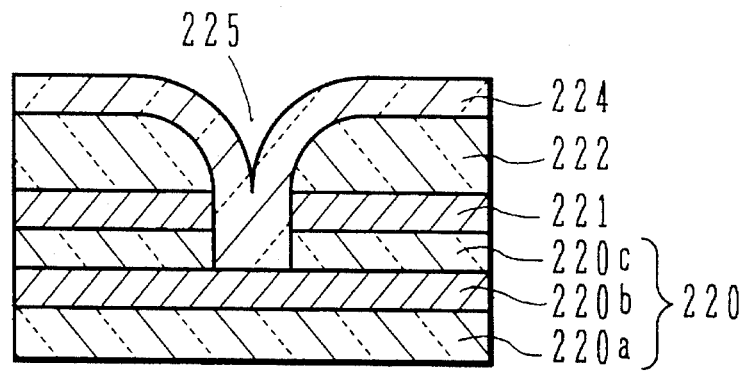

Next, as shown in FIG. 20D, a second insulating film 224 is deposited. This second insulating film 224 such as a silicon oxide film corresponds to the sacrificial film 213 of the previous embodiment. Therefore, by depositing this film 224 under the same conditions as the previous embodiment, a cusp 225 having a sharp edge is formed on the surface of the insulating film 224 like the previous embodiment. This insulating film 224 becomes the emitter mold.

Figure 20E:
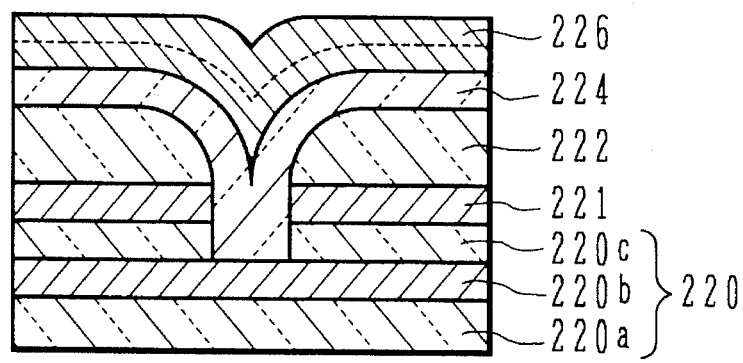

Next, as shown in FIG. 20E, a second conductive film 226 (an electron emitting layer) serving as an emitter electrode is deposited on the insulating film 224. The second conductive film 226 may be a laminate of a TiN film formed by sputtering or CVD and a W film formed by CVD.

Figure 20F:
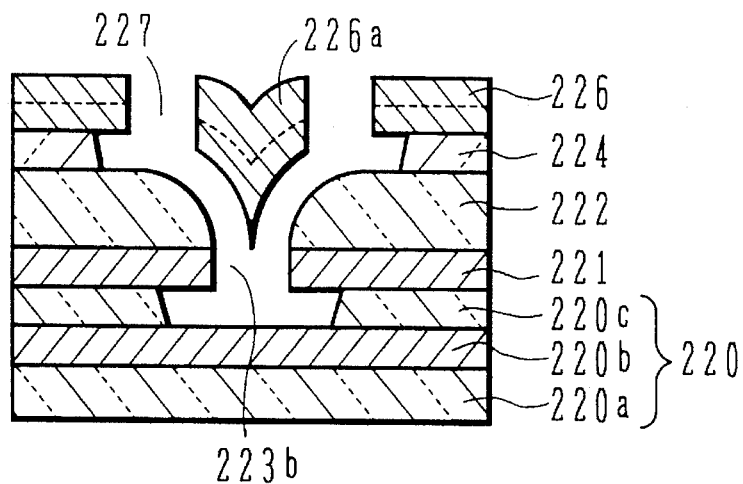

Next, as shown in FIG. 20F, the second conductive film 226 is selectively etched to form slit openings 227 on the opposite sides of a portion which functions as a emitter 226a. Through these slit openings 227, the second insulating film 224 used as the emitter mold is wet-etched until the end face of the gate electrode 221 and the anode electrode 220b are exposed. A space is therefore formed after the removal of unnecessary regions under the emitter 226a to the anode electrode 220b. By selecting the etching conditions which give a large etching selection ratio to the first insulating film 222, the second insulating film 224 under the emitter is etched and also the insulating film 220c on the anode electrode is laterally etched to retract it properly, without etching the first insulating film 222.

In the case that silicon nitride is used for the insulating film 220c and the second insulating film 224, and further PSG or BPSG is used for the first insulating film 222, phosphoric acid heated up to a temperature in a range of 100°–150° C. (heated phosphoric acid) can be used.

Also, since the first conductive film (gate electrode) 221 is protected by the first insulating film 222, electric short-circuit or current leak in the emitter 226a and the gate electrode can be prevented, which may otherwise be caused by particle or the like, and yield improvement can be expected.

Figure 21:
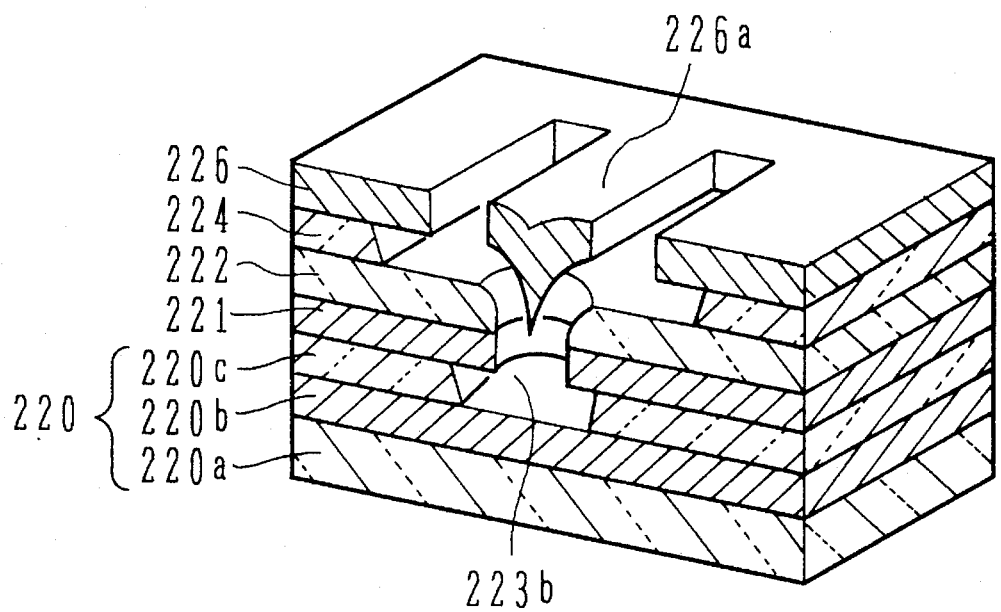
FIG. 21 is a perspective view showing the structure of an electric field emission type device manufactured by the embodiment shown in FIGS. 20A to 20F.

FIG. 21 is a perspective view of the device shown in FIG. 20F. The triode element formed in the above manner is vacuum sealed to form a fine triode.

In this embodiment, an electric field emission type device having a high performance cathode emitter self-aligned with the gate electrode can be obtained. The diameter of the opening 223b of the gate electrode 221 surrounding the emitter tip is defined by the diameter of the lower portion of the recess 223 formed by the reflow. Therefore, if the diameter of the bottom of the recess 223 is reduced by the reflow smaller than the diameter of the initially formed recess 223, a distance between the gate electrode 221 and the tip of the emitter 226a can be shortened. Electrons can be therefore emitted efficiently even at a lower control voltage applied to the gate electrode 221.

In the above embodiment, other materials of the anode electrode 220b may be amorphous silicon, W silicide, Mo silicide, W, Mo, Ta, Ti, Cr, and etc. Other materials of the first conductive film 221 serving as the gate electrode may be polysilicon, amorphous silicon, W silicide, Mo silicide, W, Mo, Ta, Ti, Cr, and etc. Other materials of the second conductive film 226 serving as the emitter electrode may be those materials described in connection with the previous embodiment. As the material of the second insulating film 224 and insulating film 220c of the substrate 220, a silicon nitride film, a laminate of a silicon nitride film and a silicon oxide film, or the like may be used.

Figure 22:
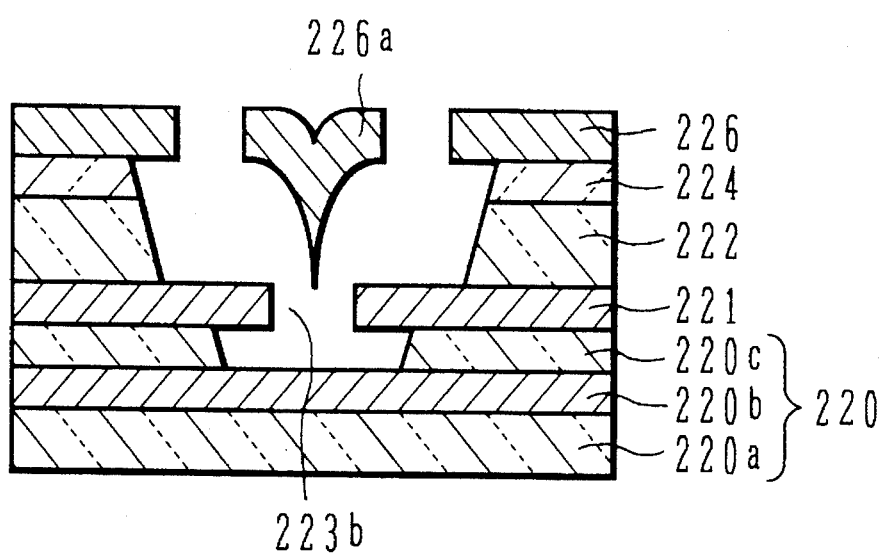
FIG. 22 is a cross sectional view showing the structure of an electric field emission type device according to another embodiment.

At the etching process for the insulating films 224 and 220c shown in FIG. 20F, the etching conditions may select a small etching selection ratio of the insulating film 222 to the insulating films 224 and 220c. The structure obtained by this method has also the insulating film 222 retracted as shown in FIG. 22.

Figure 23A:
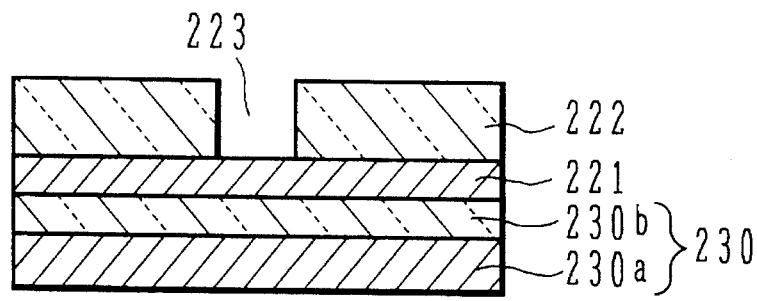
FIGS. 23A to 23G are cross sectional views illustrating processes of manufacturing an electric field emission type device according to another embodiment of the invention.
Figure 23B:
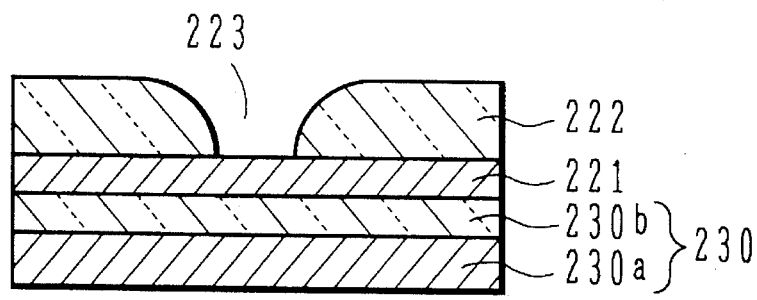
Figure 23C:
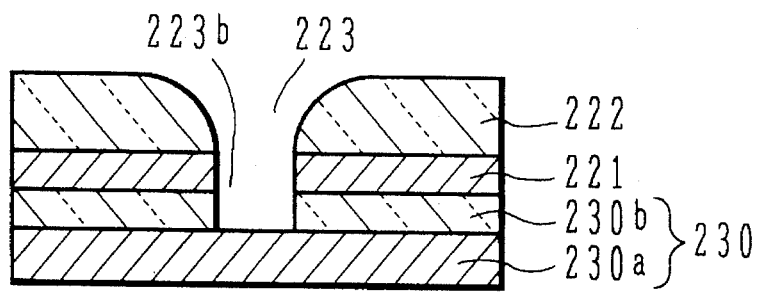

FIGS. 23A to 23G illustrate manufacturing processes according to another embodiment. Like elements to those of the embodiment shown in FIGS. 20A to 20F are represented by using identical reference numerals, and the detailed description thereof is omitted. In this embodiment, as shown in FIG. 23A, a starting substrate 230 is a laminate substrate having a conductive body 230a and an insulating film 230b formed thereon. Similar to the previous embodiment, on this substrate 230, a first conductive film 221 and a first insulating film 222 are deposited and a recess 223 is formed by dry etching. As shown in FIG. 23B, a gentle taper is formed on the upper side wall of the recess 223 by the reflow process. As shown in FIG. 23C, by using the first insulating film 222 as a mask, the first conductive film 221 exposed in the recess 223 is selectively etched by dry etching to pattern a gate electrode. The insulating film 230b is also etched.

As similar to the previous embodiment, a laminated structure of the substrate 230, the first conductive film 221 and the first insulating film 222, is served as a base having the tapered recess for a sacrificial layer to be formed afterwards.

Unless the insulating film 230b is selectively etched with respect to the first insulating film 222, an initial thickness of the first insulating film 222 in the state of FIG. 23A is set to the thickness including etched amount during the etching of the insulating film 230b. Although etching process of the insulating film 230b by reactive ion etching (RIE) is shown in FIG. 23C, the first insulating film 230b may be etched by isotropic etching such as a wet etching method, or the like. It may be possible to cause the first insulating film 222 to reflow after consecutive etching of the first insulating film 222, the first conductive film 221 and the insulating film 230b.

Figure 23D:
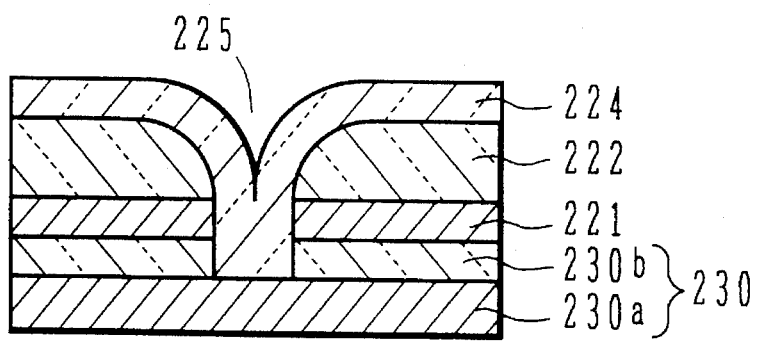
Figure 23E:
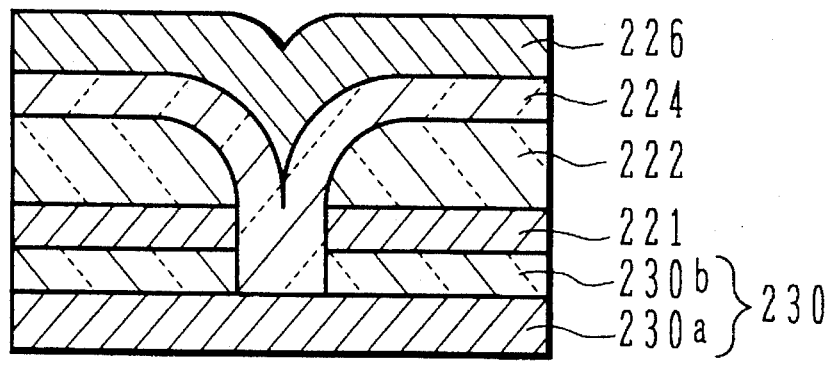
Figure 23F:
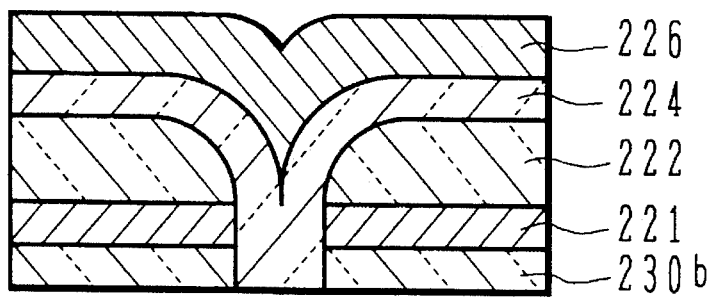
Figure 23G:
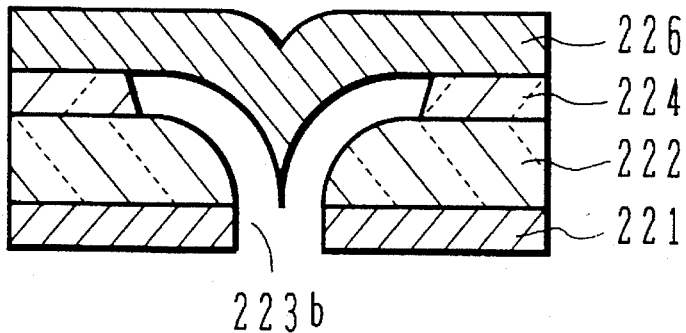

Next, as shown in FIG. 23D, a second insulating film 224 (a sacrificial layer) is deposited. Then, as shown in FIG. 23E, a second conductive film 226 (an electron emitting layer) serving as an emitter electrode is deposited on the insulating film 224. Thereafter, as shown in FIG. 23F, the conductive body 230a of the substrate 230 is etched and removed. Then, the exposed insulating film 230b and the second insulating film 224 used as the emitter mold are etched to expose the tip of the emitter and the end face of the gate electrode as shown in FIG. 23G. Also in this case, the etching conditions are selected so as to give a large etching selection ratio of the insulating film 230b and second insulating film 224 to the first insulating film 222. The second insulating film 224 is therefore laterally etched to retract it properly and exposer the tip of the emitter electrode.

Since the gate electrode 221 is protected by the insulating film 222, electric short-circuit or current leak in the emitter (the second conductive film) 226 or the gate electrode (the first conductive film) 221, which may otherwise be caused by particle or the like, and the yield can be improved.

Figure 24:
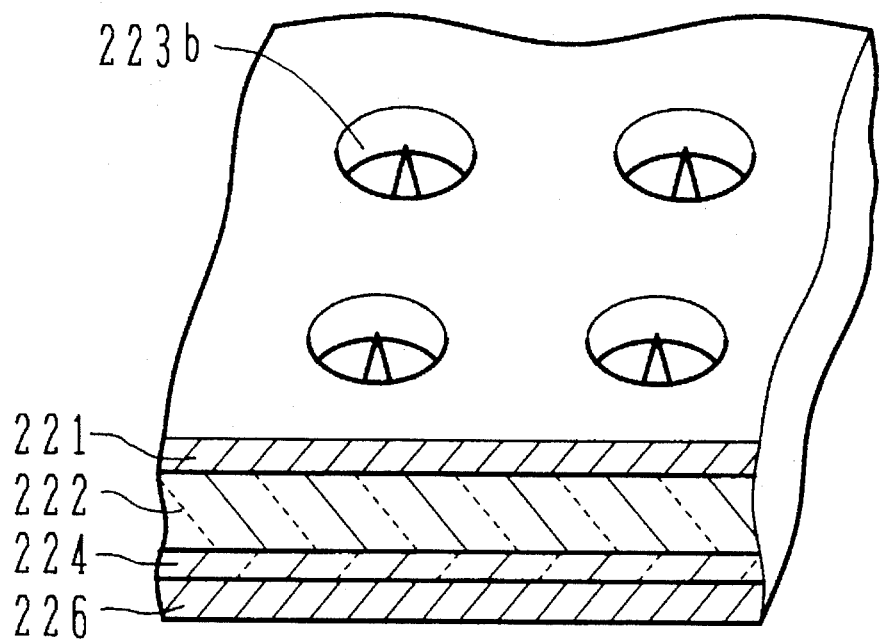
FIG. 24 is a perspective view showing the structure of an electric field emission type device manufactured by the embodiment shown in FIGS. 23A to 23G.

FIG. 24 is a perspective view of an FEA formed by the embodiment of FIGS. 23A to 23G. The tip of the emitter is exposed at the center of the opening 223b of the gate electrode 221. For example, this FEA is faced with an anode having a fluorescent member and vacuum-sealed to obtain a flat panel display.

Figure 25:
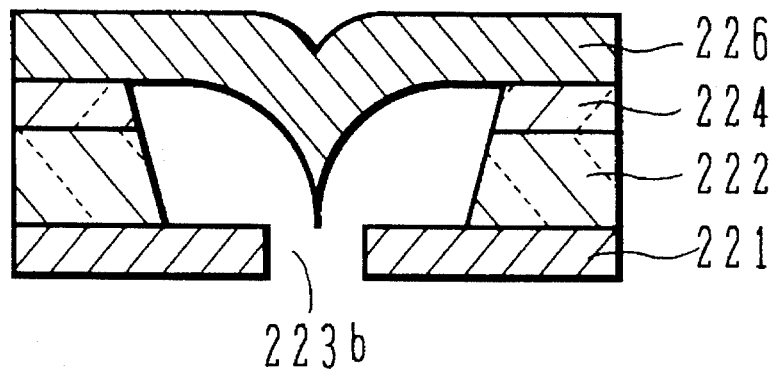
FIG. 25 is a cross sectional view showing the structure of an electric field emission type device according to another embodiment of the invention.

If at the etching process of FIG. 23G the etching conditions are selected so as to make the etching rates of the first and second insulating films 222 and 224 are equal to each other, the first insulating film 222 is also retracted as shown in FIG. 25.

Figure 26A:
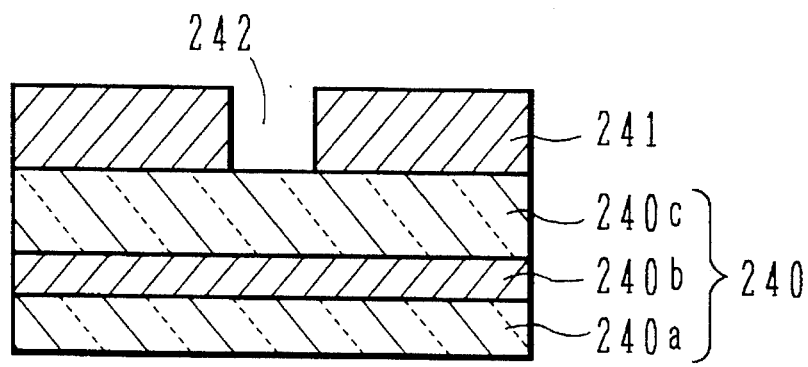
FIGS. 26A to 26F are cross sectional views illustrating processes of manufacturing an electric field emission type device according to another embodiment of the invention.

FIGS. 26A to 26F illustrate processes of manufacturing a triode device with an anode electrode, an emitter electrode, and a gate electrode according to another embodiment of the invention. This embodiment uses a low melting point conductive layer serving as a gate electrode, as the underlying layer of an insulating emitter mold film. As shown in FIG. 26A, a starting substrate 240 is a laminate substrate having a conductive film 240b serving as an anode electrode and an insulating film 240c formed on an insulating body 240a. On this substrate 240, a first conductive film 241 is deposited, the first conductive film 241 being used as the underlying film of the emitter mold and serving as the gate electrode.

The material of the first conductive film 241 may be metal such as Pb, Zn, Al, Au, Cu, Li, and In, or low melting point material made of semiconductor such as polysilicon or amorphous silicon doped with impurities to a high concentration. The first conductive film 241 is etched by RIE or other processes to form a recess 242 reaching the substrate and having a vertical side wall.

Figure 26B:
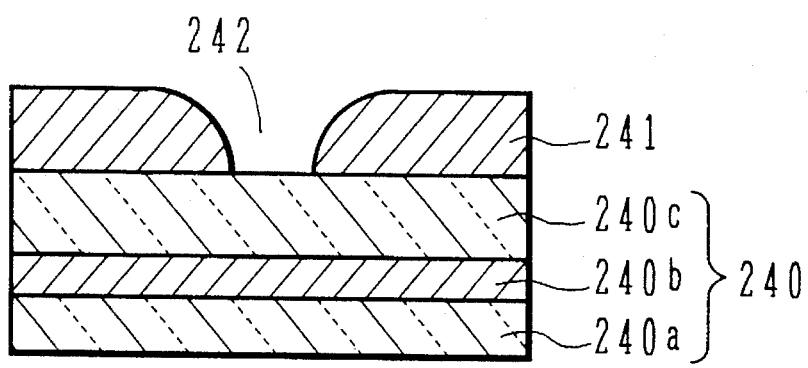
Figure 26C:
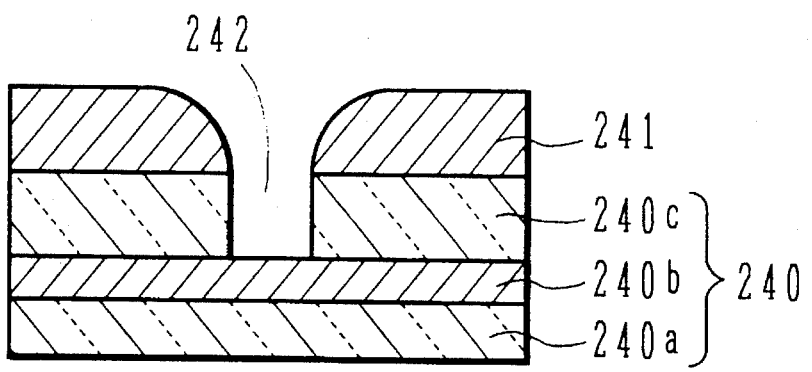

Also in this embodiment, it is effective to perform two-step etching as shown in FIGS. 18A to 18C for the formation of the recess. Next, as shown in FIG. 26B, the first conductive film 241 is heated and reflowed to form a gentle taper on the upper side wall of the recess 242. Next, as shown in FIG. 26C, by using the first conductive film 241 as a mask, the insulating film 240c of the substrate 240 is etched to expose the conductive film 240b.

As a result, a tapered recess is formed. As similar to the previous embodiments, a laminated structure of the substrate 240 and the first conductive layer 241, is served as a base having the tapered recess for a sacrificial layer to be formed afterwards.

It may be possible that the first conductive film 241 is caused to reflow after anisotropic etching of the first conductive film 241 and the insulating film 240e.

Figure 26D:
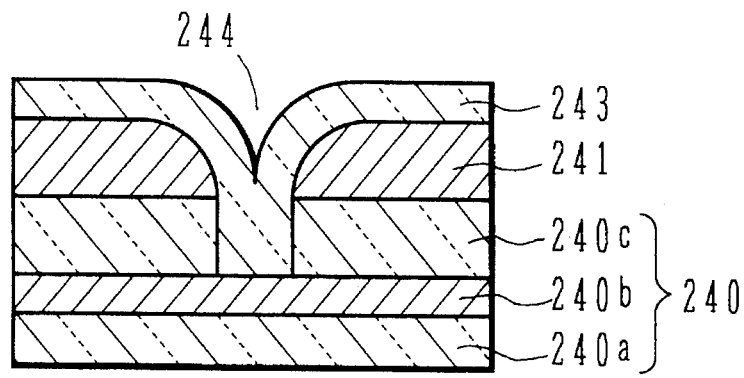

Next, as shown in FIG. 26D, an insulating film 243 (a sacrificial layer) serving as an emitter mold is deposited by a film deposition method having good step coverage. By properly selecting the thickness of this insulating film 243, a cusp 244 having a sharp edge is formed on the surface thereof like the previous embodiment.

Figure 26E:
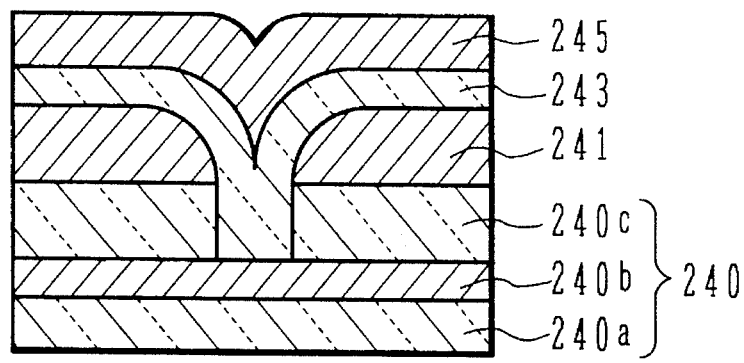

Next, as shown in FIG. 26E, a second conductive film 245 (an electron emitting layer) serving as the emitter electrode is deposited.

Figure 26F:
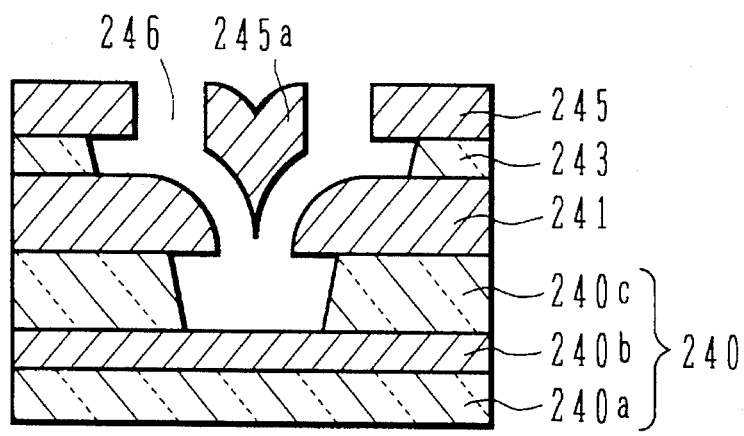

Thereafter, as shown in FIG. 26F, the second conductive film 245 is selectively etched to form slit openings 246 on the opposite sides of a portion which functions as a real emitter 245a. Through these slit openings 246, the insulating film 243 used as the emitter mold and the insulating film 240c of the substrate 240 are etched to expose the tip of the emitter electrode, the end face of the gate electrode, and the anode electrode.

Also in this embodiment, a triode having a high performance emitter can be formed. Particularly in this embodiment, since the underlying layer of the emitter mold is formed by the conductive film 241 and this film is used as the gate electrode, the distance between the emitter tip and the gate can be very short. Therefore, a large electric field can be generated near at the emitter tip at a much lower gate voltage. As compared to the embodiment of FIGS. 20A to 20F, at the insulating film etching process of FIG. 26F, a large etching ratio of the insulating film can be obtained easily because only the conductive films of emitter and gate electrode are required to be considered.

In this embodiment, although the first conductive film 241 made of low melting point material is a single layer, it may be a laminate made of materials having different melting points. For example, a laminate may be constituted by a low melting point metal layer and a high impurity concentration amorphous silicon layer formed on the metal layer. In this case, if only the upper half of the first conductive film 241 having such a laminate structure is liquidized by the thermal reflow process, a vertical side wall having a certain height and a taper surface in the transitional region become easy to be formed. Therefore, the shape of the underlying layer of the emitter mold suitable for forming a sharp edge of the cusp is likely to be obtained.

Figure 27A:
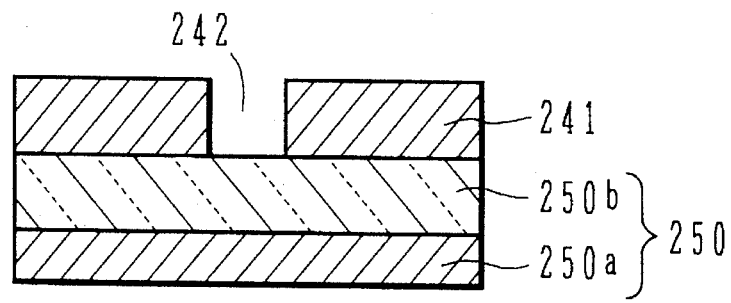
FIGS. 27A to 27G are cross sectional views illustrating processes of manufacturing an electric field emission type device according to another embodiment of the invention.
Figure 27B:
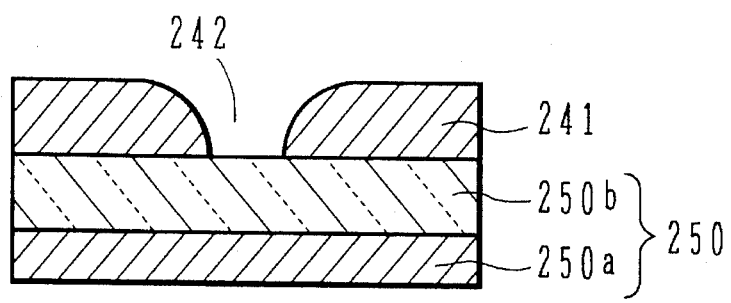

FIGS. 27A to 27G illustrate manufacturing processes according to another embodiment of the invention. Like elements to those of the embodiment shown in FIGS. 26A to 26F are represented by using identical reference numerals, and the detailed description thereof is omitted. In this embodiment, as shown in FIG. 27A, a starting substrate 250 is a laminate substrate having a conductive body 250a and an insulating film 250b formed thereon. Similar to the previous embodiment, on this substrate 250, a first conductive film 241 made of low melting point material and serving as a gate electrode is deposited and etched to form a recess 242. As shown in FIG. 27B, a gentle taper is formed on the upper side wall of the recess 242 by heating and reflowing the first conductive film 241.

Figure 27C:
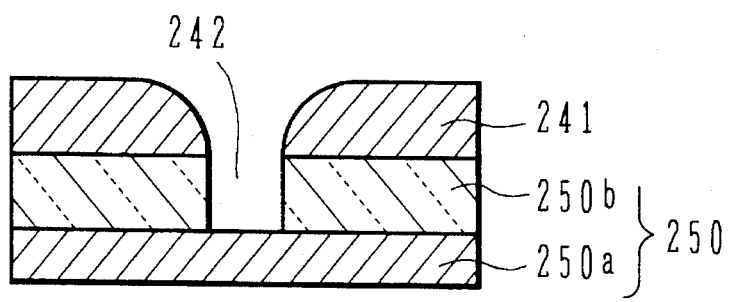
Figure 27D:
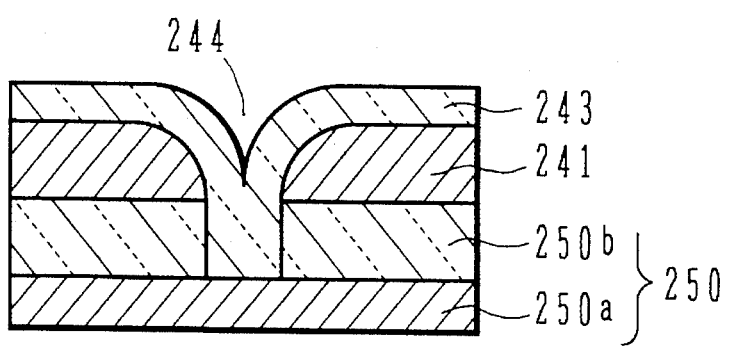
Figure 27E:
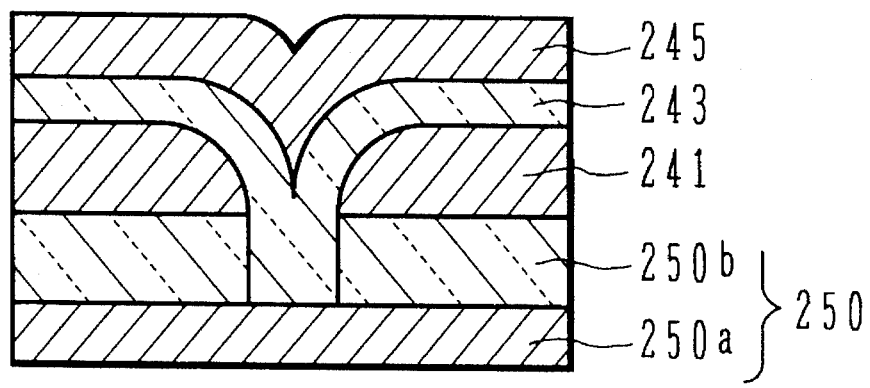
Figure 27F:
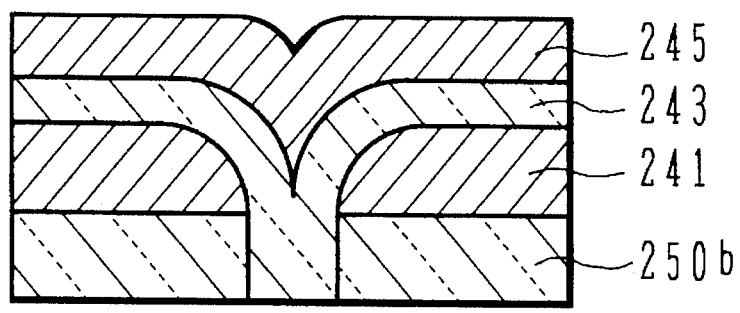

As shown in FIG. 27C, by using the first conductive film 241 as a mask, the insulating film 250b of the substrate 250 is etched to form a deeper tapered recess 242. Next, as shown in FIG. 27D, an insulating film 243 (a sacrificial layer) is deposited under the same conditions as the previous embodiment. Therefore, as shown in FIG. 27D, a sharp cusp 244 reflecting the topology of the underlying layer is formed on the surface of the insulating film 243. Succeedingly, as shown in FIG. 27E, a second conductive film 245 (an electron emitting layer) serving as an emitter electrode is deposited. Thereafter, as shown in FIG. 27F, the conductive body 250a of the substrate 250 is etched and removed.

Figure 27G:
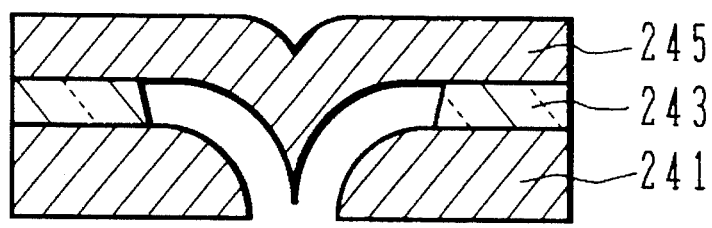

Lastly, as shown in FIG. 27G, the insulating film 243 is etched to expose the emitter electrode. At this time, the insulating film 250b of the substrate 250 is also etched and removed to expose the gate electrode. Only the emitter electrode and the side surface of the gate electrode may be exposed without exposing the bottom surface of the gate electrode. To this end, the insulating films 243 and 250b are made of different materials and the etching conditions are selected which allow only the insulating film 243 to be etched.

An FEA similar to that shown in FIG. 24 can be fabricated in the above manner. Also in this embodiment, an FEA can be realized which has a fine and high performance emitter and a gate electrode self-aligned with the emitter tip at a very small gap therebetween.

Figure 28:
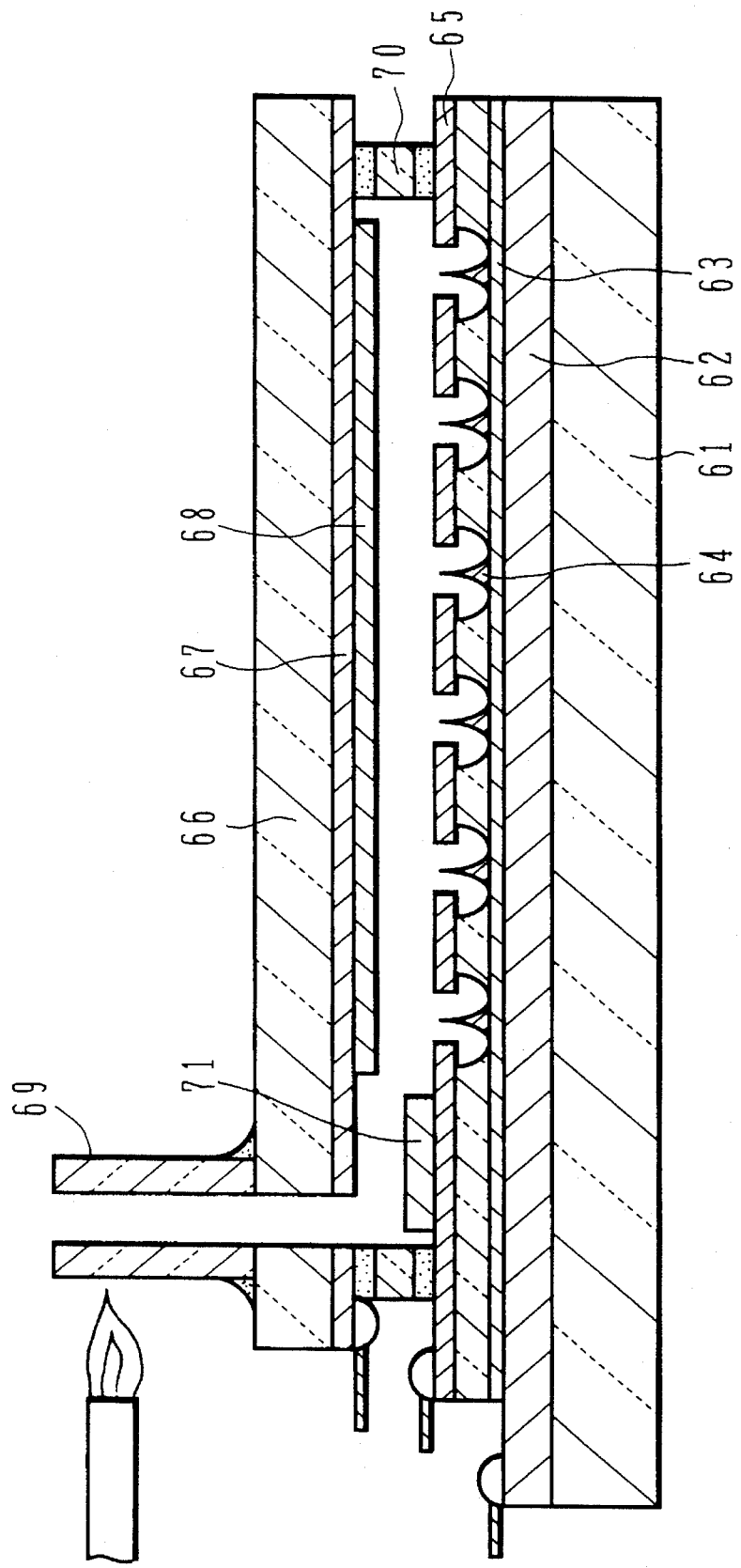
FIG. 28 is a cross sectional view showing an example of an electric field emission type device applied to a display unit.

FIG. 28 shows a flat panel display which is one of application examples of the electric field emission type device formed by the embodiment methods of this invention. An electron emission source is formed by the embodiment methods of the invention. On an insulating substrate 61, a conductive film 62 of Al or Cu and a resistor film 63 such as a polysilicon film are formed. On the resistor film 63, fine emitters 64 are formed and disposed in the openings of gate electrodes 65.

An opposing substrate is disposed facing the electron emission source, the counter transparent substrate 66 being formed with a transparent conductive film 67 such as ITO serving as an anode electrode and a fluorescent film 68. The gate electrode 65, conductive film 62, resistor film 63, fluorescent film 68, and transparent conductive film 67 may be formed discretely in correspondence with each pixel, instead of forming them integrally. A getter material 71 such as Ti, Al, and Mg is mounted on the side of the electron emission source in order to prevent emitted gas from attaching the emitter surface.

The counter substrate is attached to the electron emission source by a spacer 70 coated with adhesive, for the separation of the transparent conductive film 67 serving as the anode electrode from the emitter 64 by about 0.1 to 5 mm. For example, glass of a low melting point is used as the adhesive. Instead of the glass spacer, adhesive such as epoxy resin containing dispersed glass beads may be used as the spacer.

The counter substrate has an exhaust pipe 69 connected thereto. After the counter substrate is adhered, the inside of the panel display is evacuated from this exhaust pipe 69 to about $10^{-5}$ to $10^{-9}$ Torr. The opening of the exhaust pipe is sealed by using a burner or other means. Thereafter, lead wires are connected to the anodes, emitters, and gates to complete the flat panel display.

Figure 29:
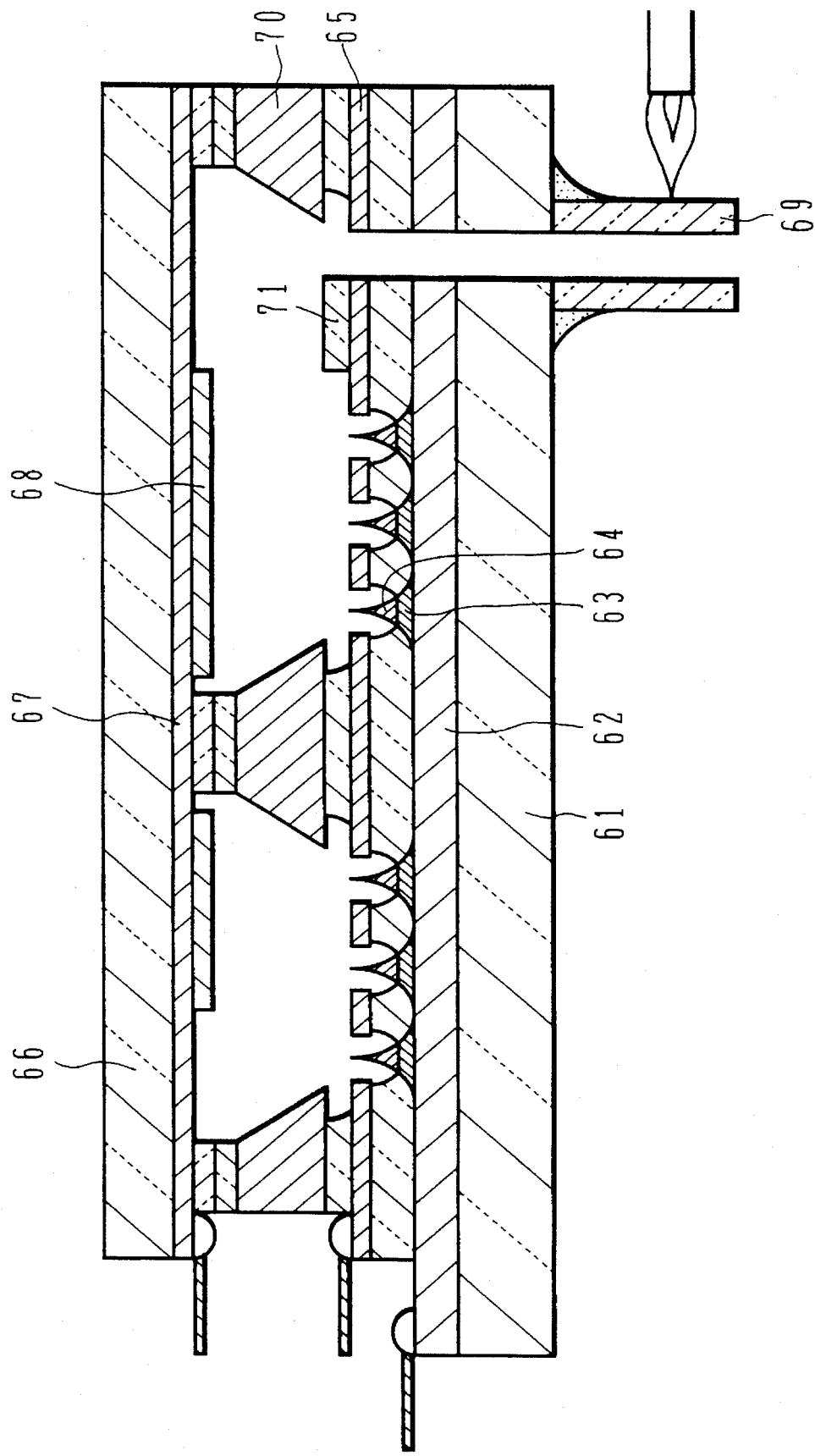
FIG. 29 is a cross sectional view showing another example of an electric field emission type device applied to a display unit.

FIG. 29 shows an example of the structure of another flat panel display. Like elements to those shown in FIG. 28 are represented by using identical reference numerals, and the detailed description thereof is omitted. In this embodiment, an exhaust pipe 69 is connected on the side of the electron emission source. A spacer 70 is made of a silicon substrate worked to have a proper dimension.

Figure 30:
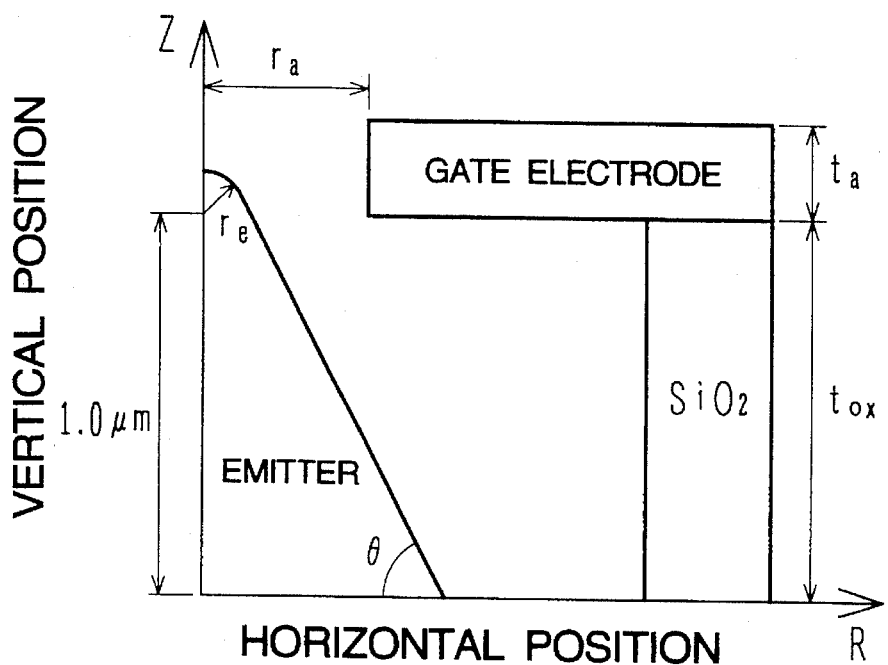
FIG. 30 is a diagram illustrating the conditions of simulation used for confirming the effectiveness of this invention.

Next, data indicating the effectiveness of this invention will be explained. Data regarding the relationship between the electric field emission characteristics and the emitter shape and the like will first be described. FIG. 30 shows parameters used for simulation. The emitter is a point type emitter with rotation symmetry about the Z axis. θ is an emitter taper angle, $r_e$ is a radius of curvature of the emitter tip, $r_a$ is a distance between the emitter and the gate electrode, $t_a$ is a thickness of the gate electrode, and $t_{ox}$ is a thickness of the oxide film. Each parameter, when not used as a variable, was set as θ=60°, $r_e$=10 nm, $r_a$=0.4 µm, $t_a$=0.4 µm, and $t_{ox}$=1 µm. The height of the emitter was fixed to 1 µm.

Figure 31:
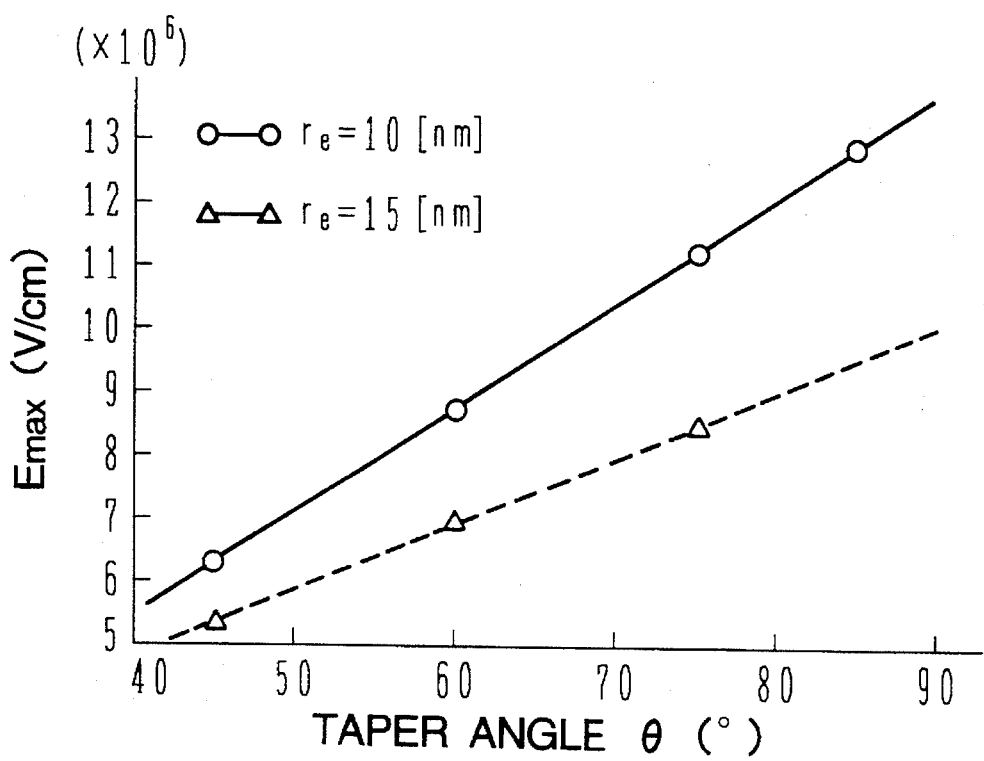
FIG. 31 is a graph showing the relationship between a maximum electric field intensity and a slope angle, obtained by simulation.

FIG. 31 shows the relationship between a taper angle θ and a maximum electric field intensity Emax obtained at the emitter tip, using the radius $r_e$ of curvature of the emitter tip as a parameter. The larger the taper angle θ i.e., the smaller the emitter apex angle, the larger the maximum electric field intensity Emax. The maximum electric field intensity Emax becomes larger by about 30% at $r_e$=10 nm than $r_e$=15 nm.

Figure 32:
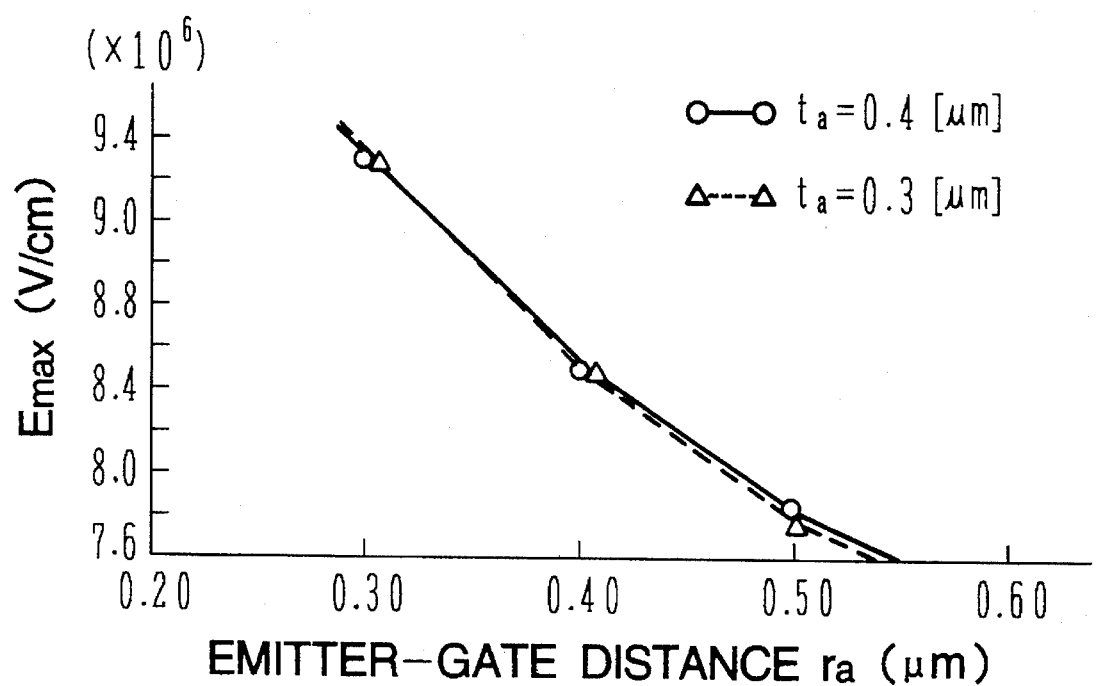
FIG. 32 is a graph showing the relationship between a maximum electric field intensity and an emitter-gate distance, obtained by simulation.

FIG. 32 shows the relationship between an emitter gate electrode distance $r_a$ and a maximum electric field intensity Emax, using the gate electrode thickness $t_a$ as a parameter. The shorter the emitter—gate electrode distance $r_a$, the larger the maximum electric field intensity Emax. There is almost no significant difference between the gate electrode thickness $t_a$=0.3 µm and $t_a$=0.4 µm.

It is understood from the simulation data shown in FIGS. 31 and 32 that preferably an emitter has a small apex angle and a sharp tip like a whisker.

Figure 33:
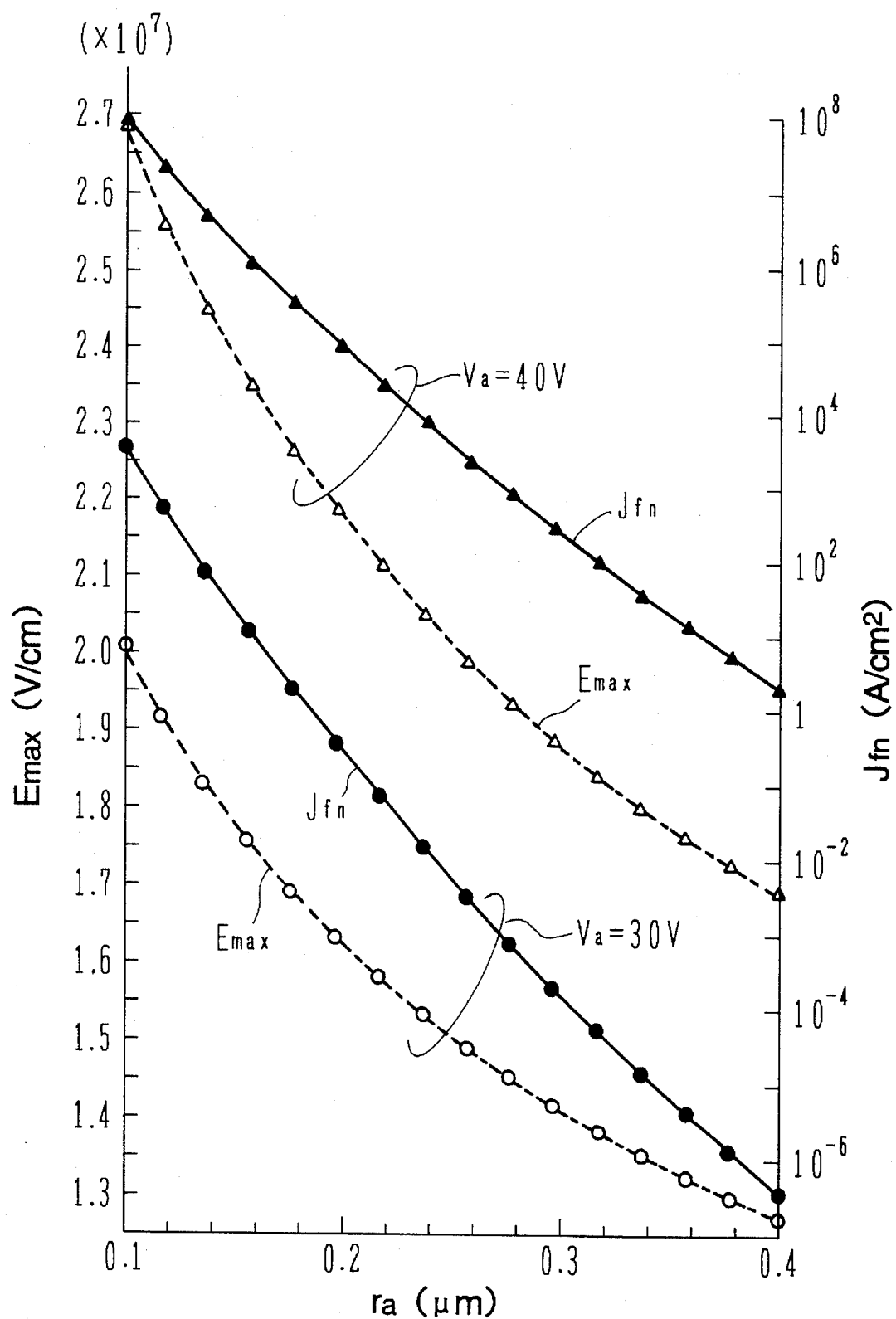
FIG. 33 is another graph showing the relationship between a maximum electric field intensity and an emitter-gate distance, obtained by simulation.
Figure 34A:
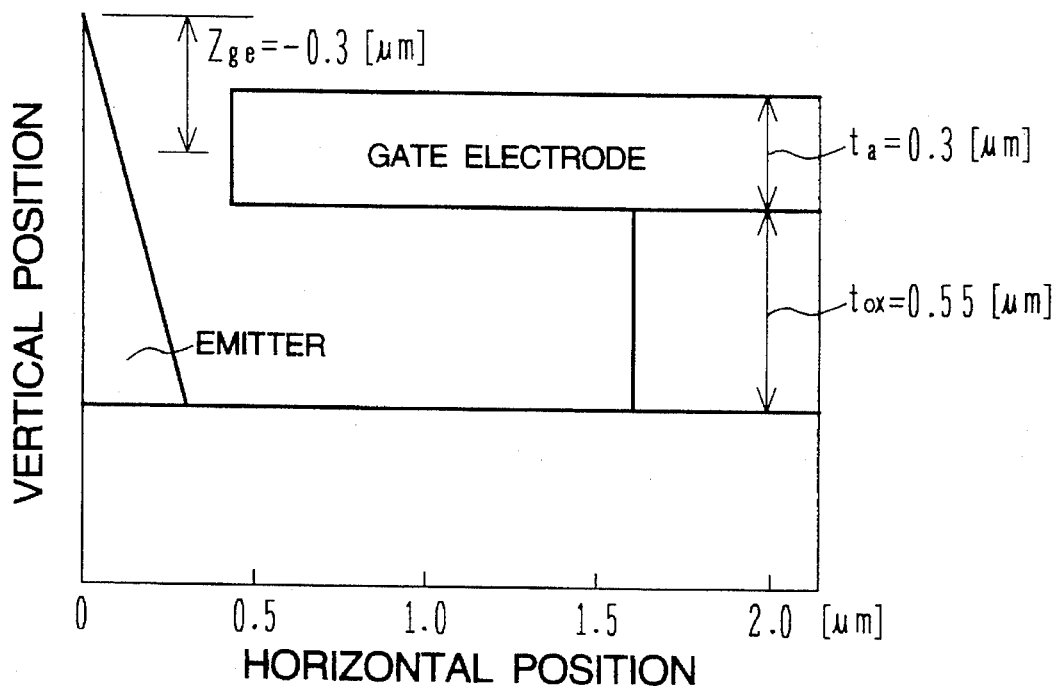
FIGS. 34A and 34B are a diagram showing the positional relationship between an emitter and a gate, and a graph showing an electric field distribution, obtained by simulation.
Figure 34B:
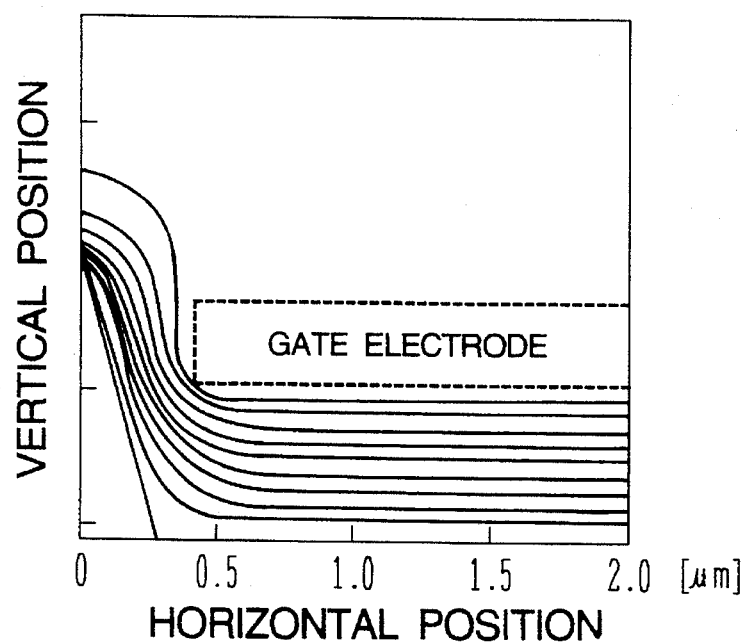
Figure 35A:
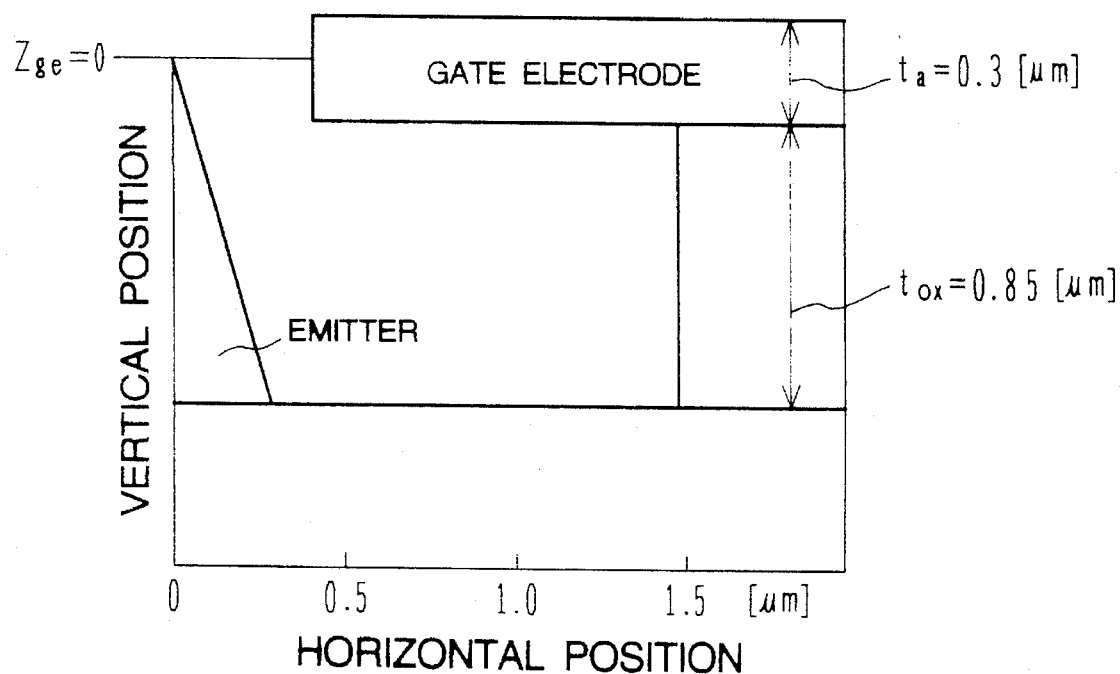
FIGS. 35A and 35B are another diagram showing the positional relationship between an emitter and a gate, and another graph showing an electric field distribution, obtained by simulation.
Figure 35B:
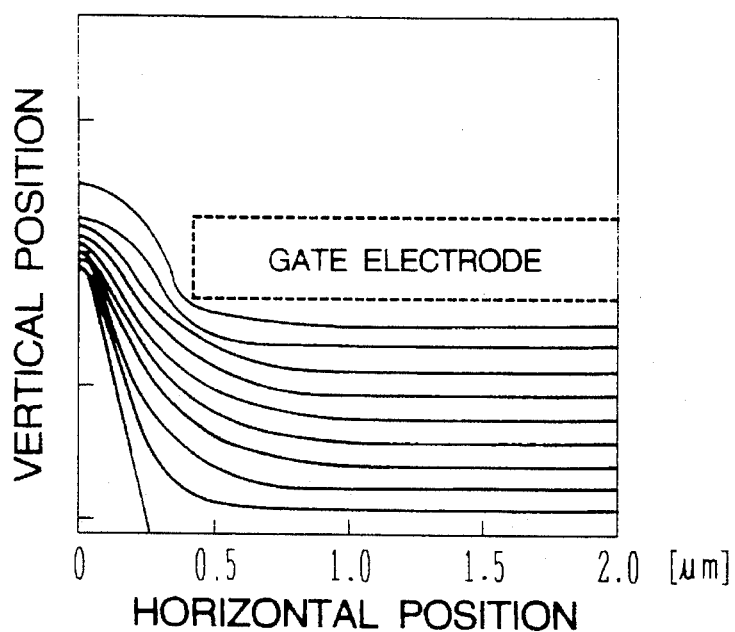

FIG. 33 shows the relationship among a shorter emitter—gate electrode distance $r_a$, a maximum electric field intensity Emax, and an emitter current Jfn. The emitter-gate voltage was set to Va=30 V and Va=40 V, and it was assumed that the work function of the emitter material was 4.5 eV. In order to obtain current of Jfn=1.3 A/cm² at $r_a$=0.4 µm, it is necessary to set the emitter-gate voltage to Va=40 V. However, at $r_a$=0.18 µm, the same amount of current can be obtained even at Va=30 V. It is noted that at the same emitter-gate voltage, the smaller the distance $r_a$, the larger the emission current.

FIGS. 34A and 34B and FIGS. 35A and 35B illustrate the positional relationship between the gate electrode and the emitter in the Z direction, and the electric field distribution around the emitter tip. The distance $Z_{ge}$ between the center of the emitter in the Z direction and the apex position of the emitter tip is set to $Z_{ge}$=−0.3 µm in FIGS. 34A and 34B, and $Z_{ge}$=0 in FIGS. 35A and 35B.

Figure 36A:
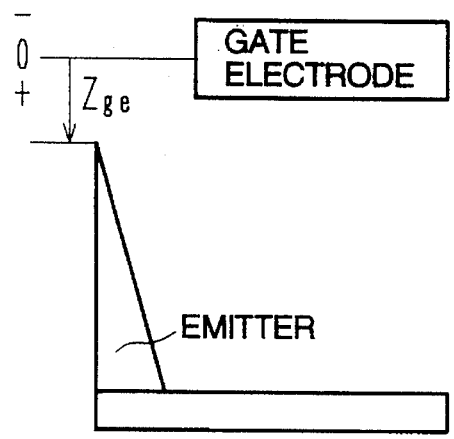
FIGS. 36A and 36B are a diagram showing the positional relationship between an emitter and a gate, and a graph showing a maximum electric field intensity as a function of the distance between the emitter and the gate, obtained by simulation.
Figure 36B:
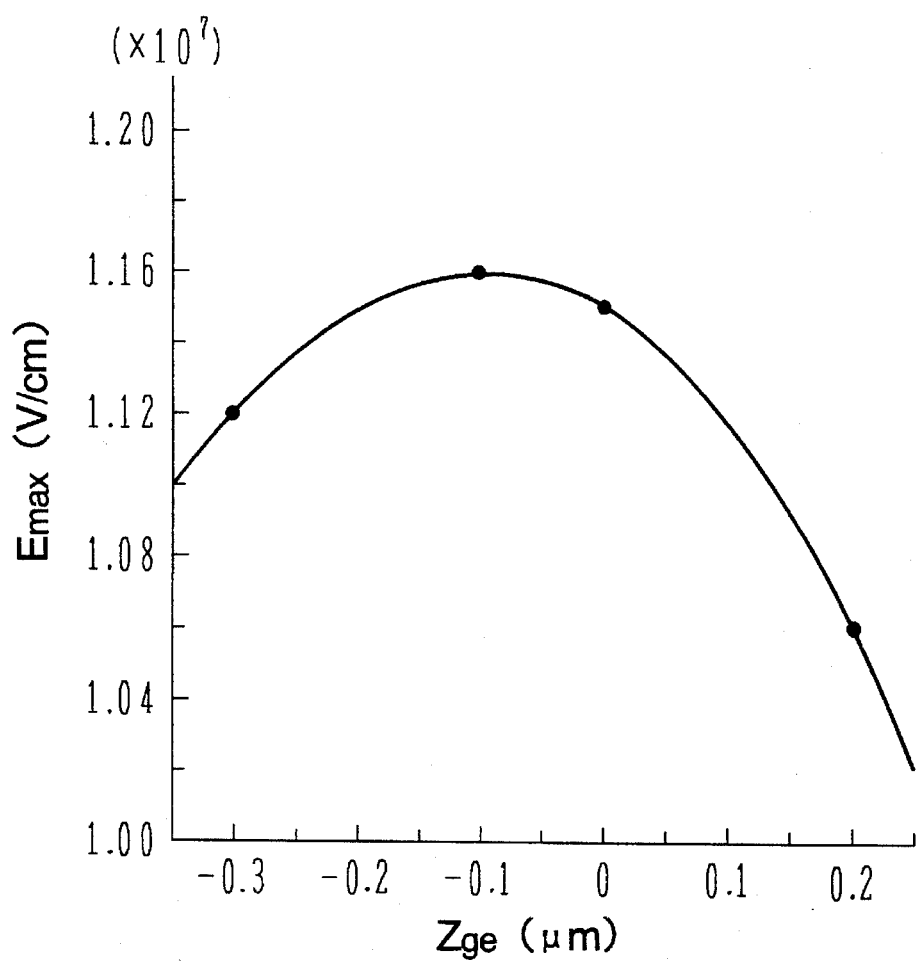

FIG. 36 shows a change in a maximum electric field intensity Emax near at the apex position of the emitter tip when the positional relationship between the emitter and the gate electrode, i.e., the Z direction distance $Z_{ge}$, is changed from −0.35 µm to 0.25 µm. At $Z_{ge}$=−0.1 µm, Emax takes a local maximum of $1.16 \times 10^7$ V/cm.

Simulations were made for the evaluation of effectiveness of the embodiments.

Figure 37A:
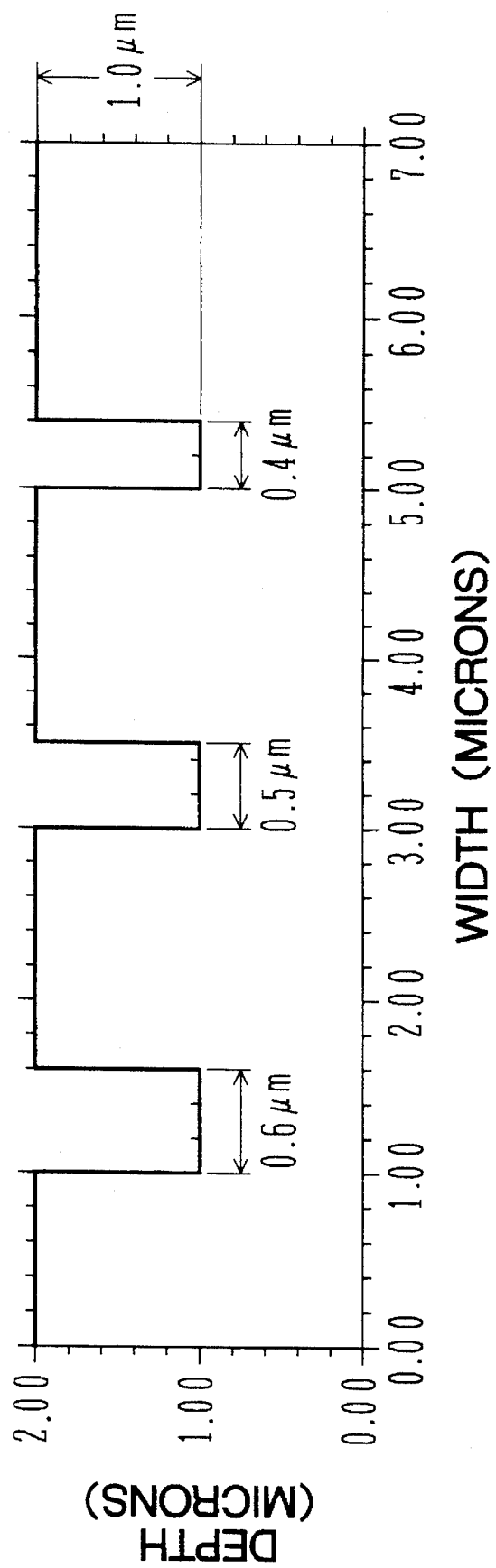
FIGS. 37A, 37B, 38A, and 38B are graphs showing the cross sections of cusps with/without ion milling.

FIG. 37A shows the shapes of recesses to be formed on a substrate. Each recess has a depth of 1.0 micron. The recess at the left has a width of 0.6 microns, the recess at the middle has a width of 0.5 microns, and the recess at the right has a width of 0.4 microns. The aspect ratios of these recesses are 1/0.6, 1/0.5=2, and 1/0.4=2.5, respectively.

Figure 37B:
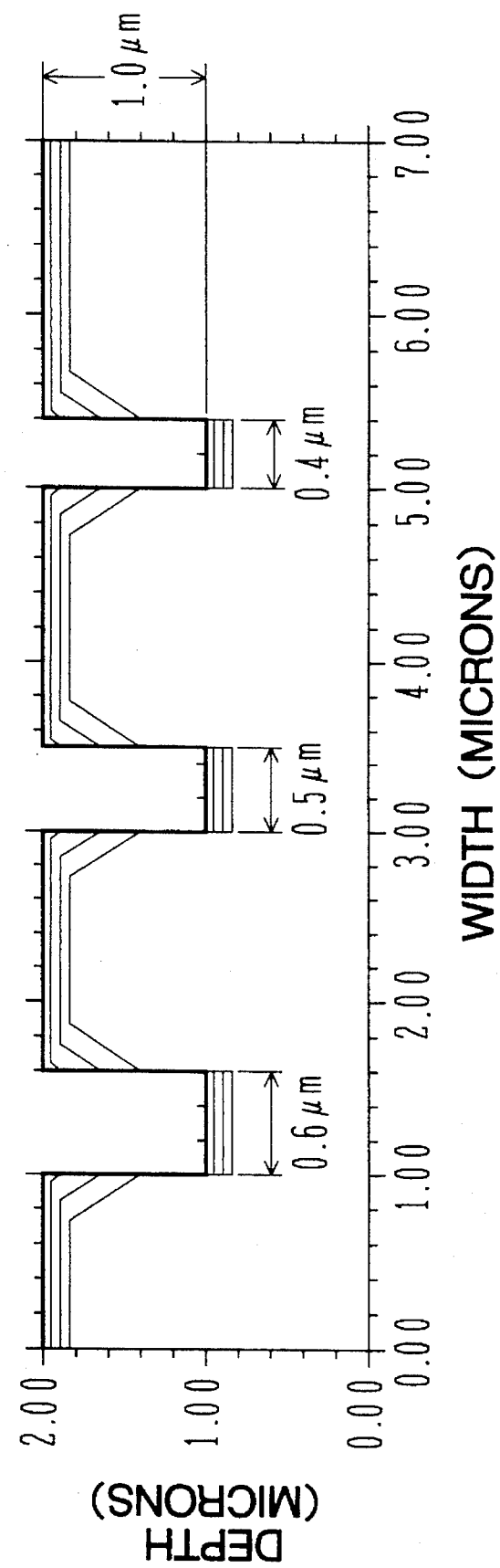

FIG. 37B shows the shapes of the recesses shown in FIG. 37A after ion milling to be formed as tapered surfaces. Since the etching rate differs depending upon an ion incidence angle as shown in FIG. 2, the upper corner of each recess is etched and a flat taper (a facet) is formed. The horizontal surface is etched uniformly, whereas the vertical surface is rarely etched. The end portion of the taper surface forms a deflection portion (hereinunder called an angle portion) where the surface orientation rapidly changes. In other words, the radius of curvature at the taper surface is extremely large ($\simeq$infinite), and that at the angle portion is extremely small ($\simeq$0). Simulations were made under the conditions of etching about 0.2 microns in 5 minutes. The upper side wall about 0.4 micron long is etched in a taper shape.

Figure 38A:
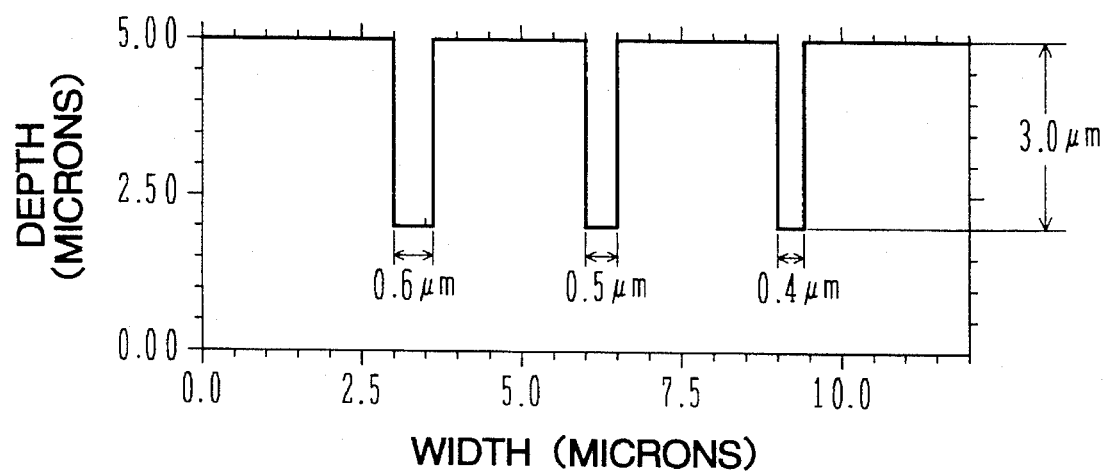

FIG. 38A shows the shapes of other recesses to be formed on a substrate. Each recess has a depth of 3.0 microns. The recess at the left has a width of 0.6 microns, the recess at the middle has a width of 0.5 microns, and the recess at the right has a width of 0.4 microns. The aspect ratios to these recesses are 3/0.6=5, 3/0.5=6, and 3/0.4=7.5, respectively.

Figure 38B:
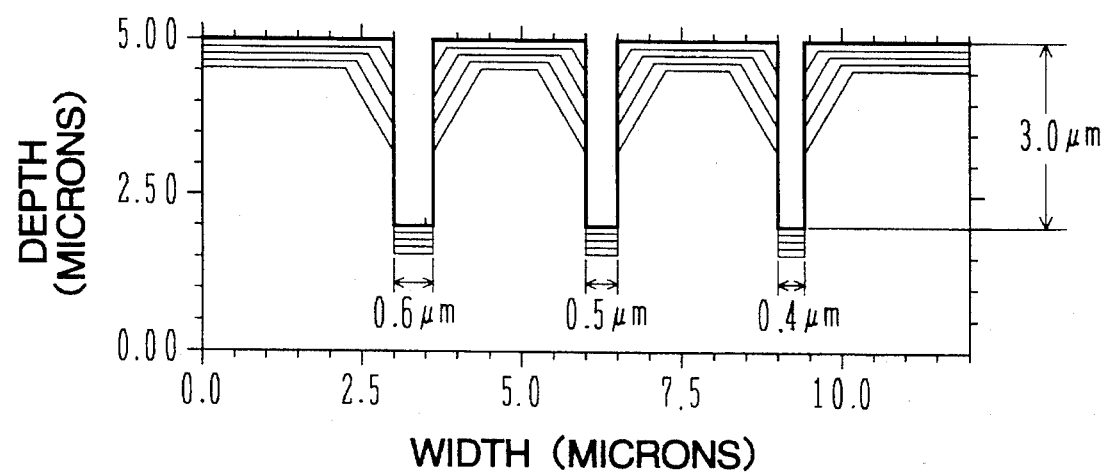

FIG. 38B shows the shapes of the recesses shown in FIG. 38A after ion milling to be formed as tapered recesses. Simulations were made under the conditions of etching about 0.5 microns in 15 minutes. The upper side wall about 1.2 micron long is etched in a taper shape.

The shape of a recess formed in a low melting point material layer and subjected to a reflow process can be approximated to a recess having a generally vertical side wall at the lower portion of the recess and a taper side wall at the upper portion.

Figure 39A:
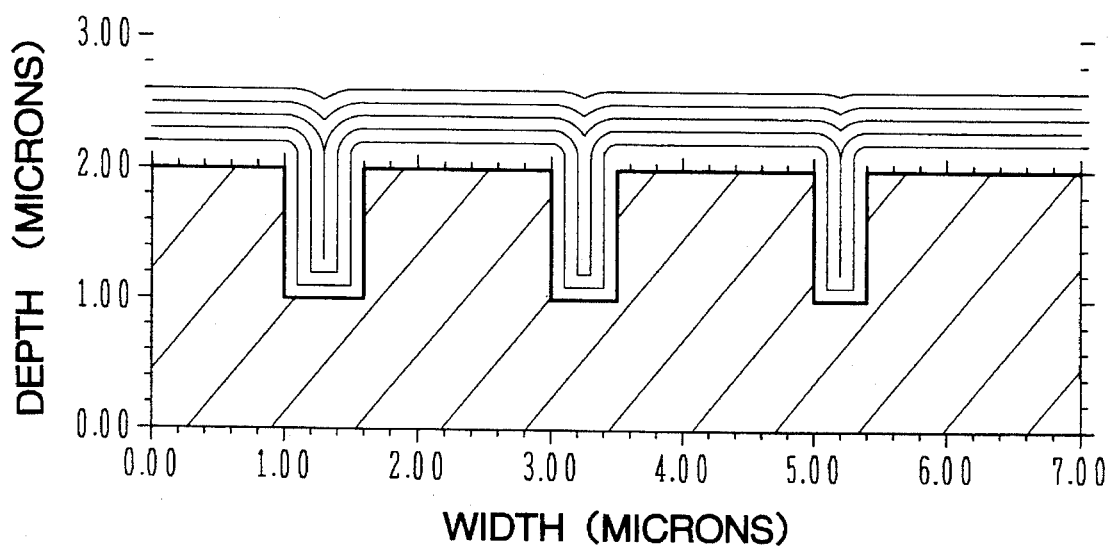
FIGS. 39A, 39B, 40A, and 40B are graphs illustrating conformal film depositions by the invention and by the prior art, obtained by simulation.
Figure 39B:
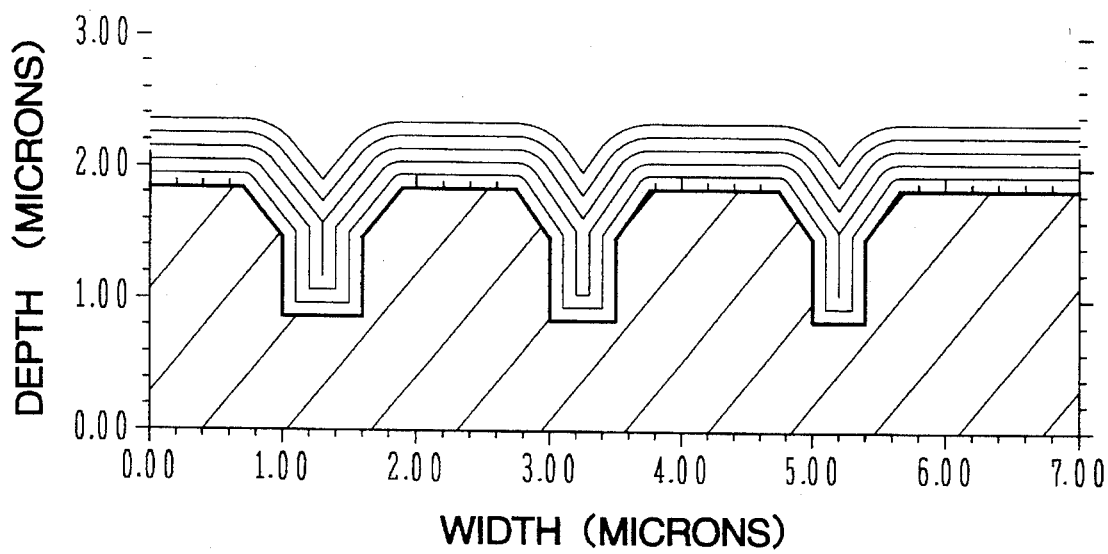

FIGS. 39A and 39B show conformal films of about 0.5 micron thick deposited on the substrates shown in FIGS. 37A and 37B. Contour lines are shown at a pitch of 0.1 micron thick. A film having a uniform thickness is being deposited over the whole surface of the substrate, and the film at the upper corner of the recess is rounded. The front surfaces of the films under the deposition from opposite vertical side walls as viewed in the cross sections of FIGS. 39A and 39B, become in contact with each other at the same time and the gap between the vertical surfaces is extinguished at the same time. At the upper end of the contacted films, a cusp pointing downward is formed. In the case of the substrate with no taper surface shown in FIG. 39A, the level at which the cusp first appears is flush with the upper horizontal surface of the substrate. As the deposition progresses, the cusp gradually moves upward. While the cusp moves upward, there arises a phenomenon (obtuse angle phenomenon) of gradually widening the apex angle of the cusp.

In the case of the substrate with the taper surface shown in FIG. 39B, the radius of curvature of the film deposited over the angle portion tends to gradually increase, whereas the radius of curvature over the taper surface tends to gradually decrease. However, if the width of the taper surface is sufficiently large, even after a sharp cusp is formed, the apex angle of the cusp is hard to be widened greater than the angle between opposite taper surfaces as viewed in the cross section of FIG. 39B, and the angle widening phenomenon is suppressed. As seen from the contour lines at a pitch of 0.5 micron thick, the cusp is planarized to a considerable degree in the case of no taper surface shown in FIG. 39A, whereas the cusp with a sharp apex angle generally the same as the angle between the opposite taper surfaces is maintained in the case of the taper surface shown in FIG. 39B. Therefore, the taper surface broadens the film thickness range in which a small apex angle of the cusp is ensured.

Apex angle of the cusp shown in FIG. 39B is less changed than apex angle of the cusp shown in FIG. 39A when the hole diameter (open dimension) is changed. In other words, process margin can be enlarged in the cusp shown in FIG. 39B than that shown in FIG. 39A. The level at which a sharp cusp first appears is flush with the height where the taper side wall and vertical side wall join together. Thereafter, the level of the cusp rises. As the deposition progresses after the sharp cusp first appears, the apex angle of the cusp rapidly becomes obtuse in the case of the substrate shown in FIG. 39A, whereas the sharp apex angle of the cusp is retained in the case of the substrate shown in FIG. 39B. It is therefore preferable to set the lower edge of the taper surface lower than the height at which the cusp is to be formed. If the gate electrode is to be formed in self-alignment with the emitter as shown in FIGS. 12B and 13B, it may be preferable to form the taper surface at least at the upper portion of the gate electrode layer in the thickness direction.

The apex of the emitter tip depicted in FIG. 39B can be positioned in a range from negative value of Zge to positive value of Zge including zero value, however, the apex position of the emitter tip depicted in FIG. 39A is restricted in a range of Zge>Ta/2. In other words, the design freedom can be enlarged in the emitter tip shown in FIG. 39B.

Figure 40A:
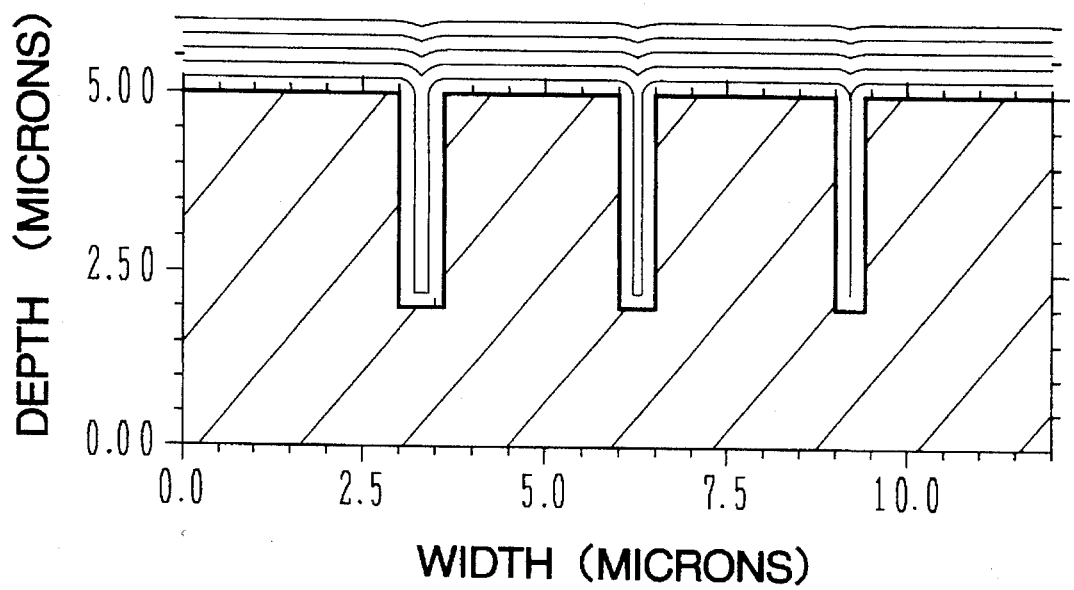
Figure 40B:
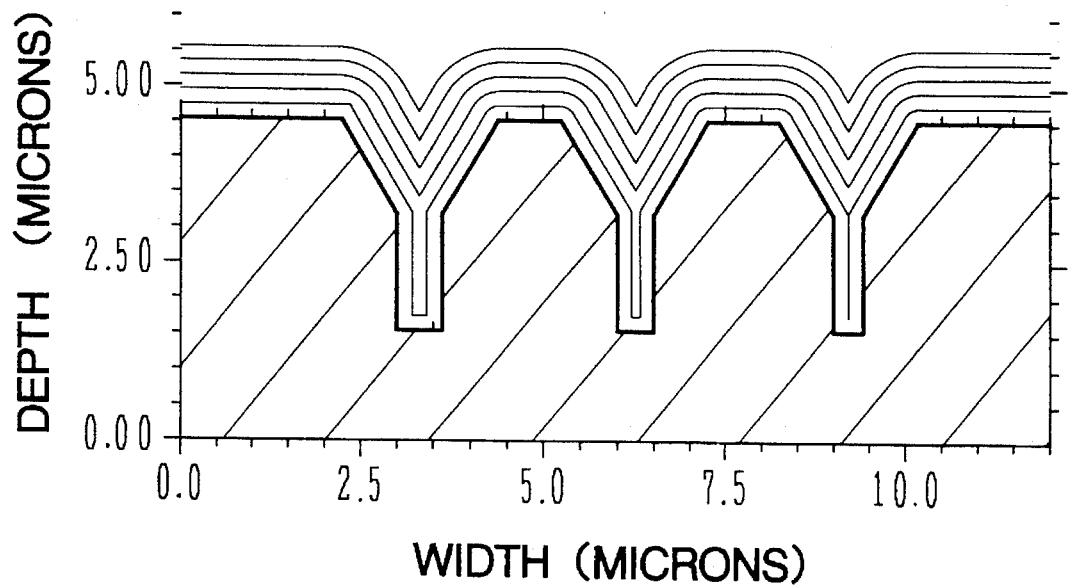

FIGS. 40A and 40B show conformal films of about 1.0 micron thick deposited on the substrates shown in FIGS. 38A and 38B. Contour lines are shown at a pitch of 0.2 micron thick. As a whole, a similar tendency to FIGS. 39A and 39B can be recognized. As seen from the contour lines thicker than 0.4 microns, the cusp is considerably planarized in the case of no taper surface shown in FIG. 40A, whereas the sharp cusp is still retained in the case of the taper surface shown in FIG. 40B. In the case of the taper surface shown in FIG. 40B, the level at which a sharp cusp first appears is flush with the height where the taper side wall and vertical side wall join together, similar to the case shown in FIG. 39B.

If the side wall is 20 degrees or smaller, particularly 10 degrees or smaller relative to the normal line of the substrate surface, the manner a cusp is formed is nearly the same as in the case of the vertical side wall. Therefore, an expression "substantially vertical" or "generally vertical" means the cases of side walls which are 20 degrees or smaller, particularly 10 degrees or smaller relative to the normal line of the substrate surface.

Figure 41A:
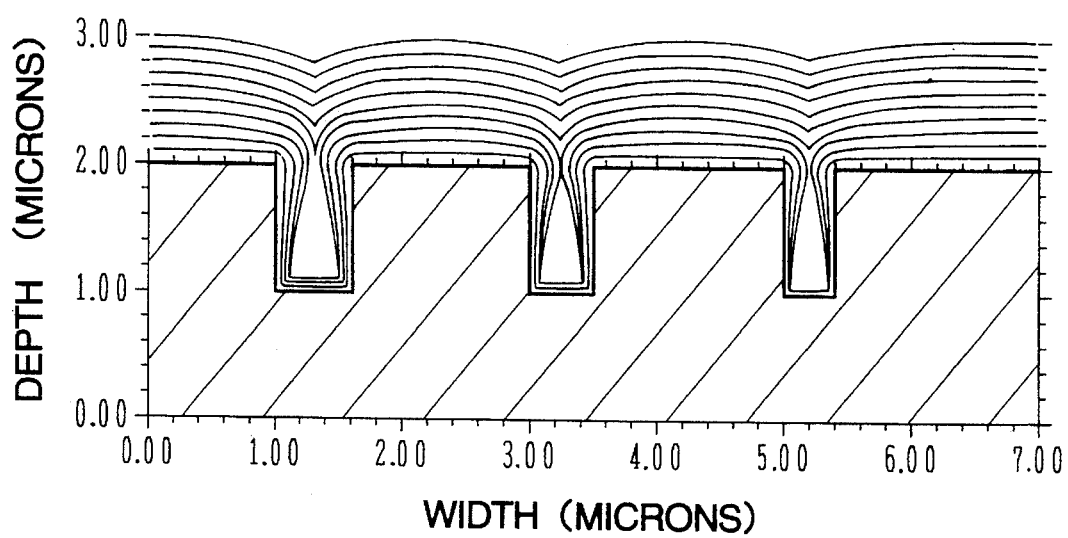
FIGS. 41A, 41B, 42A, and 42B are graphs illustrating non-conformal film depositions by the invention and by the prior art, obtained by simulation.
Figure 41B:
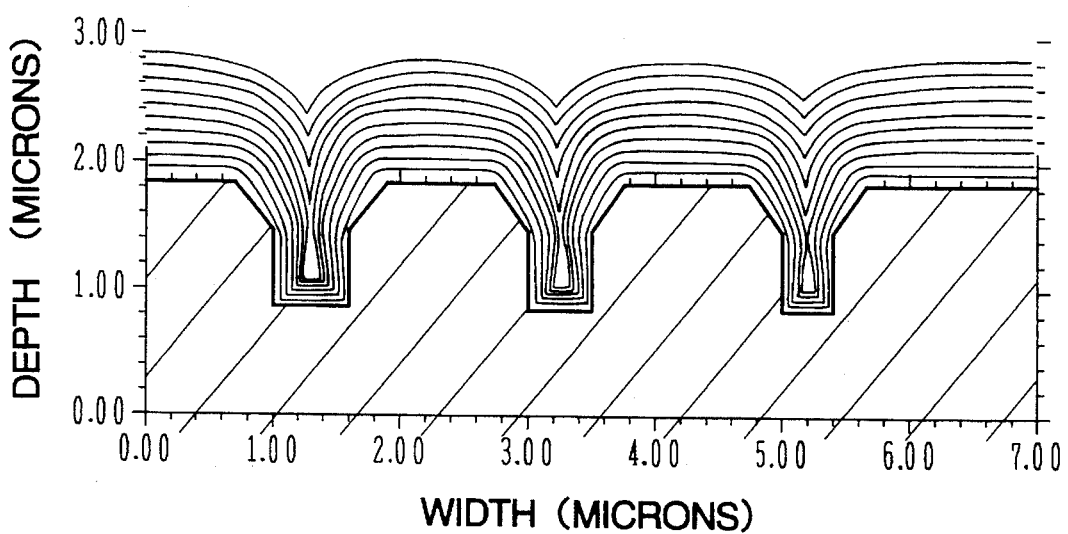

FIGS. 41A and 41B show non-conformal films of about 1.0 micron thick deposited on the substrates shown in FIGS. 37A and 37B. In this simulation, the non-conformal film deposition was assumed that when a film of 1.0 micron thick was deposited on the horizontal surface, a film of 0.9 microns was deposited on the upper edge of the vertical side wall. Contour lines are shown at a pitch of 0.1 micron thick. As seen from the contour lines thicker than 1.0 micron, in the case of no taper surface shown in FIG. 41A, the cusp is almost planarized, whereas in the case of the taper surface shown in FIG. 41B, a considerably sharp cusp is retained. A first sharp cusp is formed above the height where the taper side wall and the vertical side wall join together. The cusp first formed has a very sharp edge. In the case of the substrate without the taper surface shown in FIG. 41A, a sharp cusp is formed at the level higher than the upper surface of the substrate. Although the edge of the cusp is locally sharp, it is not so sharp in the broad area of the cusp. As the deposition further progresses, the apex angle of the cusp quickly becomes wide in the case of FIG. 41A, whereas a sharp edge of the cusp is retained in the case of FIG. 41B.

If a sacrificial film is to be deposited on a gate electrode layer with a taper surface, it may be preferable to form a taper surface reaching the lower half of the gate electrode layer.

Figure 42A:
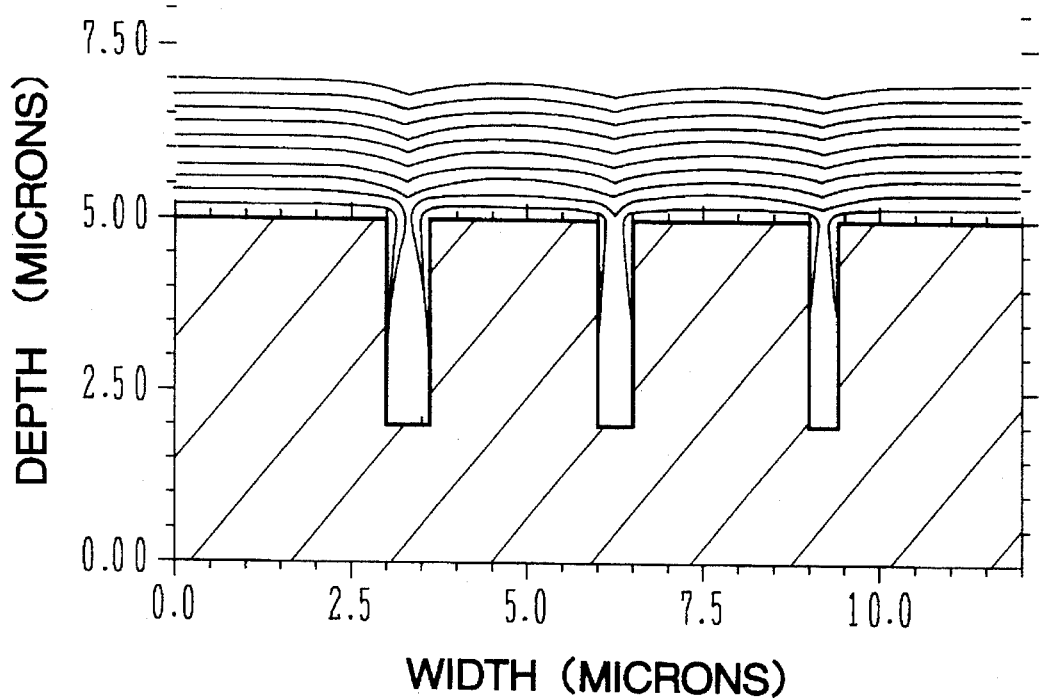
Figure 42B:
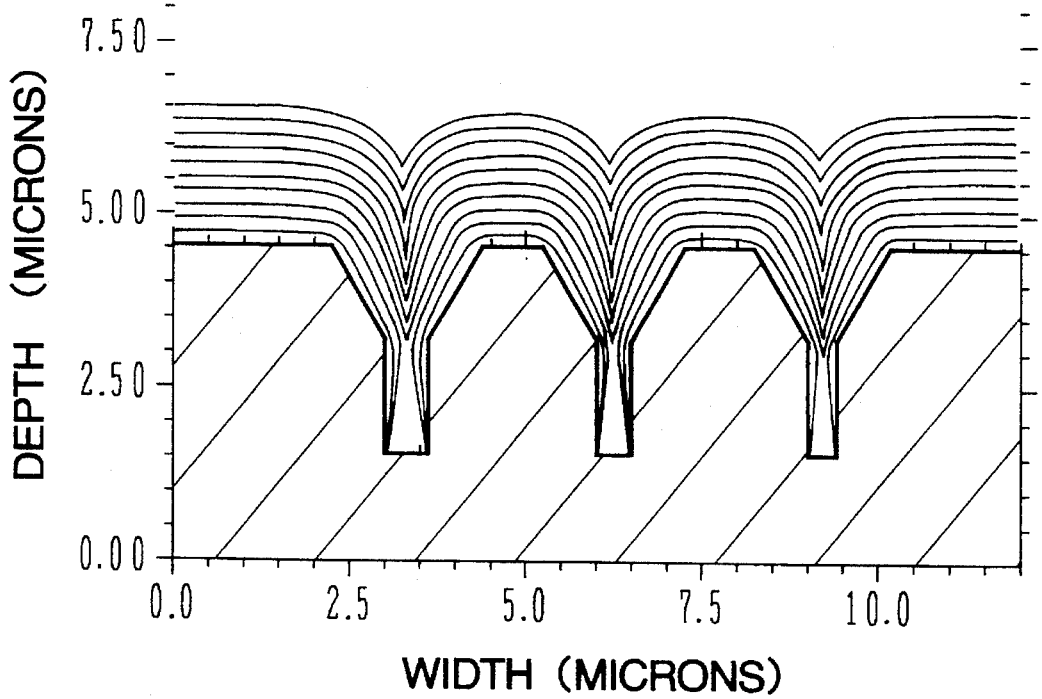
Figure 43A:
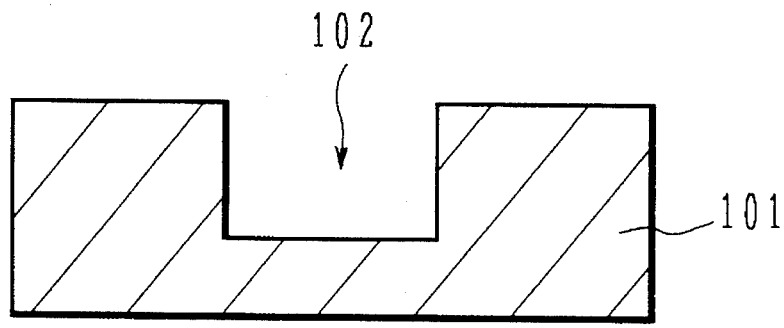
FIGS. 43A to 43C are cross sectional views illustrating a conventional method of forming an emitter.
Figure 43B:
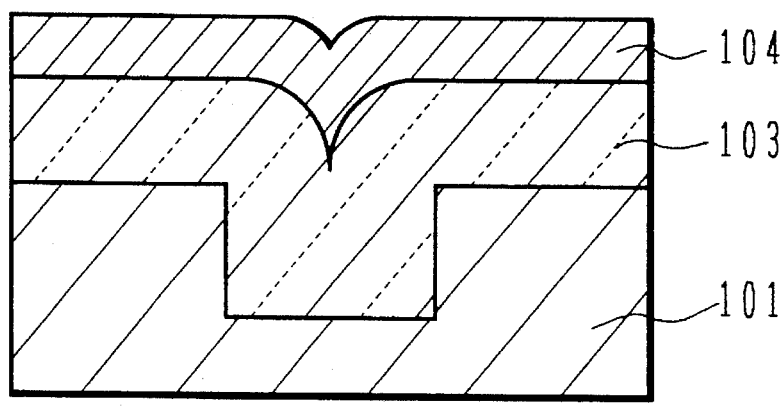
Figure 43C:
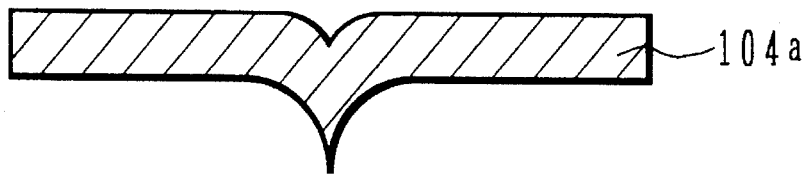
Figure 44A:
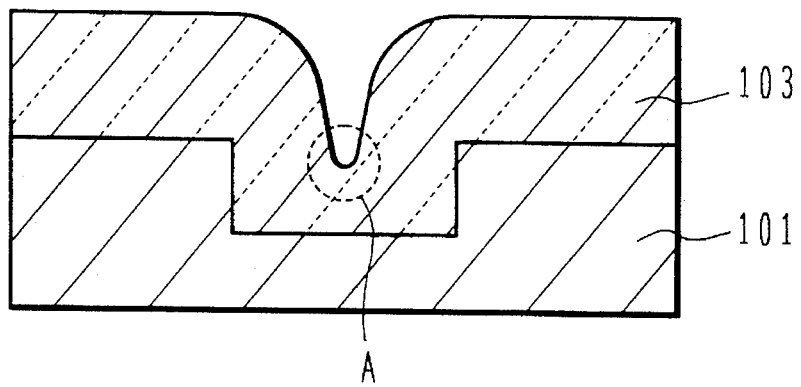
FIGS. 44A to 44C are cross sectional views illustrating how a conventional film is deposited.
Figure 44B:
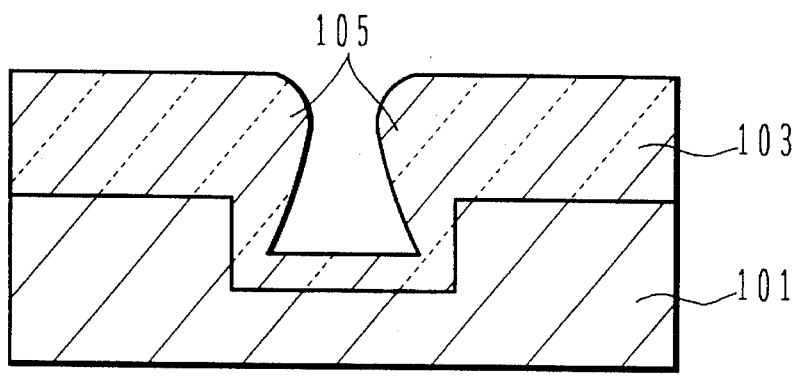
Figure 44C:
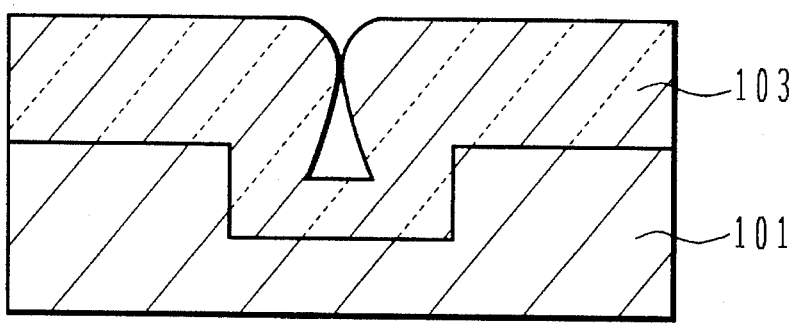
Figure 45A:
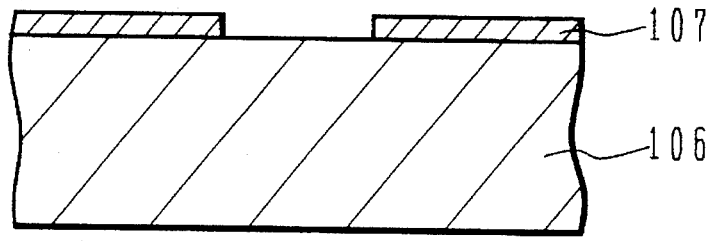
FIGS. 45A to 45D are cross sectional views illustrating a conventional method of forming an emitter.
Figure 45B:
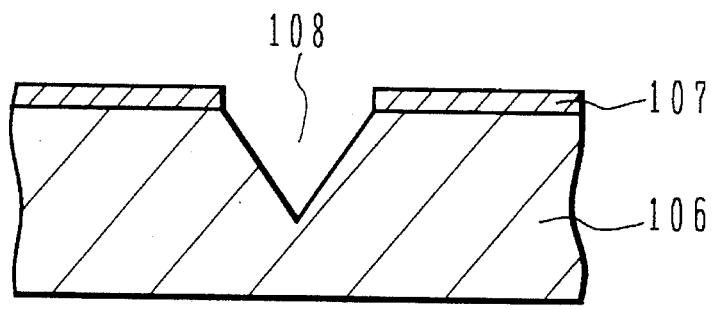
Figure 45C:
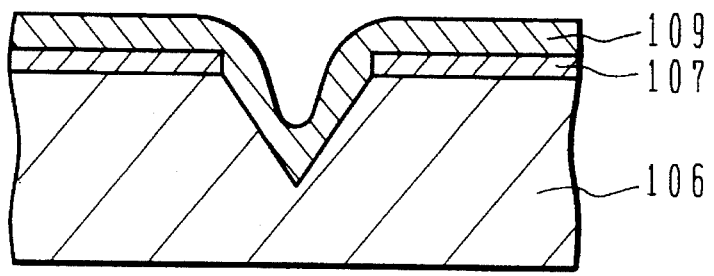
Figure 45D:
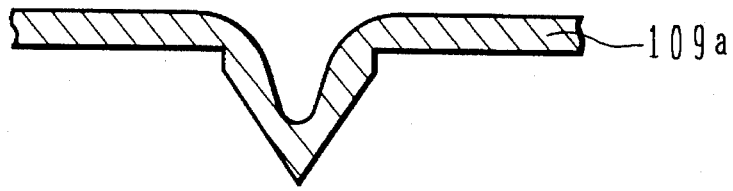
Figure 46A:
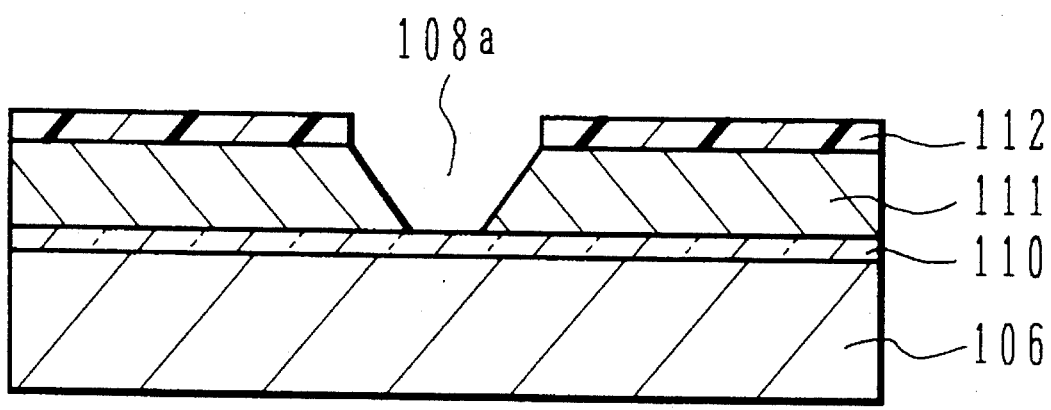
FIGS. 46A and 46B are cross sectional views illustrating another conventional method of forming an emitter.
Figure 46B:
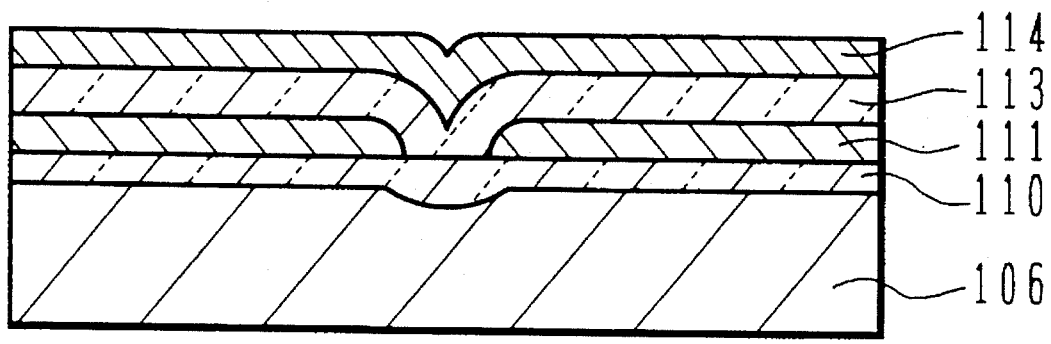

FIGS. 42A and 42B show non-conformal films of about 2.0 micron thick deposited on the substrates shown in FIGS. 38A and 38B. Contour lines are shown at a pitch of 0.2 micron thick. As a whole, a similar tendency to FIGS. 41A and 41B can be recognized. As seen from the contour lines thicker than 0.4 microns, in the case of no taper surface shown in FIG. 42A, the cusp is considerably planarized, whereas in the case of the taper surface shown in FIG. 42B, a sharp cusp is retained. A first sharp cusp is formed above the height where the taper side wall and the vertical side wall join together, similar to the case of FIG. 41B.

The present invention has been described in connection with the preferred embodiments. The invention is not limited only to the above embodiments. For example, a laminate substrate having all the necessary layers to be subjected to recess formation or part of these layers, different from those disclosed hereinabove, may also be employed. It is apparent to those skilled in the art that various modifications, improvements, combinations and the like can be made without departing from the scope of the appended claims.

I claim:

1. A method of manufacturing an electric field emission type device comprising the steps of:

(a) forming a recess in the surface of a substrate, said recess having a generally vertical side wall at a lower portion of said recess and a tapered side wall at an upper portion thereof;

(b) depositing a sacrificial film on said substrate formed with said recess;

(c) depositing an electron emitting material layer on said sacrificial film; and (d) removing said sacrificial film under said electron emitting material layer to expose said electron emitting material layer.

2. A method of manufacturing an electric field emission type device according to claim 1, further comprising the step of:

(e) bonding a support substrate to said electron emitting material layer between said steps (c) and (d).

3. A method of manufacturing an electric field emission type device according to claim 1, wherein said substrate is a laminate substrate of a plurality of stacked layers made of different materials.

4. A method of manufacturing an electric field emission type device according to claim 3, wherein said laminate substrate comprises an insulating layer formed on the surface portion of said laminate substrate and a gate conductive layer formed under said insulating layer, and said tapered side wall is formed on said insulating layer.

5. A method of manufacturing an electric field emission type device according to claim 3, wherein said laminate substrate comprises a gate conductive layer formed on the surface portion of said laminate substrate and an insulating layer formed under said gate conductive layer, and said tapered side wall is formed on said gate conductive layer.

6. A method of manufacturing an electric field emission type device according to claim 4, wherein said laminate substrate comprises an intermediate insulating layer formed under said gate conductive layer and another conductive layer formed under said intermediate insulating layer, and said recess reaches said another conductive layer.

7. A method of manufacturing an electric field emission type device according to claim 6, wherein said step (d) further removes said another conductive layer.

8. A method of manufacturing an electric field emission type device according to claim 5, wherein said laminate substrate comprising another conductive layer under said insulating layer, and said recess reaches said another conductive layer.

9. A method of manufacturing an electric field emission type device according to claim 8, wherein said step (d) forms a through hole in said electron emitting material layer, and etches said sacrificial film through said through hole.

10. A method of manufacturing an electric field emission type device according to claim 8, wherein said step (d) removes said another conductive layer to expose said sacrificial film, and etches said exposed sacrificial film.

11. A method of manufacturing an electric field emission type device according to claim 5, wherein said step (b) deposits a non-conformal sacrificial film.

12. A method of manufacturing an electric field emission type device according to claim 5, wherein said step (b) deposits a conformal sacrificial film.

13. A method of manufacturing an electric field emission type device according to claim 1, wherein said step (a) forms a hole having a generally vertical side wall in said substrate, and thereafter taper-etches the upper portion of said side wall.

14. A method of manufacturing an electric field emission type device according to claim 1, wherein said step (a) forms a hole having a generally vertical side wall in said substrate, and thereafter bias-sputters an underlying film.

15. A method of manufacturing an electric field emission type device according to claim 4, wherein said step (a) forms a hole having a tapered side wall in said insulating layer, and thereafter anisotropically etches said gate conductive layer under said insulating film.

16. A method of manufacturing an electric field emission type device according to claim 5, wherein said step (a) forms a hole having a tapered side wall in said gate conductive layer, and thereafter anisotropically etches said insulating layer under said gate conductive layer.

17. A method of manufacturing an electric field emission type device according to claim 16, wherein said hole having the tapered side wall has a tapered side wall at an upper portion of said gate conductive layer and a generally vertical side wall at a lower portion thereof.

18. A method of manufacturing an electric field emission type device according to claim 1, wherein said step (a) includes the steps of:

(a-1) preparing a laminate substrate of an underlying substrate and a low melting point material layer formed on said underlying substrate;

(a-2) forming a hole in said low melting point material layer; and thereafter (a-3) heating and reflowing said low melting point material layer.

19. A method of manufacturing an electric field emission type device according to claim 18, wherein said reflowed low melting point material layer includes a generally vertical side wall at a lower portion of said reflowed low melting point material layer.

20. A method of manufacturing an electric field emission type device according to claim 19, wherein said reflowed low melting point material layer has a lower melting point at an upper portion of said reflowed low melting point material layer than at a lower portion thereof.

21. A method of manufacturing an electric field emission type device according to claim 18, wherein said step (a-2) includes the step of forming a mask on said low melting point material layer.

22. A method of manufacturing an electric field emission type device according to claim 21, wherein said step (a-2) further comprises the steps of:
- (a-22) isotropically etching the upper portion of said low melting point material layer by using said mask as an etching mask; and
- (a-23) anisotropically etching the lower portion of said low melting point material layer by using said mask as an etching mask.

23. A method of manufacturing an electric field emission type device according to claim 18, wherein said step (a) further comprising the step of:
- (a-4) etching said underlying substrate under said low melting point material layer by using said low melting point material layer as an etching mask.

24. A method of manufacturing an electric field emission type device according to claim 23, wherein said laminate substrate comprises an insulating layer formed on a surface portion of said laminate substrate and a gate conductive layer formed under said insulating layer, and said tapered side wall is formed on said insulating layer.

25. A method of manufacturing an electric field emission type device according to claim 23, wherein said laminate substrate comprises a gate conductive layer formed on a surface portion of said laminate substrate and an insulating layer formed under said gate conductive layer, and said tapered side wall is formed on said gate conductive layer.

26. A method of manufacturing an electric field emission type device comprising the steps of:
- depositing a first conductive film serving as a gate electrode on a surface of a substrate;
- depositing a first insulating film on said substrate deposited with said first conductive film;
- forming a recess in said first insulating film, said recess reaching said first conductive film and having a generally vertical side wall;
- forming a tapered surface on an upper portion of said recess;
- selectively etching said first conductive film by using said first insulating film as a mask to pattern the gate electrode;
- depositing a second insulating film covering said recess;
- depositing a second conductive film on said second insulating film to form an emitter; and
- selectively etching and removing a region of said second insulating film near a tip of said emitter.

27. A method of manufacturing an electric field emission type device comprising the steps of:
- depositing a first conductive film serving as a gate electrode on a surface of a substrate;
- forming a recess in said first conductive film, said recess reaching said substrate and having a generally vertical side wall;
- forming a tapered surface on the upper portion of said recess;
- depositing an insulating film on said first conductive film;
- depositing a second conductive film on said insulating film and forming an emitter; and
- selectively etching and removing a region of said insulating film near a tip of said emitter.

28. A method of manufacturing an electric field emission type device comprising the steps of:
- forming a recess in a low melting point material layer formed on a surface of a substrate;
- reflowing said low melting point material layer and forming a sloped surface on an upper side wall of said recess;
- depositing a sacrificial film covering said recess;
- depositing a conductive film on said sacrificial film to form an emitter; and
- etching and removing unnecessary regions under said emitter to expose said emitter.

29. A method of manufacturing an electric field emission type device comprising the steps of:
- depositing a first conductive film serving as a gate electrode on a surface of a substrate;
- depositing a first insulating film on said substrate deposited with said first conductive film, said first insulating film being made of low melting point material;
- forming a recess in said first insulating film, said recess reaching said first conductive film;
- reflowing said first insulating film and forming a sloped surface on an upper side wall of said recess;
- selectively etching said first conductive film by using said first insulating film as a mask to pattern the gate electrode;
- depositing a second insulating film covering said recess;
- depositing a second conductive film on said second insulating film to form an emitter; and
- selectively etching and removing a region of said second insulating film near a tip of said emitter.

30. A method of manufacturing an electric field emission type device comprising the steps of:
- depositing a first conductive film serving as a gate electrode on the surface of a substrate, said first conductive film being made of low melting point material;
- forming a recess in said first conductive film, said recess reaching said substrate;
- forming a tapered surface on an upper portion of said recess;
- reflowing said first conductive film and forming a sloped surface on an upper side wall of said recess;
- depositing an insulating film covering said recess;
- depositing a second conductive film on said insulating film to form an emitter; and
- selectively etching and removing a region of said insulating film near a tip of said emitter.

31. A method of manufacturing a field emission type device comprising the steps of;
- (a) providing a base having a recess therein, said recess having a generally vertical side wall at a lower portion of said recess and a tapered side wall at an upper portion thereof;
- (b) forming a sacrificial layer on the base, the sacrificial layer having a cusp thereon;
- (c) depositing an electron emitting material layer on the sacrificial layer, wherein topology of the cusp being transferred to the electron emitting material layer to form an electron emitting tip in the electron emitting material layer; and
- (d) removing the sacrificial layer under the electron emitting material layer.

* * * * *